United States Patent
Tanaka et al.

(10) Patent No.: US 8,951,646 B2
(45) Date of Patent: Feb. 10, 2015

(54) LAYERED STRUCTURE COMPRISING A LAYER CONTAINING A CONJUGATED POLYMER COMPOUND

(75) Inventors: Masanobu Tanaka, Tsukuba (JP); Kenta Tanaka, Tsukuba (JP); Shohgo Yamauchi, Tsukuba (JP); Hideyuki Higashimura, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 717 days.

(21) Appl. No.: 12/921,108

(22) PCT Filed: Mar. 5, 2009

(86) PCT No.: PCT/JP2009/054708
§ 371 (c)(1),
(2), (4) Date: Sep. 3, 2010

(87) PCT Pub. No.: WO2009/110642
PCT Pub. Date: Sep. 11, 2009

(65) Prior Publication Data
US 2011/0006294 A1    Jan. 13, 2011

(30) Foreign Application Priority Data
Mar. 7, 2008 (JP) ................................ 2008-057570

(51) Int. Cl.
| | | |
|---|---|---|
| H01L 51/54 | (2006.01) | |
| C09K 11/06 | (2006.01) | |
| C08G 63/00 | (2006.01) | |
| H01L 51/00 | (2006.01) | |
| C08G 61/02 | (2006.01) | |
| C08G 61/12 | (2006.01) | |
| H01L 51/50 | (2006.01) | |

(52) U.S. Cl.
CPC ............ *H01L 51/0039* (2013.01); *C08G 61/02* (2013.01); *C08G 61/12* (2013.01); *C08G 61/122* (2013.01); *C08G 2261/124* (2013.01); *C08G 2261/1426* (2013.01); *C08G 2261/3142* (2013.01); *C08G 2261/316* (2013.01); *C08G 2261/3221* (2013.01); *C08G 2261/5222* (2013.01); *C08G 2261/80* (2013.01); *H01L 51/5048* (2013.01); *Y02E 10/549* (2013.01); *Y10S 428/917* (2013.01)
USPC ...... 428/690; 428/917; 257/40; 257/E51.027; 528/190

(58) Field of Classification Search
None
See application file for complete search history.

(56) References Cited

U.S. PATENT DOCUMENTS

| | | | | |
|---|---|---|---|---|
| 5,900,327 | A * | 5/1999 | Pei et al. .................... | 428/690 |
| 6,259,201 | B1 | 7/2001 | Lee et al. | |
| 6,538,263 | B1 * | 3/2003 | Park et al. .................... | 257/40 |
| 2002/0037432 | A1 | 3/2002 | Park et al. | |
| 2005/0209422 | A1 * | 9/2005 | O'Dell et al. ............... | 526/310 |
| 2007/0093643 | A1 | 4/2007 | You et al. | |
| 2007/0176174 | A1 * | 8/2007 | Lee et al. .................... | 257/40 |
| 2008/0015269 | A1 | 1/2008 | Bazan et al. | |
| 2008/0020208 | A1 * | 1/2008 | Lee et al. .................... | 428/411.1 |
| 2008/0038572 | A1 | 2/2008 | Goto et al. | |
| 2009/0152531 | A1 | 6/2009 | Towns et al. | |
| 2010/0176377 | A1 * | 7/2010 | Fukushima et al. .......... | 257/40 |

FOREIGN PATENT DOCUMENTS

| | | | |
|---|---|---|---|
| CN | 1555103 | A | 12/2004 |
| JP | 2003-077673 | A | 3/2003 |
| JP | 2003-77673 | A | 3/2003 |
| JP | 2007519800 | A | 7/2007 |
| JP | 2008-047610 | A | 2/2008 |
| JP | 2009501259 | A | 1/2009 |
| JP | 2010171230 | A | 8/2010 |
| WO | 0129115 | A1 | 4/2001 |
| WO | 2005/121203 | A1 | 12/2005 |
| WO | 2006-060437 | A2 | 6/2006 |
| WO | 2006128352 | A1 | 12/2006 |
| WO | WO 2007007117 | A1 * | 1/2007 |
| WO | 2007/058368 | A1 | 5/2007 |
| WO | 2008/016091 | A1 | 2/2008 |
| WO | 2008/093821 | A1 | 8/2008 |

OTHER PUBLICATIONS

Notification of Reasons for Rejection dated Sep. 30, 2013 issued in corresponding Japanese Patent Application No. 2009-054593.
Japanese Patent Office, "Notice of Reasons for Rejection," issued in connection with Japanese Patent Application No. 2009-054593, dated Jan. 7, 2014.
European Patent Office, "Communication with Extended European Search Report," issued in connection with European Patent Application No. 09717451.0, dated Feb. 25, 2014.
Gu et al., "Anionic Water-Soluble Poly(phenylenevinylene) Alternating Copolymer: High-Efficiency Photoluminescence and Dual Electroluminescence," Macromolecules, 2006, vol. 39, pp. 3125-3131.
State Intellectual Property Office, P.R. China, "First Office Action," issued in connection with Chinese Patent Application No. 200980116295.6, dated Apr. 26, 2012.
Taiwanese Intellectual Property Office, "Examination Report," issued in connection with Taiwanese Patent Application No. 098107085, dated Nov. 20, 2013.

\* cited by examiner

*Primary Examiner* — Andrew K Bohaty
(74) *Attorney, Agent, or Firm* — Sughrue Mion, PLLC

(57) ABSTRACT

A layered structure including a first electrode and a second electrode, a light-emitting layer or a charge separation layer between the first electrode and the second electrode, and a layer containing a conjugated polymer compound between the light-emitting layer or the charge separation layer and the first electrode, wherein the conjugated polymer compound contains a repeating unit selected from the group consisting of a repeating unit of formula (1).

27 Claims, No Drawings

LAYERED STRUCTURE COMPRISING A LAYER CONTAINING A CONJUGATED POLYMER COMPOUND

CROSS REFERENCE TO RELATED APPLICATIONS

This application is a National Stage of International Application No. PCT/JP2009/054708 filed on Mar. 5, 2009, which claims priority from Japanese Patent Application No. 2008-057570, filed on Mar. 7, 2008, the contents of all of which are incorporated herein by reference in their entirety.

TECHNICAL FIELD

The present invention relates to a layered structure.

BACKGROUND ART

In order to improve characteristics of an electroluminescence device or photoelectric conversion device including a layered structure, there have been made various studies in which various layers are inserted between a light-emitting layer and an electrode of the electroluminescence device, or inserted between a charge separation layer and an electrode of the photoelectric conversion device. For example, there has been known an electroluminescence device including a layer made of a non-conjugated polymer compound containing a substituent group having a cation and two hetero atoms between a light-emitting layer and an electrode (Japanese Patent Kohyo Publication No. 2003-530676).

DISCLOSURE OF THE INVENTION

However, luminance of the above electroluminescence device was still insufficient.

An object of the present invention is to provide a layered structure which can give an electroluminescence device capable of emitting light with high luminance.

First, the present invention provides a layered structure including a first electrode and a second electrode, a light-emitting layer or a charge separation layer between the first electrode and the second electrode, and a layer containing a conjugated polymer compound between the light-emitting layer or charge separation layer and the first electrode, wherein the conjugated polymer compound contains one or more repeating units selected from the group consisting of a repeating unit represented by formula (1), a repeating unit represented by formula (3) and a repeating unit represented by formula (5):

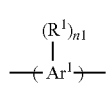  (1)

wherein $R^1$ represents a group represented by formula (2), $Ar^1$ represents a divalent aromatic group, $R^1$ represents a substituent group having a group represented by formula (2), $Ar^1$ may have a substituent group other than $R^1$, n1 represents an integer of 1 or more and, when a plurality of $R^1$ are present, they may be the same or different;

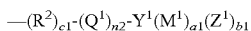  (2)

wherein $R^2$ represents a divalent aromatic group which may have a substituent group, $Q^1$ represents a divalent organic group which may have a substituent group, $Y^1$ represents a carbocation, an ammonium cation, a phosphonyl cation or a sulfonyl cation, $M^1$ represents $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$, $Z^1$ represents an ammonium ion which may have a metal ion or a substituent group, c1 represents 0 or 1, n2 represents an integer of 0 or more, provided that n2 is 0 when c1 is 0, a1 represents an integer of 1 or more, b1 represents an integer of 0 or more, a1 and b1 are selected so that the charge of the substituent group represented by formula (2) is 0, $R^a$ represents an alkyl group having 1 to 30 carbon atoms, which may have a substituent group, or an aryl group having 6 to 50 carbon atoms, which may have a substituent group, when a plurality of $Q^1$s are present, they may be the same or different, when a plurality of $M^1$s are present, they may be the same or different, and when a plurality of $Z^1$s are present, they may be the same or different;

  (3)

wherein $Ar^2$ represents a divalent aromatic group, $R^3$ represents a substituent group having a group represented by formula (4), $Ar^2$ may have a substituent group other than $R^3$, n3 represents an integer of 1 or more and, when a plurality of $R^3$s are present, they may be the same or different;

  (4)

wherein $R^4$ represents a divalent aromatic group which may have a substituent group, $Q^2$ represents a divalent organic group which may have a substituent group, $Y^2$ represents $-CO_2^-$, $-SO_3^-$, $-SO_2^-$ or $-PO_3^{2-}$, $M^2$ represents an ammonium cation which may have a metal cation or a substituent group, $Z^2$ represents $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$, c2 represents 0 or 1, n4 represents an integer of 0 or more, provided that n4 is 0 when $Y^2$ is $SO^{3-}$, a2 represents an integer of 1 or more, b2 represents an integer of 0 or more, a2 and b2 are selected so that the charge of the substituent group represented by formula (4) is 0, $R^b$ represents an alkyl group having 1 to 30 carbon atoms, which may have a substituent group, or an aryl group having 6 to 50 carbon atoms, which may have a substituent group, when a plurality of $Q^2$s are present, they may be the same or different, when a plurality of $M^2$s are present, they may be the same or different, and when a plurality of $Z^2$s are present, they may be the same or different;

  (5)

wherein $Ar^3$ represents a divalent aromatic group, $R^5$ represents a substituent group having a group represented by formula (6), $Ar^3$ may have a substituent group other than $R^5$, n5 represents an integer of 1 or more, and when a plurality of $R^5$s are present, they may be the same or different;

  (6)

wherein $R^6$ represents a monovalent aromatic group, n6 represents an integer of 0 or more, m1 represents an integer of 1 or more, $Y^3$ represents —CN or groups represented by formulas (7) to (14), when a plurality of $Y^3$s are present, they may be the same or different, when a plurality of n6s are present, they may be the same or different, and a group represented by formula (6) may contain four or more hetero atoms; and

  (7)

  (8)

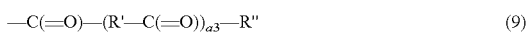  (9)

  (10)

  (11)

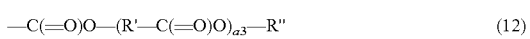  (12)

  (13)

  (14)

in formulas (7) to (14), R' represents a divalent hydrocarbon group which may have a substituent group, R" represents a hydrogen atom, a monovalent hydrocarbon group which may have a substituent group, —COOH, —SO$_3$H, —OH, —SH, —NR$^c_2$, —CN or —C(=O)NR$^c_2$, a3 represents an integer of 0 or more, a4 represents an integer of 3 to 20, R$^c$ represents an alkyl group having 1 to 30 carbon atoms, which may have a substituent group, or an aryl group having 6 to 50 carbon atoms, which may have a substituent group, and when a plurality of R's are present, they may be the same or different.

Secondly, the present invention provides the layered structure, wherein the first electrode is a cathode.

Thirdly, the present invention provides a layered structure including a first electrode and a second electrode, a light-emitting layer or a charge separation layer between the first electrode and the second electrode, and a layer containing a conjugated polymer compound insoluble in a solvent having a solubility parameter of less than 9.3 between the light-emitting layer or the charge separation layer and the first electrode.

Fourthly, the present invention provides an electroluminescence device including the layered structure.

Fifthly, the present invention provides a photoelectric conversion device including the layered structure.

Sixthly, the present invention provides a conjugated polymer compound including a repeating unit represented by formula (15):

(15)

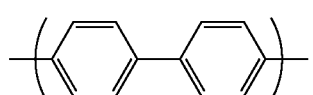

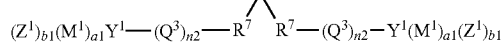

wherein R$^7$ represents a divalent aromatic group which may have a substituent group, Q$^3$ represents an alkylene group which may have a substituent group, or an oxyalkylene group which may have a substituent group, Y$^1$ represents a carbocation, an ammonium cation, a phosphonyl cation or a sulfonyl cation, M$^1$ represents F$^-$, Cl$^-$, Br$^-$, I$^-$, OH$^-$, R$^a$SO$_3^-$, R$^a$COO$^-$, ClO$^-$, ClO$_2^-$, ClO$_3^-$, ClO$_4^-$, SCN$^-$, CN$^-$, NO$_3^-$, SO$_4^{2-}$, HSO$_4^-$, PO$_4^{3-}$, HPO$_4^{2-}$, BF$_4^-$ or PF$_6^-$, Z$^1$ represents a metal ion or an ammonium ion which may have a substituent group, n2 represents an integer of 0 or more, a1 represents an integer of 1 or more, b1 represents an integer of 0 or more, a1 and b1 are selected so that the charge of the repeating unit represented by formula (15) is 0, R$^a$ represents an alkyl group having 1 to 30 carbon atoms, which may have a substituent group, or an aryl group having 6 to 50 carbon atoms, which may have a substituent group, a plurality of R$^7$s, Y$^1$s, M$^1$s, a1s, b1s and n2s may be the same or different, when a plurality of Z$^1$s are present, they may be the same or different, and when a plurality of Q$^3$s are present, they may be the same or different.

Seventhly, the present invention provides a conjugated polymer compound including a repeating unit represented by formula (16):

(16)

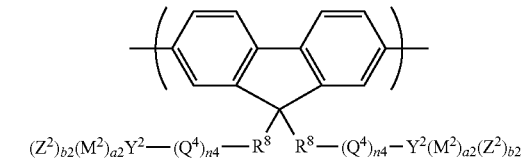

wherein R$^8$ represents a divalent aromatic group which may have a substituent group, Q$^4$ represents an alkylene group which may have a substituent group, or an oxyalkylene group which may have a substituent group, Y$^2$ represents —CO$_2$, —SO$_3^-$, —SO$_2^-$ or —PO$_3^-$, M$^2$ represents a metal cation or an ammonium cation which may have a substituent group, Z$^2$ represents F$^-$, Cl$^-$, Br$^-$, I$^-$, OH$^-$, R$^b$SO$_3^-$, R$^b$COO$^-$, ClO$^-$, ClO$_2^-$, ClO$_3^-$, ClO$_4^-$, SCN$^-$, CN$^-$, NO$_3^-$, SO$_4^{2-}$, HSO$_4^-$, PO$_4^{3-}$, HPO$_4^{2-}$, H$_2$PO$_4^-$, BF$_4^-$ or PF$_6^-$, n4 represents an integer of 0 or more, provided that n4 is 0 when Y$^2$ is SO$^{3-}$, a2 represents an integer of 1 or more, b2 represents an integer of 0 or more, a2 and b2 are selected so that the charge of the repeating unit represented by formula (16) is 0, R$^b$ represents an alkyl group having 1 to 30 carbon atoms, which may have a substituent group, or an aryl group having 6 to 50 carbon atoms, which may have a substituent group, a plurality of R$^8$s, Y$^2$s, M$^2$s, a2s, b2s and n4s may be the same or different, when a plurality of Z$^2$s are present, they may be the same or different, and when a plurality of Q$^4$s are present, they may be the same or different.

Eighthly, the present invention provides a conjugated polymer compound including a repeating unit represented by formula (17):

(17)

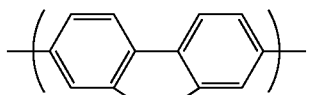

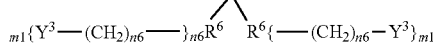

wherein R$^6$ represents a monovalent aromatic group, n6 represents an integer of 0 or more, m1 represents an integer of 1 or more, Y$^3$ represents —CN or groups represented by formulas (7) to (14), and a plurality of R$^6$s, m1s, n6s and Y$^3$s may be the same or different;

  (7)

  (8)

$$-C(=O)-(R'-C(=O))_{a3}-R'' \quad (9)$$

$$-C(=S)-(R'-C(=S))_{a3}-R'' \quad (10)$$

$$-N(R')-(N(R'))_{a3}-R'' \quad (11)$$

$$-C(=O)O-(R'-C(=O)O)_{a3}-R'' \quad (12)$$

$$-C(=O)-O-(R'O)_{a3}-R'' \quad (13)$$

$$-NHC(=O)-(R'NHC(=O))_{a3}-R'' \quad (14)$$

in formulas (7) to (14), R' represents a divalent hydrocarbon group which may have a substituent group, R" represents a hydrogen atom, a monovalent hydrocarbon group which may have a substituent group, —COOH, —SO$_3$H, —OH, —SH, —NR$^c{}_2$, —CN or —C(=O)NR$^c{}_2$, a3 represents an integer of 0 or more, a4 represents an integer of 3 to 20, R$^c$ represents an alkyl group having 1 to 30 carbon atoms, which may have a substituent group, or an aryl group having 6 to 50 carbon atoms, which may have a substituent group, and when a plurality of R's are present, they may be the same or different.

MODE FOR CARRYING OUT THE INVENTION

The present invention will be described in detail below.

The conjugated polymer compound used in the present invention contains one or more repeating units selected from the group consisting of a repeating unit represented by formula (1), a repeating unit represented by formula (3) and a repeating unit represented by formula (5). Examples of the conjugated polymer compound include a conjugated polymer compound containing only a repeating unit represented by formula (1), a conjugated polymer compound containing only a repeating unit represented by formula (3), a conjugated polymer compound containing only a repeating unit represented by formula (5), a conjugated polymer compound containing a repeating unit represented by formula (1) and a repeating unit represented by formula (3), a conjugated polymer compound containing a repeating unit represented by formula (1) and a repeating unit represented by formula (5), a conjugated polymer compound containing a repeating unit represented by formula (3) and a repeating unit represented by formula (5), and a conjugated polymer compound containing a repeating unit represented by formula (1), a repeating unit represented by formula (3) and a repeating unit represented by formula (5).

The above conjugated polymer compound may contain two or more repeating units represented by formula (1), two or more repeating units represented by formula (3), or two or more repeating units represented by formula (5).

In the repeating unit represented by formula (1), Ar$^1$ represents a divalent aromatic group, R$^1$ represents a substituent group having a group represented by formula (2), and Ar$^1$ may have a substituent group other than R$^1$. n1 represents an integer of 1 or more. The group represented by formula (2) may be directly bonded to Ar$^1$, or may be bonded to Ar$^1$ via a divalent alkylene group having about 1 to 50 carbon atoms, which may have a substituent group, such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group or an adamantylene group; an oxyalkylene group having about 1 to 50 carbon atoms, which may have a substituent group, such as an oxymethylene group, an oxyethylene group, an oxypropylene group, an oxybutylene group, an oxypentylene group, an oxyhexylene group, an oxynonylene group, an oxydodecylene, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group or an adamantyleneoxy group; an imino group which may have a substituent group; a silylene group which may have a substituent group; an ethenylene group or ethynylene group which may have a substituent group; an methanetriyl group which may have a substituent group; or hetero atom such as an oxygen atom, a nitrogen atom or a sulfur atom.

In one aspect, R$^1$ is a group represented by formula (2).

The divalent aromatic group represented by Ar$^1$ in formula (1) includes a divalent aromatic hydrocarbon group and a divalent aromatic heterocyclic group, and is preferably a divalent aromatic group composed of one or more atoms selected from the group consisting of a carbon atom, a hydrogen atom, a nitrogen atom and an oxygen atom. Examples of the divalent aromatic group include a divalent group in which two hydrogen atoms are removed from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a pyrazole ring, an imidazole ring, an oxazole ring, an oxadiazole ring or an azadiazole ring; a divalent group in which two hydrogen atoms are removed from a condensed polycyclic aromatic ring condensed with two or more rings selected from the monocyclic aromatic ring; a divalent group in which two hydrogen atoms are removed from a polycyclic ring in which two or more aromatic rings are linked by a single bond, an ethenylene group or an ethynylene group; and a divalent group in which two hydrogen atoms are removed from a bridged polycyclic aromatic ring having a structure that two aromatic rings are bridged by a divalent group such as a methylene group, an ethylene group or a carbonyl group.

The monocyclic aromatic ring includes, for example, the following rings.

1

2

3

4

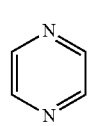

5

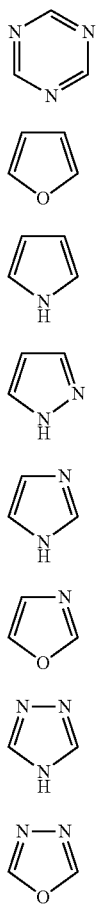
The condensed polycyclic aromatic ring includes, for example, the following rings.
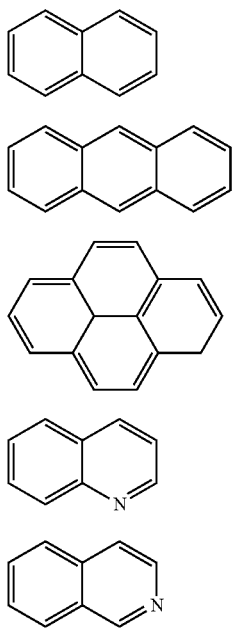
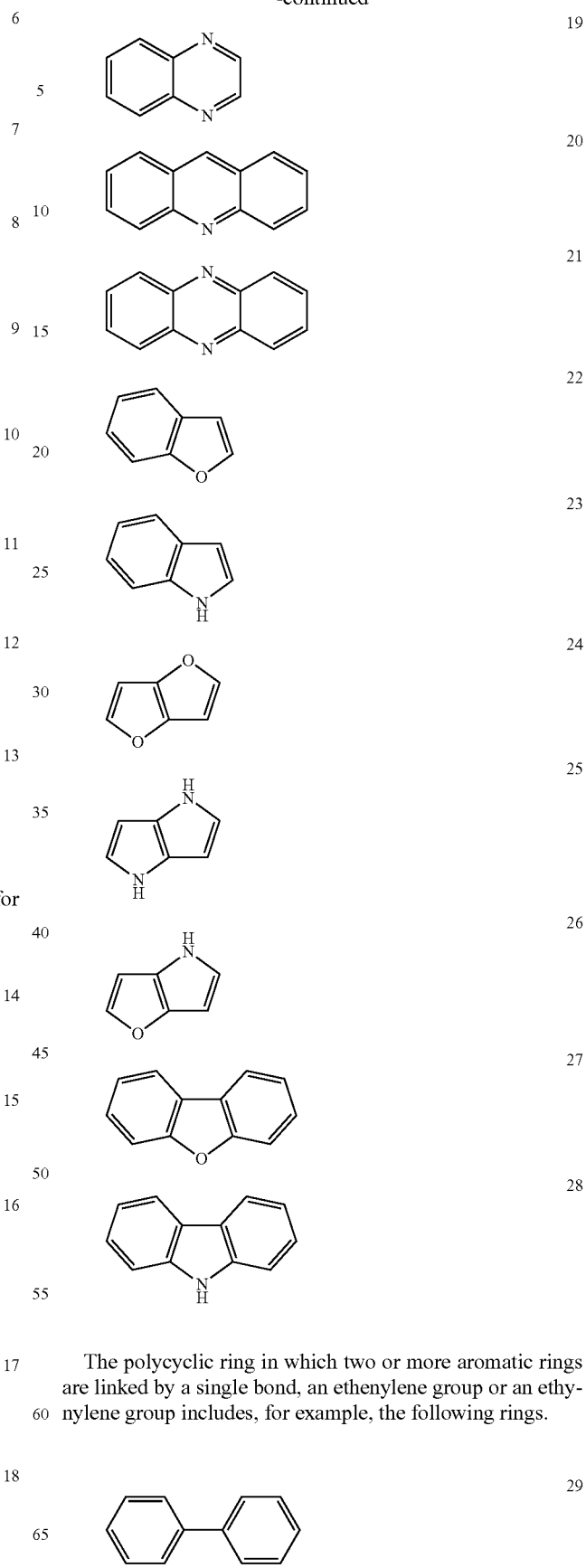
The polycyclic ring in which two or more aromatic rings are linked by a single bond, an ethenylene group or an ethynylene group includes, for example, the following rings.

30
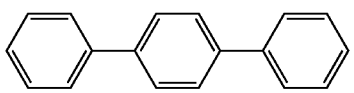

31
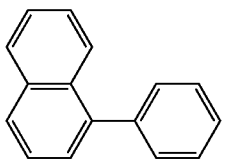

32
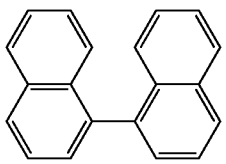

33
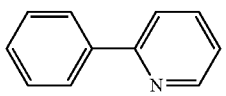

34
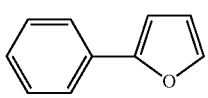

35
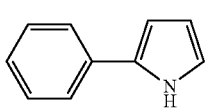

36
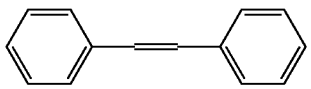

37
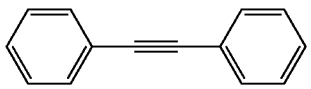

The bridged polycyclic aromatic ring includes, for example, the following rings.

38
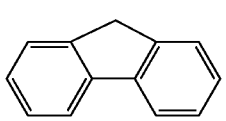

39
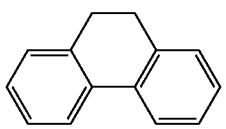

40
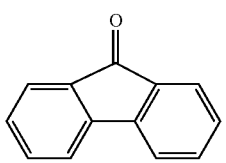

41
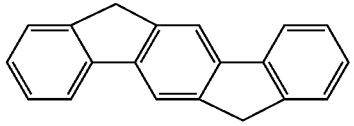

42
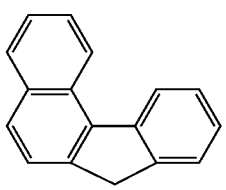

43
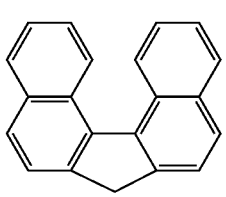

44
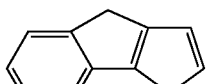

45
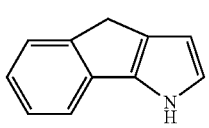

From the viewpoint of ease of synthesis of a raw monomer, the divalent aromatic group is preferably a group in which two hydrogen atoms are removed from a ring represented by formulas 1 to 15, formulas 27 to 30, formulas 38 to 40 or formula 42, more preferably a group in which two hydrogen atoms are removed from a ring represented by formulas 1 to 6, formula 8, formula 14, formula 27, formula 28, formula 38 or formula 42, and still more preferably a group in which two hydrogen atoms are removed from a ring represented by formula 1, formula 38 or formula 42.

The divalent aromatic group may have one or more substituent groups represented by $R^1$, or may have a substituent group other than the substituent group represented by $R^1$. Examples of the substituent group include an alkyl group, an alkoxy group, an alkylthio group, an aryl group, an aryloxy group, an arylthio group, an arylalkyl group, an arylalkoxy group, an arylalkylthio group, an arylalkenyl group, an arylalkynyl group, an amino group, a substituted amino group, a silyl group, a substituted silyl group, an halogen atom, an acyl group, an acyloxy group, an imine residue, an amide group, an acid imide group, a monovalent heterocyclic group, a hydroxy group, a carboxyl group, a substituted oxycarbonyl group, a cyano group and a nitro group, and when a plurality of substituent groups are present, they may be the same or different.

The alkyl group may be linear or branched, and may be a cycloalkyl group. The number of carbon atoms in the alkyl group is usually from about 1 to 20, and preferably from 1 to 10. Specific examples of the alkyl group include a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group and a lauryl group. The hydrogen atom in the alkyl group may be substituted with a fluorine atom. Examples of the alkyl group substituted with a fluorine atom include a trifluoromethyl group, a pentafluoroethyl group, a perfluorobutyl group, a perfluorohexyl group and a perfluorooctyl group.

The alkoxy group may be linear or branched, or may be a cycloalkyloxy group, or may have a substituent group. The number of carbon atoms in the alkoxy group is usually from about 1 to 20, and preferably from 1 to 10. Specific examples of the alkoxy group include a methoxy group, an ethoxy group, a propyloxy group, an isopropyloxy group, a butoxy group, an isobutoxy group, a s-butoxy group, a t-butoxy group, a pentyloxy group, a hexyloxy group, a cyclohexyloxy group, a heptyloxy group, an octyloxy group, a nonyloxy group, a decyloxy group and a lauryloxy group.

The alkoxy group also includes a methoxymethyloxy group and a 2-methoxyethyloxy group.

The hydrogen atom in the alkoxy group may be substituted with a fluorine atom. Examples of the alkoxy group substituted with a fluorine atom include a trifluoromethoxy group, a pentafluoroethoxy group, a perfluorobutoxy group, a perfluorohexyloxy group and a perfluorooctyloxy group.

The alkylthio group may be linear or branched, or may be a cycloalkylthio group, or may have a substituent group. The number of carbon atoms in the alkylthio group is usually from about 1 to 20, and preferably from 1 to 10. Specific examples of the alkylthio group include a methylthio group, an ethylthio group, a propylthio group, an isopropylthio group, a butylthio group, an isobutylthio group, a s-butylthio group, a t-butylthio group, a pentylthio group, a hexylthio group, a cyclohexylthio group, a heptylthio group, an octylthio group, a nonylthio group, a decylthio group and a laurylthio group. The hydrogen atom in the alkylthio group may be substituted with a fluorine atom. Examples of the alkylthio group substituted with a fluorine atom include a trifluoromethylthio group.

The aryl group is an atomic group in which one hydrogen atom is removed from an aromatic hydrocarbon, and also includes those having a benzene ring, those having a condensed ring, and those in which two or more independent benzene rings or condensed rings are bonded directly or via a group such as vinylene. The aryl group usually has about 6 to 60 carbon atoms, and preferably 7 to 48 carbon atoms. Specific examples of the aryl group include a phenyl group, a $C_1$-$C_{12}$ alkoxyphenyl group ($C_1$-$C_{12}$ denotes that the number of carbon atoms is from 1 to 12, the same shall apply hereinafter), a $C_1$-$C_{12}$ alkylphenyl group, a 1-naphthyl group, a 2-naphthyl group, a 1-anthracenyl group, a 2-anthracenyl group and a 9-anthracenyl group. The hydrogen atom in the aryl group may be substituted with a fluorine atom. Examples of the aryl group substituted with a fluorine atom include a pentafluorophenyl group. Among the aryl groups, a $C_1$-$C_{12}$ alkoxyphenyl group and a $C_1$-$C_{12}$ alkylphenyl group are preferable.

Examples of the $C_1$-$C_{12}$ alkoxyphenyl group include a methoxyphenyl group, an ethoxyphenyl group, a propyloxyphenyl group, an isopropyloxyphenyl group, a butoxyphenyl group, an isobutoxyphenyl group, a s-butoxyphenyl group, a t-butoxyphenyl group, a pentyloxyphenyl group, a hexyloxyphenyl group, a cyclohexyloxyphenyl group, a heptyloxyphenyl group, an octyloxyphenyl group, a 2-ethylhexyloxyphenyl group, a nonyloxyphenyl group, a decyloxyphenyl group, a 3,7-dimethyloctyloxyphenyl group and a lauryloxyphenyl group.

Examples of the $C_1$-$C_{12}$ alkylphenyl group include a methylphenyl group, an ethylphenyl group, a dimethylphenyl group, a propylphenyl group, a mesityl group, a methylethylphenyl group, an isopropylphenyl group, a butylphenyl group, an isobutylphenyl group, a t-butylphenyl group, a pentylphenyl group, an isoamylphenyl group, a hexylphenyl group, a heptylphenyl group, an octylphenyl group, a nonylphenyl group, a decylphenyl group and a dodecylphenyl group.

The aryloxy group usually has about 6 to 60 carbon atoms, and preferably 7 to 48 carbon atoms. Specific examples of the aryloxy group include a phenoxy group, a $C_1$-$C_{12}$ alkoxyphenoxy group, a $C_1$-$C_{12}$ alkylphenoxy group, a 1-naphthyloxy group, a 2-naphthyloxy group and a pentafluorophenyloxy group. Among the aryloxy groups, a $C_1$-$C_{12}$ alkoxyphenoxy group and a $C_1$-$C_{12}$ alkylphenoxy group are preferable.

Examples of the $C_1$-$C_{12}$ alkoxyphenoxy group include a methoxyphenoxy group, an ethoxyphenoxy group, a propyloxyphenoxy group, an isopropyloxyphenoxy group, a butoxyphenoxy group, an isobutoxyphenoxy group, a s-butoxyphenoxy group, a t-butoxyphenoxy group, a pentyloxyphenoxy group, a hexyloxyphenoxy group, a cyclohexyloxyphenoxy group, a heptyloxyphenoxy group, an octyloxyphenoxy group, a 2-ethylhexyloxyphenoxy group, a nonyloxyphenoxy group, a decyloxyphenoxy group, a 3,7-dimethyloctyloxyphenoxy group and a lauryloxyphenoxy group.

Examples of the $C_1$-$C_{12}$ alkylphenoxy group include a methylphenoxy group, an ethylphenoxy group, a dimethylphenoxy group, a propylphenoxy group, a 1,3,5-trimethylphenoxy group, a methylethylphenoxy group, an isopropylphenoxy group, a butylphenoxy group, an isobutylphenoxy group, a s-butylphenoxy group, a t-butylphenoxy group, a pentylphenoxy group, an isoamylphenoxy group, a hexylphenoxy group, a heptylphenoxy group, an octylphenoxy group, a nonylphenoxy group, a decylphenoxy group and a dodecylphenoxy group.

The arylthio group is a group in which a sulfur element is bonded to the above aryl group, and may have a substituent group on an aromatic ring of the aryl group. The arylthio group usually has about 6 to 60 carbon atoms, and preferably 6 to 30 carbon atoms. Specific examples of the arylthio group include a phenylthio group, a $C_1$-$C_{12}$ alkoxyphenylthio group, a $C_1$-$C_{12}$ alkylphenylthio group, a 1-naphthylthio group, a 2-naphthylthio group and a pentafluorophenylthio group.

The arylalkyl group is a group in which the above alkyl group is bonded to the above aryl group, and may have a substituent group. The arylalkyl group usually has about 7 to 60 carbon atoms, and preferably 7 to 30 carbon atoms. Specific examples of the arylalkyl group include a phenyl-$C_1$-$C_{12}$ alkyl group, a $C_1$-$C_{12}$ alkoxyphenyl-$C_1$-$C_{12}$ alkyl group, a $C_1$-$C_{12}$ alkylphenyl-$C_1$-$C_{12}$ alkyl group, a 1-naphthyl-$C_1$-$C_{12}$ alkyl group and a 2-naphthyl-$C_1$-$C_{12}$ alkyl group.

The arylalkoxy group is a group in which the above alkoxy group is bonded to the above aryl group, and may have a substituent group. The arylalkoxy group usually has about 7 to 60 carbon atoms, and preferably 7 to 30 carbon atoms. Specific examples of the arylalkoxy group include a phenyl-$C_1$-$C_{12}$ alkoxy group, a $C_1$-$C_{12}$ alkoxyphenyl-$C_1$-$C_{12}$ alkoxy group, a $C_1$-$C_{12}$ alkylphenyl-$C_1$-$C_{12}$ alkoxy group, a 1-naphthyl-$C_1$-$C_{12}$ alkoxy group and a 2-naphthyl-$C_1$-$C_{12}$ alkoxy group.

The arylalkylthio group is a group in which the above alkylthio group is bonded to the aryl group, and may have a substituent group. The arylalkylthio group usually has 7 to 60 carbon atoms, and preferably 7 to 30 carbon atoms. Specific examples of the arylalkylthio group include a phenyl-$C_1$-$C_{12}$ alkylthio group, a $C_1$-$C_{12}$ alkoxyphenyl-$C_1$-$C_{12}$ alkylthio group, a $C_1$-$C_{12}$ alkylphenyl-$C_1$-$C_{12}$ alkylthio group, a 1-naphthyl-$C_1$-$C_{12}$ alkylthio group and a 2-naphthyl-$C_1$-$C_{12}$ alkylthio group.

The arylalkenyl group is a group in which an alkenyl group is bonded to the above aryl group. The arylalkenyl group usually has about 8 to 60 carbon atoms, and preferably 8 to 30 carbon atoms. Specific examples of the arylalkenyl group include a phenyl-$C_2$-$C_{12}$ alkenyl group, a $C_1$-$C_{12}$ alkoxyphenyl-$C_2$-$C_{12}$ alkenyl group, a $C_1$-$C_{12}$ alkylphenyl-$C_2$-$C_{12}$ alkenyl group, a 1-naphthyl-$C_2$-$C_{12}$ alkenyl group and a 2-naphthyl-$C_2$-$C_{12}$ alkenyl group, and a $C_1$-$C_{12}$ alkoxyphenyl-$C_2$-$C_{12}$ alkenyl group and a $C_2$-$C_{12}$ alkylphenyl-$C_2$-$C_{12}$ alkenyl group are preferable.

The arylalkynyl group is a group in which an alkynyl group is bonded to the above aryl group. The arylalkynyl group usually has about 8 to 60 carbon atoms, and preferably 8 to 30 carbon atoms. Specific examples of the arylalkynyl group include a phenyl-$C_2$-$C_{12}$ alkynyl group, a $C_1$-$C_{12}$ alkoxyphenyl-$C_2$-$C_{12}$ alkynyl group, a $C_1$-$C_{12}$ alkylphenyl-$C_2$-$C_{12}$ alkynyl group, a 1-naphthyl-$C_2$-$C_{12}$ alkynyl group and a 2-naphthyl-$C_2$-$C_{12}$ alkynyl group, and a $C_1$-$C_{12}$ alkoxyphenyl-$C_2$-$C_{12}$ alkynyl group and a $C_1$-$C_{12}$ alkylphenyl-$C_2$-$C_{12}$ alkynyl group are preferable.

The substituted amino group is preferably an amino group substituted with one or two groups selected from the group consisting of an alkyl group, an aryl group, an arylalkyl group and a monovalent heterocyclic group. The alkyl group, the aryl group, the arylalkyl group or the monovalent heterocyclic group may have a substituent group. The number of carbon atoms of the substituted amino group is usually from about 1 to 60, and preferably from 2 to 48, excluding the number of carbon atoms of the substituent group. Specific examples of the substituted amino group include a methylamino group, a dimethylamino group, an ethylamino group, a diethylamino group, a propylamino group, a dipropylamino group, an isopropylamino group, a diisopropylamino group, a butylamino group, an isobutylamino group, a s-butylamino group, a t-butylamino group, a pentylamino group, a hexylamino group, a cyclohexylamino group, a heptylamino group, an octylamino group, a 2-ethylhexylamino group, a nonylamino group, a decylamino group, a 3,7-dimethyloctylamino group, a laurylamino group, a cyclopentylamino group, a dicyclopentylamino group, a cyclohexylamino group, a dicyclohexylamino group, a pyrrolidyl group, a piperidyl group, a ditrifluoromethylamino group, a phenylamino group, a diphenylamino group, a $C_1$-$C_{12}$ alkoxyphenylamino group, a di($C_1$-$C_{12}$ alkoxyphenyl)amino group, a di($C_1$-$C_{12}$ alkylphenyl)amino group, a 1-naphthylamino group, a 2-naphthylamino group, a pentafluorophenylamino group, a pyridylamino group, a pyridazinylamino group, a pyrimidylamino group, a pyrazylamino group, a triazylamino group, a phenyl-$C_1$-$C_{12}$ alkylamino group, a $C_1$-$C_{12}$ alkoxyphenyl-$C_1$-$C_{12}$ alkylamino group, a $C_1$-$C_{12}$ alkylphenyl-$C_1$-$C_{12}$ alkylamino group, a di($C_1$-$C_{12}$ alkoxyphenyl-$C_1$-$C_{12}$ alkyl)amino group, a di($C_1$-$C_{12}$ alkylphenyl-$C_1$-$C_{12}$ alkyl)amino group, a 1-naphthyl-$C_1$-$C_{12}$ alkylamino group and a 2-naphthyl-$C_1$-$C_{12}$ alkylamino group.

Examples of the substituted silyl group include a silyl group substituted with one to three groups selected from the group consisting of an alkyl group, an aryl group, an arylalkyl group and a monovalent heterocyclic group. The substituted silyl group usually has about 1 to 60 carbon atoms, and preferably 3 to 48 carbon atoms. The alkyl group, the aryl group, the arylalkyl group or the monovalent heterocyclic group in the substituted silyl group may have a substituent group. Specific examples of the substituted silyl group include a trimethylsilyl group, a triethylsilyl group, a tripropylsilyl group, a tri-isopropylsilyl group, a dimethyl-isopropylsilyl group, a diethyl-isopropylsilyl group, a t-butyldimethylsilyl group, a pentyldimethylsilyl group, a hexyldimethylsilyl group, a heptyldimethylsilyl group, an octyldimethylsilyl group, a 2-ethylhexyl-dimethylsilyl group, a nonyldimethylsilyl group, a decyldimethylsilyl group, a 3,7-dimethyloctyl-dimethylsilyl group, a lauryldimethylsilyl group, a phenyl-$C_1$-$C_{12}$ alkylsilyl group, a $C_1$-$C_{12}$ alkoxyphenyl-$C_1$-$C_{12}$ alkylsilyl group, a $C_1$-$C_{12}$-alkylphenyl-$C_1$-$C_{12}$ alkylsilyl group, a 1-naphthyl-$C_1$-$C_{12}$ alkylsilyl group, a 2-naphthyl-$C_1$-$C_{12}$ alkylsilyl group, a phenyl-$C_1$-$C_{12}$ alkyldimethylsilyl group, a triphenylsilyl group, a tri-p-xylylsilyl group, a tribenzylsilyl group, a diphenylmethylsilyl group, a t-butyldiphenylsilyl group and a dimethylphenylsilyl group.

Examples of the halogen atom include a fluorine atom, a chlorine atom, a bromine atom and an iodine atom.

The acyl group usually has about 2 to 20 carbon atoms, and preferably 2 to 18 carbon atoms. Specific examples of the acyl group include an acetyl group, a propionyl group, a butyryl group, an isobutyryl group, a pivaloyl group, a benzoyl group, a trifluoroacetyl group and a pentafluorobenzoyl group.

The acyloxy group usually has about 2 to 20 carbon atoms, and preferably 2 to 18 carbon atoms. Specific examples of the acyloxy group include an acetoxy group, a propionyloxy group, a butyryloxy group, an isobutyryloxy group, a pivaloyloxy group, a benzoyloxy group, a trifluoroacetyloxy group and a pentafluorobenzoyloxy group.

The imine residue is a residue in which one hydrogen atom is removed from an imine compound (which means an organic compound having a group represented by the formula: —N=C— in a molecule and includes, for example, aldimine, ketimine, and a compound in which hydrogen atoms on N are substituted with an alkyl group or the like) and usually has about 2 to 20 carbon atoms, and preferably 2 to 18 carbon atoms. The imine residue includes, for example, the followings.

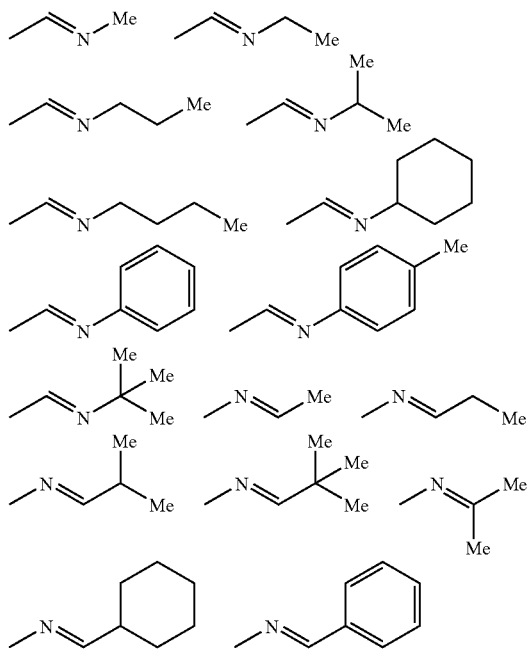

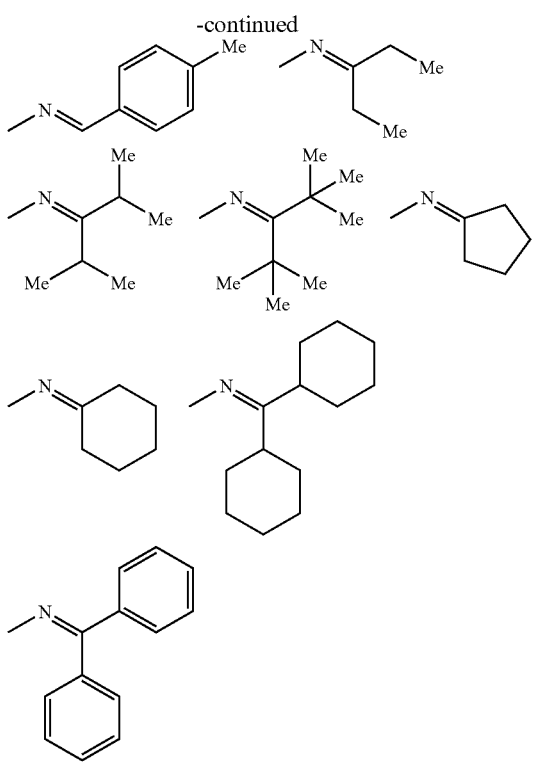

The amide group has usually about 2 to 20 carbon atoms, and 2 to 18 carbon atoms. Specific examples of the amide group include a formamide group, an acetamide group, a propioamide group, a butyroamide group, a benzamide group, a trifluoroacetamide group, a pentafluorobenzamide group, a diformamide group, a diacetamide group, a dipropioamide group, a dibutyroamide group, a dibenzamide group, a ditrifluoroacetamide group and a dipentafluorobenzamide group.

The acid imide group includes a residue obtained by removing hydrogen atoms bonded to a nitrogen atom from an acid imide, and usually has about 4 to 20 carbon atoms, and preferably 4 to 18 carbon atoms. The acid imide group includes, for example, the followings.

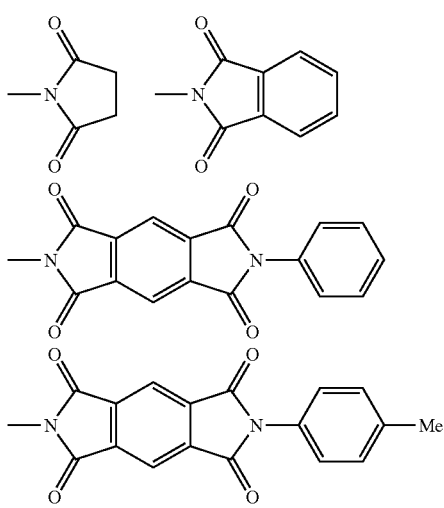

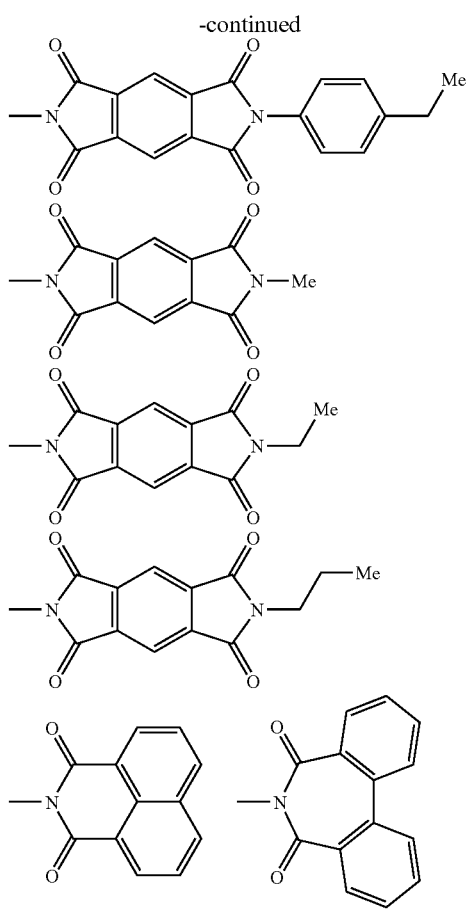

The monovalent heterocyclic group means an atomic group remaining after removing one hydrogen atom from a heterocyclic compound. The monovalent heterocyclic group usually has 4 to 60 carbon atoms, and preferably 4 to 20 carbon atoms. The number of carbon atoms of the monovalent heterocyclic group does not include the number of carbon atoms of the substituent group. The heterocyclic compound means a compound in which an element constituting the ring includes not only carbon atoms, but also hetero atoms such as oxygen, sulfur, nitrogen, phosphorus and boron in the ring, among organic compounds having a cyclic structure. The monovalent heterocyclic group includes, for example, a thienyl group, a $C_1$-$C_{12}$ alkylthienyl group, a pyrrolyl group, a furyl group, a pyridyl group, a $C_1$-$C_{12}$ alkylpyridyl group, a piperidyl group, a quinolyl group and an isoquinolyl group. Among these groups, a thienyl group, a $C_1$-$C_{12}$ alkylthienyl group, a pyridyl group and a $C_1$-$C_{12}$ alkylpyridyl group are more preferable.

The substituted oxycarbonyl group is an oxycarbonyl group substituted with an alkyl group, an aryl group, an arylalkyl group or a monovalent heterocyclic group, that is, a group represented by —C(=O)OR(R is a alkyl group, an aryl group, an arylalkyl group or a monovalent heterocyclic group).

The substituted oxycarbonyl group usually has 2 to 60 carbon atoms, and preferably 2 to 48 carbon atoms. The alkyl group, the aryl group, the arylalkyl group or the monovalent heterocyclic group may have a substituent group. It is assumed that the number of carbon atoms does not include the number of carbon atoms of the above substituent group. Specific examples of the substituted oxycarbonyl group include a methoxycarbonyl group, an ethoxycarbonyl group, a propoxycarbonyl group, an isopropoxycarbonyl group, a butoxycarbonyl group, an isobutoxycarbonyl group, a s-butoxycarbonyl group, a t-butoxycarbonyl group, a pentyloxycarbonyl group, a hexyloxycarbonyl group, a cyclohexyloxycarbonyl group, a heptyloxycarbonyl group, an octyloxycarbonyl group, a 2-ethylhexyloxycarbonyl group, a nonyloxycarbonyl group, a decyloxycarbonyl group, a 3,7-dimethyloctyloxycarbonyl group, a dodecyloxycarbonyl group, a trifluoromethoxycarbonyl group, a pentafluoroethoxycarbonyl group, a perfluorobutoxycarbonyl group, a perfluorohexyloxycarbonyl group, a perfluorooctyloxycarbonyl group, a phenoxycarbonyl group, a naphthoxycarbonyl group and a pyridyloxycarbonyl group.

When $Ar^1$ has a substituent group other than $R^1$, the substituent group is preferably an alkyl group, an alkoxy group, an aryl group, an aryloxy group, a carboxyl group or a substituted oxycarbonyl group from the viewpoint of ease of synthesis of a monomer as a raw material of a conjugated polymer compound.

In formula (1), n1 represents an integer of 1 or more, preferably from 1 to 4, and more preferably from 1 to 3.

In the present invention, conjugation represents a state where multiple bonds are linked via one single bond or nitrogen atom and interact with each other.

In one aspect, $R^1$ is represented by formula (2):

$$-(R^2)_{c1}-(Q^1)_{n2}-Y^1(M^1)_{a1}(Z^1)_{b1} \quad (2)$$

wherein $R^2$ represents a divalent aromatic group which may have a substituent group, $Q^1$ represents a divalent organic group which may have a substituent group, $Y^1$ represents a carbocation, an ammonium cation, a phosphonyl cation or a sulfonyl cation, $M^1$ represents $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$, $Z^1$ represents a metal ion or an ammonium ion which may have a substituent group, c1 represents 0 or 1, and n2 represents an integer of 0 or more. However, n2 is 0 when c1 is 0. a1 represents an integer of 1 or more and b1 represents an integer of 0 or more. a1 and b1 are selected so that the charge of the substituent group represented by formula (2) is 0. $R^a$ represents an alkyl group having 1 to 30 carbon atoms, which may have a substituent group, or an aryl group having 6 to 50 carbon atoms, which may have a substituent group.

In formula (2), the divalent aromatic group represented by $R^2$ includes a 1,4-phenylene group, a 1,3-phenylene group, a 1,4-naphthylene group, a 1,5-naphthylene group, a 2,6-naphthylene group, a 2,6-anthracenylene group, a 9,10-anthracenylene group and a biphenyl-4,4'-diyl group. From the viewpoint of ease of synthesis of a raw monomer, a 1,4-phenylene group and a 1,3-phenylene group are preferable.

The substituent group which may be contained in the divalent aromatic group includes the same substituent group as that other than $R^1$, which may be contained in the above $Ar^1$, and the divalent aromatic group preferably has a substituent group from the viewpoint of thermal activation of the above conjugated polymer compound. When a plurality of substituent groups are present, they may be the same or different.

In formula (2), examples of the divalent organic group represented by $Q^1$ include a divalent alkylene group having about 1 to 50 carbon atoms, which may have a substituent group, such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group or a adamantylene group; an oxyalkylene group having about 1 to 50 carbon atoms, which may have a substituent group, such as an oxymethylene group, an oxyethylene group, an oxypropylene group, an oxybutylene group, an oxypentylene group, an oxyhexylene group, an oxynonylene group, an oxydodecylene, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group or an adamantyleneoxy group; an imino group which may have a substituent group; a silylene group which may have a substituent group; and an ethenylene group or an ethynylene group which may have a substituent group. From the viewpoint of ease of synthesis of a raw monomer, an alkylene group and an oxyalkylene group are preferable.

In formula (2), $Y^1$ represents a carbocation, an ammonium cation, a phosphonyl cation or a sulfonyl cation.

The carbocation includes, for example, a group represented by:

wherein R is the same or different and represents an alkyl group or an aryl group.

The ammonium cation includes, for example, a group represented by:

wherein R is the same or different and represents an alkyl group or an aryl group.

The phosphonyl cation includes, for example, a group represented by

wherein R is the same or different and represents an alkyl group or an aryl group.

The sulfonyl cation includes, for example, a group represented by:

wherein R is the same or different and represents an alkyl group or an aryl group.

In formula (2), $Y^1$ is preferably an ammonium cation from the viewpoints of ease of synthesis of a raw monomer and stability of a raw monomer and a conjugated polymer compound against air, humidity or heat.

In formula (2), $Z^1$ represents a metal ion or an ammonium ion which may have a substituent group. A metal ion is preferably mono-, a di- or trivalent ion and includes ions of Li, Na, K, Cs, Be, Mg, Ca, Ba, Ag, Al, Bi, Cu, Fe, Ga, Mn, Pb, Sn, Ti, V, W, Y, Yb, Zn and Zr. Examples of the substituent group which may be contained in the ammonium ion include an alkyl group having about 1 to 10 carbon atoms, such as a methyl group, an ethyl group, a propyl group, an isopropyl group, a n-butyl group, an isobutyl group and a t-butyl group.

In formula (2), c1 is preferably 1 from the viewpoint of stability of a conjugated polymer compound.

In formula (2), n2 represents an integer of 0 or more, preferably from 0 to 6, and more preferably 0.

In formula (2), a1 represents an integer of 1 or more, preferably from 1 to 3, and more preferably from 1 to 2. b1 represents an integer of 0 or more, preferably from 0 to 2, and more preferably from 0 to 1.

a1 and b1 are selected so that the charge of the group represented by formula (2) is 0. Among the groups represented by formula (2), the charge of the moiety represented by:

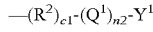

is usually +1. Therefore, a relationship between a1 and b1 in this case will be described below.

a) In a case $M^1$ is a monovalent anion (that is, in a case $M^1$ is $F^-$, $Cl^-$, $Br^-$, $I^-$, $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$ or $PF_6^-$), a-1) when $Z^1$ is an ammonium ion which may have a monovalent metal ion or a substituent group, $a1=b1+1$, a-2) when $Z^1$ is a divalent metal ion, $a1=2\times b1+1$, and a-3) when $Z^1$ is a trivalent metal ion, $a1=3\times b1+1$.

b) In a case $M^1$ is a divalent anion (that is, in a case $M^1$ is $SO_4^{2-}$ or $HPO_4^{2-}$), b-1) when $Z^1$ is an ammonium ion which may have a monovalent metal ion or a substituent group, $b1=2\times a1-1$, b-2) when $Z^1$ is a divalent metal ion, a relationship of $2\times a1=2\times b1+1$ is satisfied, and b-3) when $Z^1$ is a trivalent metal ion, $2\times a1=3\times b1+1$.

$R^a$ represents an alkyl group having 1 to 30 carbon atoms, which may have a substituent group, or an aryl group having 6 to 50 carbon atoms, which may have a substituent group. Examples of the substituent group which may be contained in these groups include the same substituent groups as those other than $R^1$, which may be contained in the $Ar^1$. When a plurality of substituent groups are present, they may be the same or different. Examples of $R^a$ include an alkyl group having 1 to 20 carbon atoms, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group or a lauryl group; and an aryl group having 6 to 30 carbon atoms, such as a phenyl group, a 1-naphthyl group, a 2-naphthyl group, a 1-anthracenyl group, a 2-anthracenyl group or a 9-anthracenyl group.

Among the repeating units represented by formula (1), a repeating unit wherein $Ar^1$ is a group in which two hydrogen atoms are removed from a ring represented by formula 38 is preferable, and a repeating unit represented by the following formula:

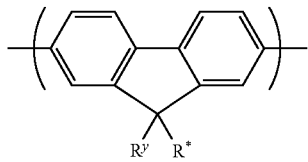

wherein $R^y$ represents a substituent group having a group represented by formula (2), and $R^*$ represents $R^y$, a hydrogen atom, an alkyl group or an aryl group, is more preferable.

Among the repeating units represented by formula (1), from the viewpoint of electron transporting property, preferred is a repeating unit represented by formula (15):

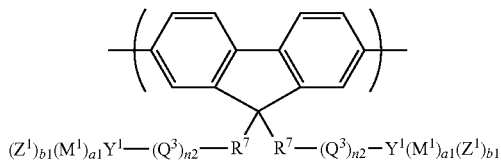

(15)

wherein $R^7$ represents a divalent aromatic group which may have a substituent group, $Q^3$ represents an alkylene group which may have a substituent group, or an oxyalkylene group which may have a substituent group, and $n2$, $Y^1$, $M^1$, $Z^1$, $a1$ and $b1$ have the same meanings as defined above. A plurality of $n2$s, $R^7$s, $Y^1$s, $M^1$s, $a1$s and $b1$s may be the same or different. When a plurality of $Q^3$s are present, they may be the same or different and, when a plurality of $Z^1$s are present, they may be the same or different.

In formula (15), examples of the divalent aromatic group represented by $R^7$ include a 1,4-phenylene group, a 1,3-phenylene group, a 1,4-naphthylene group, a 1,5-naphthylene group, a 2,6-naphthylene group, a 2,6-anthracenylene group, a 9,10-anthracenylene group and a biphenyl-4,4'-diyl group. From the viewpoint of ease of synthesis of a raw monomer, a 1,4-phenylene group and a 1,3-phenylene group are preferable.

Examples of the substituent group which may be contained in the divalent aromatic group represented by $R^7$ include the same substituent groups as those other than $R^1$, which may be contained in the $Ar^1$. From the viewpoint of thermal stabilization of the above conjugated polymer compound, the substituent group may be preferably contained. When a plurality of substituent groups are present, they may be the same or different.

From the viewpoint of hygroscopic property of the conjugated polymer compound, the repeating unit represented by formula (15) is preferably a repeating unit represented by formula (18):

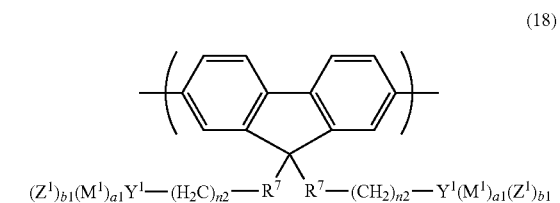

(18)

wherein $R^7$, $n2$, $Y^1$, $M^1$, $Z^1$, $a1$ and $b1$ have the same meanings as defined above.

Specific examples of the repeating unit represented by formula (18) include the following repeating units.

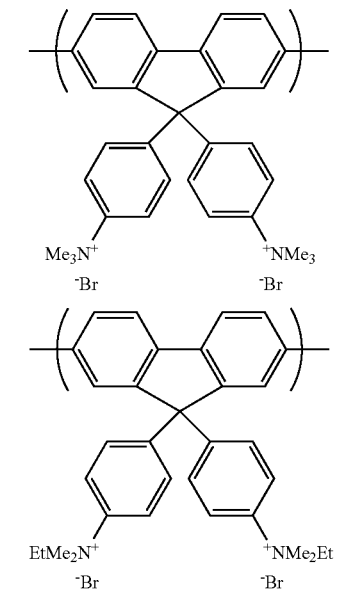

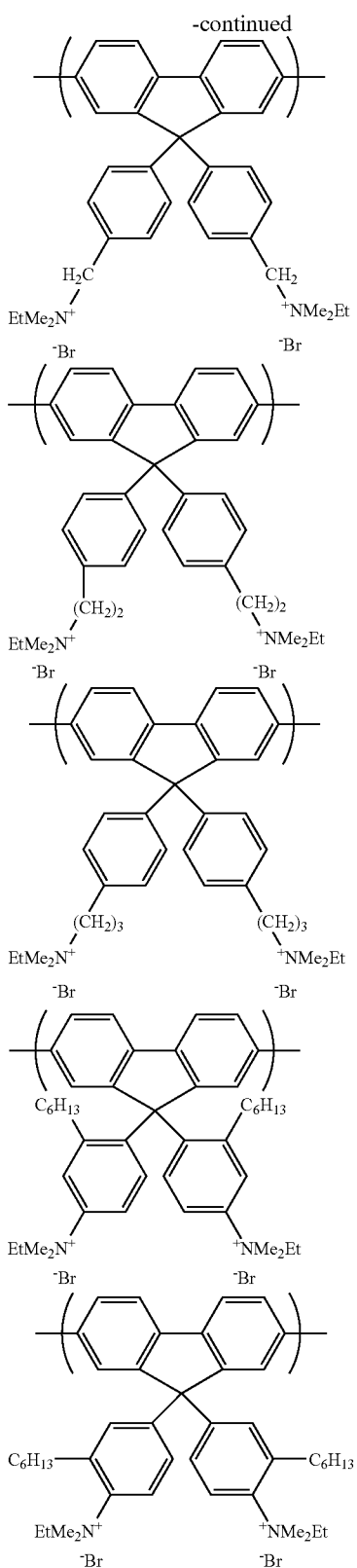

In the repeating unit represented by formula (3), $Ar^2$ represents a divalent aromatic group, $R^3$ represents a substituent group having a group represented by formula (4), and $Ar^2$ may have a substituent group other than $R^3$. n3 represents an integer of 1 or more. The group represented by formula (4) may be directly bonded to $Ar^2$, or may be bonded to $Ar^2$ via a divalent alkylene group having about 1 to 50 carbon atoms, which may have a substituent group, such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group or an adamantylene group; an oxyalkylene group having about 1 to 50 carbon atoms, which may have a substituent group, such as an oxymethylene group, an oxyethylene group, an oxypropylene group, an oxybutylene group, an oxypentylene group, an oxyhexylene group, an oxynonylene group, an oxydodecylene, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group or an adamantyleneoxy group; an imino group which may have a substituent group; a silylene group which may have a substituent group; an ethenylene group or ethynylene group which may have a substituent group; a methanetriyl group which may have a substituent group; and a hetero atom such as an oxygen atom, a nitrogen atom or a sulfur atom. In one aspect, $R^3$ is a group represented by formula (4).

From the viewpoint of ease of synthesis of a raw monomer, the divalent aromatic group represented by $Ar^2$ is preferably a group in which two hydrogen atoms are removed from a ring of formulas 1 to 15, formulas 27 to 30, formulas 38 to 40 or formula 42, more preferably a group in which two hydrogen atoms are removed from a ring of formulas 1 to 6, formula 8, formula 14, formula 27, formula 28, formula 38 or formula 42, and still more preferably a group in which two hydrogen atoms are removed from a ring of formula 1, formula 38 or formula 42.

In formula (4), $R^4$ represents a divalent aromatic group which may have a substituent group, $Q^2$ represents a divalent organic group which may have a substituent group, $Y^2$ represents $-CO_2^-$, $-SO_3^-$, $-SO_2^-$ or $-PO_3^-$. From the viewpoint of acidity of a conjugated polymer compound, $-CO_2^-$, $-SO_2^-$ or $-PO_3^-$ is preferable, and $-CO_2^-$ is more preferable. $M^2$ represents an ammonium cation which may have a metal cation or a substituent group, $Z^2$ represents $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$, c2 represents 0 or 1, and n4 represents an integer of 0 or more. However, n4 is 0 when $Y^2$ is $SO^{3-}$. a2 represents an integer of 1 or more, and b2 represents an integer of 0 or more. a2 and b2 are selected so that the charge of the substituent group represented by formula (4) is 0. $R^b$ represents an alkyl group having 1 to 30 carbon atoms, which may have a substituent group, or an aryl group having 6 to 50 carbon atoms, which may have a substituent group. When a plurality of $Q^2$s are present, they may be the same or different. When a plurality of $M^2$s are present, they may be the same or different. When a plurality of $Z^2$s are present, they may be the same or different.

In formula (4), examples of the divalent aromatic group which may have a substituent group represented by $R^4$ include an arylene group having about 6 to 50 carbon atoms, such as a 1,3-phenylene group, a 1,4-phenylene group, a 1,4-naphthylene group, a 1,5-naphthylene group, a 2,6-naphthylene group or a biphenyl-4,4'-diyl group.

Examples of the substituent group which may be contained in the divalent aromatic group include the same substituent groups as those other than $R^1$, which may be contained in the $Ar^1$. From the viewpoint of thermal stabilization of the conjugated polymer compound, the substituent group is preferably contained. When a plurality of substituent groups are present, they may be the same or different.

In formula (4), examples of the divalent organic group represented by $Q^2$ include the same groups as the divalent organic group represented by the $Q^1$. From the viewpoint ease of synthesis of a monomer as a raw material, an alkylene group and an oxyalkylene group are preferable.

Examples of the substituent group which may be contained in the divalent organic group include the same substituent group as those other than $R^1$, which may have the $Ar^1$. When a plurality of substituent groups are present, they may be the same or different.

In formula (4), $M^2$ represents a metal cation or an ammonium cation which may have a substituent group. The metal cation is preferably a mono-, di- or trivalent ion, and examples thereof include ions of Li, Na, K, Cs, Be, Mg, Ca, Ba, Ag, Al, Bi, Cu, Fe, Ga, Mn, Pb, Sn, Ti, V, W, Y, Yb, Zn and Zr. Examples of the substituent group which may be contained in the ammonium ion include an alkyl group having about 1 to 10 carbon atoms, such as a methyl group, an ethyl group, a propyl group, an isopropyl group, a n-butyl group, an i-butyl group or a t-butyl group.

In formula (4), n4 represents an integer of 0 or more. From the viewpoint of synthesis of a monomer as a raw material, n4 is preferably from 0 to 8, and more preferably 0. However, n4 is 0 when $Y^2$ is $SO^{3-}$.

In formula (4), a2 represents an integer of 1 or more, preferably from 1 to 5, and more preferably from 1 to 2. b2 represents an integer of 0 or more. b2 is preferably from 0 to 4, and more preferably from 0 to 2.

a2 and b2 are selected so that the charge of the substituent group represented by formula (4) is 0. For example, when $Y^2$ is $-CO_2^-$, $-SO_3^-$, $-SO_2^-$ or $-PO_3^-$, $M^2$ is a monovalent metal cation or an ammonium cation which may have a substituent group, and $Z^2$ is $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$ or $PF_6^-$, a2=b2+1. When $Y^2$ is $-CO_2^-$, $-SO_3^-$, $-SO_2^-$ or $-PO_3^-$, $M^2$ is a divalent metal cation, and $Z^2$ is $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$ or $PF_6^-$, b2=2×a2−1. When $Y^2$ is $-CO_2^-$, $-SO_3^-$, $-SO_2^-$ or $-PO_3^-$, $M^2$ is a trivalent metal cation, and $Z^2$ is $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $HSO_4^-$, $H_2PO_4^-$, $BF_4^-$ or $PF_6^-$, b2=3×a2−1. When $Y^2$ is $-CO_2^-$, $-SO_3^-$, $-SO_2^-$ or $-PO_3^-$, $M^2$ is an ammonium cation which may have a monovalent metal cation or a substituent group, and $Z^2$ is $SO_4^{2-}$ or $HPO_4^{2-}$, a2=2×b2+1.

$R^b$ represents an alkyl group having 1 to 30 carbon atoms, which may have a substituent group, or an aryl group having 6 to 50 carbon atoms, which may have a substituent group, and examples of the substituent group which may be contained in these groups include the same substituent groups as those other than $R^1$, which may be contained in the $Ar^1$. When a plurality of substituent groups are present, they may be the same or different. Specific examples of $R^b$ include an alkyl group having 1 to 20 carbon atoms, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group or a lauryl group; and an aryl group having 6 to 30 carbon atoms, such as a phenyl group, a 1-naphthyl group, a 2-naphthyl group, a 1-anthracenyl group, a 2-anthracenyl group or a 9-anthracenyl group.

Among the repeating units represented by formula (3), a repeating unit wherein $Ar^2$ is a group in which two hydrogen atoms are removed from a ring represented by formula 38, and a repeating unit represented by the following formula:

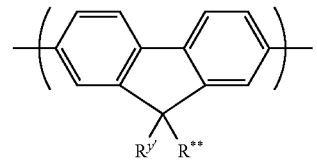

wherein $R^{y'}$ represents a substituent group having a group represented by formula (4), and $R^{**}$ represents $R^{y'}$, a hydrogen atom, an alkyl group or an aryl group, is more preferable.

From the viewpoint of electron transporting property, the repeating unit represented by formula (3) is preferably a repeating unit represented by formula (16):

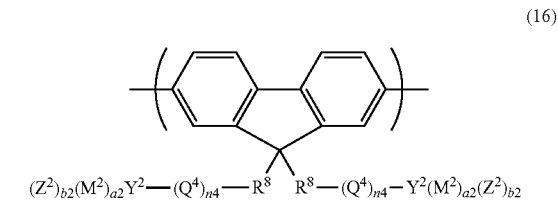

(16)

wherein $R^8$ represents a divalent aromatic group which may have a substituent group, $Q^4$ represents an alkylene group which may have a substituent group or an oxyalkylene group which may have a substituent group, and n4, $Y^2$, $M^2$, $Z^2$, a2 and b2 have the same meanings as defined above. A plurality of n4s, $R^8$s, $Y^2$s, $M^2$s, a2s and b2s may be the same or different. When a plurality of $Q^4$s are present, they may be the same or different and, when a plurality of $Z^2$s are present, they may be the same or different.

In formula (16), examples of the divalent aromatic group represented by $R^8$ include a 1,4-phenylene group, a 1,3-phenylene group, a 1,4-naphthylene group, a 1,5-naphthylene group, a 2,6-naphthylene group, a 2,6-anthracenylene group, a 9,10-anthracenylene group and a biphenyl-4,4'-diyl group.

From the viewpoint of ease of synthesis of a monomer as a raw material, the divalent aromatic group represented by $R^8$ is preferably a 1,4-phenylene group or a 1,3-phenylene group.

Examples of the substituent group which may be contained in the divalent aromatic group represented by $R^8$ include the same substituent group as those other than $R^1$, which may be contained in the $Ar^1$. From the viewpoint of thermal stabilization of the conjugated polymer compound, the substituent group is preferably contained. When a plurality of substituent groups are present, they may be the same or different. From the viewpoint of solubility of the conjugated polymer compound, the substituent group is preferably an alkyl group, an alkoxy group or a hydroxy group.

From the viewpoint of synthesis of the conjugated polymer compound, $M^2$ is preferably a Li cation, a Na cation, a K cation, a Cs cation or a tetramethylammonium cation.

From the viewpoint of water resistance of the conjugated polymer compound, the repeating unit represented by formula (15) is preferably a repeating unit represented by formula (19):

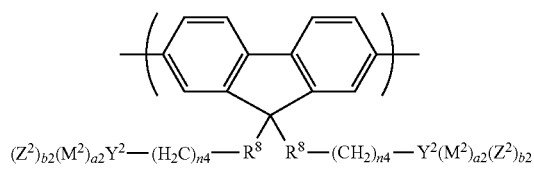
(19)

wherein $R^8$, n4, $Y^2$, $M^2$, $Z^2$, a2 and b2 have the same meanings as defined above.

Specific examples of the repeating unit represented by formula (19) include the following repeating units:

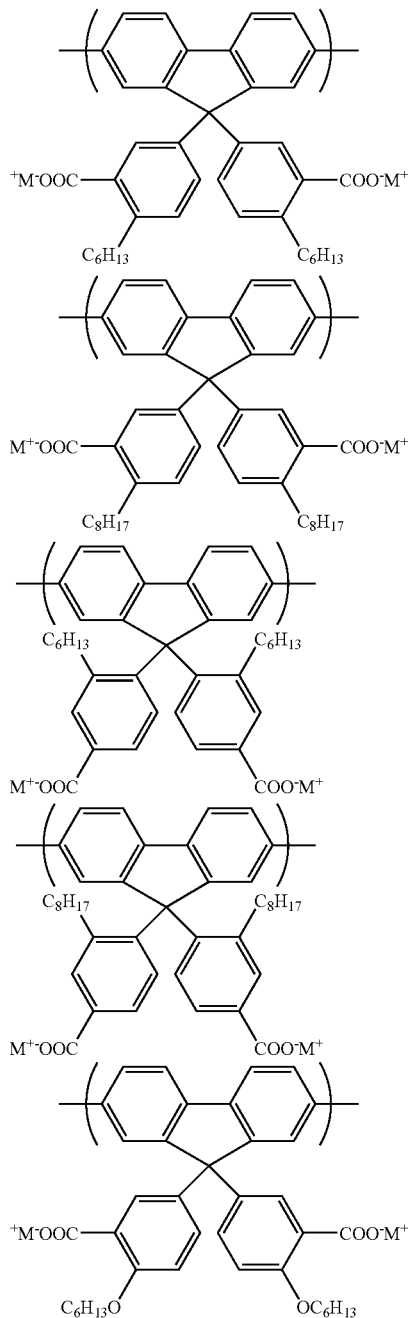

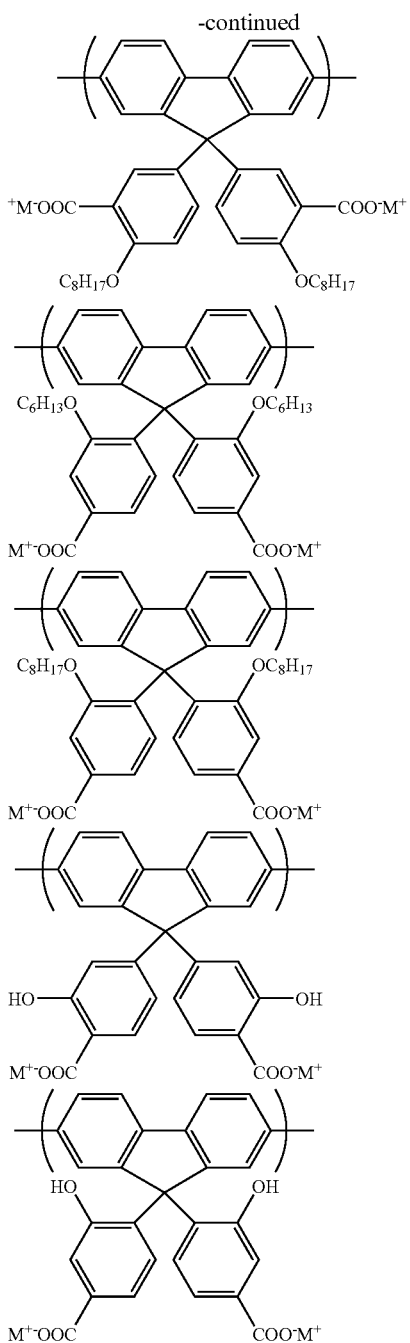

wherein M represents Li, Na, K, Cs or $NMe_4$.

In the repeating unit represented by formula (5), $Ar^3$ represents a divalent aromatic group, $R^5$ represents a substituent group having a group represented by formula (6), and $Ar^3$ may have a substituent group other than $R^5$. n5 represents an integer of 1 or more. $R^5$ contains four or more hetero atoms. The group represented by formula (6) may be directly bonded to $Ar^3$, or may be bonded to $Ar^3$ via a divalent alkylene group having about 1 to 50 carbon atoms, which may have a substituent group, such as a methylene group, an ethylene group, a propylene group, a butylene group, a pentylene group, a hexylene group, a nonylene group, a dodecylene group, a cyclopropylene group, a cyclobutylene group, a cyclopentylene group, a cyclohexylene group, a cyclononylene group, a cyclododecylene group, a norbornylene group or an adamantylene group; an oxyalkylene group having about 1 to 50 carbon atoms, which may have a substituent group, such as an oxymethylene group, an oxyethylene group, an oxypropylene group, an oxybutylene group, an oxypentylene group, an oxyhexylene group, an oxynonylene group, an oxydodecylene, a cyclopropyleneoxy group, a cyclobutyleneoxy group, a cyclopentyleneoxy group, a cyclohexyleneoxy group, a cyclononyleneoxy group, a cyclododecyleneoxy group, a norbornyleneoxy group or an adamantyleneoxy group; an imino group which may have a substituent group; a silylene group which may have a substituent group; an ethenylene group or ethynylene group which may have a substituent group; a methanetriyl group which may have a substituent group; or a hetero atom such as an oxygen atom, a nitrogen atom or a sulfur atom. In one aspect, $R^5$ is a group represented by formula (6).

Examples of the hetero atom contained in $R^5$ include oxygen, sulfur, selenium, tellurium, nitrogen, phosphorus, antimony, arsenic and boron. $R^5$ may have the same kind of two or more hetero atoms, and may have two or more kinds of hetero atoms. From the viewpoint of ease of synthesis of a monomer as a raw material, the hetero atom is preferably oxygen, sulfur, nitrogen, phosphorus or boron. From the viewpoint of solubility of the conjugated polymer compound, the number of hetero atoms is preferably from 4 to 30, and more preferably from 6 to 20.

n5 represents an integer of 1 or more. From the viewpoint of solubility of the conjugated polymer compound, n5 is preferably from 2 to 4, and more preferably from 2 to 3.

$Ar^3$ represents a divalent aromatic group which may have a substituent group other than $R^5$.

From the viewpoint of ease of synthesis of a raw monomer, the divalent aromatic group represented by $Ar^3$ is preferably a group in which two hydrogen atoms are removed from a ring represented by formulas 1 to 15, formulas 27 to 30, formulas 38 to 40 or formula 42, more preferably a group in which two hydrogen atoms are removed from a ring represented by formulas 1 to 6, formula 8, formula 14, formula 27, formula 28, formula 38 or formula 42, and still more preferably a group in which two hydrogen atoms are removed from a ring represented by formula 1, formula 38 or formula 42.

Examples of the substituent group other than $R^5$, which may be contained in the divalent aromatic group represented by $Ar^3$ include the same substituent group as those other than $R^1$, which may be contained in the $Ar^1$. When a plurality of substituent groups are present, they may be the same or different.

$R^5$ is a substituent group represented by formula (6):

$$-R^6\{-(CH_2)_{n6}-Y^3\}_{m1} \quad (6)$$

wherein $R^6$ represents a monovalent aromatic group, n6 represents an integer of 0 or more, and m1 represents an integer of 1 or more. $Y^3$ represents —CN, or groups represented by formulas (7) to (14). When a plurality of $Y^3$s are present, they may be the same or different. When a plurality of n6s are present, they may be the same or different. The group represented by formula (6) contains four or more hetero atoms.

$$-O-(R'O)_{a4}-R'' \quad (7)$$

$$-S-(R'S)_{a3}-R'' \quad (8)$$

$$-C(=O)-(R'-C(=O))_{a3}-R'' \quad (9)$$

$$-C(=S)-(R'-C(=S))_{a3}-R'' \quad (10)$$

$$-N(R')-(N(R'))_{a3}-R'' \quad (11)$$

$$-C(=O)O-(R'-C(=O)O)_{a3}-R'' \quad (12)$$

$$-C(=O)-O-(R'O)_{a3}-R'' \quad (13)$$

$$-NHC(=O)-(R'NHC(=O))_{a3}-R'' \quad (14)$$

In formulas (7) to (14), R' represents a divalent hydrocarbon group which may have a substituent group, R" represents a hydrogen atom, a monovalent hydrocarbon group which may have a substituent group, —COOH, —SO$_3$H, —OH, —SH, —NR$^c{}_2$, —CN or —C(=O)NR$^c{}_2$, a3 represents an integer of 0 or more and a4 represents an integer of 3 to 20. $R^c$ represents an alkyl group having 1 to 30 carbon atoms, which may have a substituent group, or an aryl group having 6 to 50 carbon atoms, which may have a substituent group. When a plurality of R's are present, they may be the same or different. In one aspect, $R^6$ is a group represented by formula (6).

In formula (6), n6 represents an integer of 0 or more, preferably from 0 to 20, and more preferably from 0 to 8.

In formula (6), m1 is preferably from 1 to 4, and more preferably from 1 to 3, from the viewpoint of solubility of the conjugated polymer compound.

In formula (6), $R^6$ represents a monovalent aromatic group having m1 substituent groups represented by $\{-(CH_2)_{n6}-Y^3\}$. Examples of the monovalent aromatic group represented by $R^6$ include a group in which one hydrogen atom is removed from a monocyclic aromatic ring, a monovalent group in which one hydrogen atom is removed from a condensed polycyclic aromatic ring, and a group in which one hydrogen atom is removed from a polycyclic ring in which two or more aromatic rings are linked by a single bond, an ethenylene group or an ethynylene group, and a group in which one hydrogen atom is removed from a bridged polycyclic aromatic ring. Examples of the monocyclic aromatic ring, the condensed polycyclic aromatic ring, the polycyclic ring linked by an ethenylene group or an ethynylene group, and the bridged polycyclic aromatic ring include the same compounds as those of the monocyclic aromatic ring, the condensed polycyclic aromatic ring, the polycyclic ring linked by an ethenylene group or an ethynylene group, and the bridged polycyclic aromatic ring used in the description of the $Ar^1$. From the viewpoint of synthesis of a monomer as a raw material, a phenyl group, a pyridyl group, a pyridazyl group, a pyrimidinyl group, a pyrazyl group, a triazyl group, a naphthyl group, an anthracenyl group, a quinolyl group, an isoquinolyl group, a quinoxalinyl group and a biphenyl group are preferable.

$R^6$ may have a substituent group other than the substituent group represented by $\{-(CH_2)_{n6}-Y^3\}$. Specific examples of the substituent group include the same substituent group as those other than $R^1$, which may be contained in the $Ar^1$. When a plurality of the substituent groups are present, they may be the same or different.

In formulas (7) to (14), examples of the divalent hydrocarbon group represented by R' include a divalent saturated hydrocarbon group having about 1 to 50 carbon atoms, such as a methylene group, an ethylene group, a 1,2-propylene group, a 1,3-propylene group, a 1,2-butylene group, a 1,3-butylene group, a 1,4-butylene group, a 1,5-pentylene group, a 1,6-hexylene group, a 1,9-nonylene group or a 1,12-dodecylene group; a divalent unsaturated hydrocarbon group having about 2 to 50 carbon atoms, such as an ethenylene group, a propenylene group, a 3-butenylene group, a 2-pentenylene group, a 2-hexenylene group, a 2-nonenylene group or a 2-dodecenylene group; divalent cyclic saturated hydrocarbon group having about 3 to 50 carbon atoms, such as a cyclopropylene group, a cyclobutylene group, a cyclopentylene group, a cyclohexylene group, a cyclononylene group, a cyclododecylene group, a norbornylene group or an adamantylene group; an alkenylene group having about 2 to 50 carbon atoms, such as an ethenylene group, a propenylene group, a 3-butenylene group, a 2-butenylene group, a 2-pentenylene group, a 2-hexenylene group, a 2-nonenylene group or a 2-dodecenylene group; an arylene group having about 6 to 50 carbon atom, such as a 1,3-phenylene group, a 1,4-phenylene, a 1,4-naphthylene group, a 1,5-naphthylene group, a 2,6-naphthylene group or a biphenyl-4,4'-diyl group; and an alkyleneoxy group having about 1 to 50 carbon atoms, such as a methyleneoxy group, an ethyleneoxy group, a propyleneoxy group, a butyleneoxy group, a pentyleneoxy group or a hexyleneoxy group.

R' may have a substituent group, and examples of the substituent group include the same substituent group as those other than $R^1$, which may be contained in the $Ar^1$. When a plurality of substituent groups are present, they may be the same or different.

In formulas (7) to (14), examples of the monovalent hydrocarbon group represented by R'' include an alkyl group having 1 to 20 carbon atoms, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a nonyl group, a decyl group or a lauryl group; and an aryl group having 6 to 30 carbon atoms, such as a phenyl group, a 1-naphthyl group, a 2-naphthyl group, a 1-anthracenyl group, a 2-anthracenyl group or a 9-anthracenyl group. From the viewpoint of solubility, a methyl group, an ethyl group, a phenyl group, a 1-naphthyl group or a 2-naphthyl group is preferable. R'' may have a substituent group and examples of the substituent group include the same substituent group as those other than $R^1$, which may be contained in the $Ar^1$. When a plurality of substituent groups are present, they may be the same or different.

In formulas (7) to (14), $R^c$ is preferably a methyl group, an ethyl group, a phenyl group, a 1-naphthyl group or a 2-naphthyl group from the viewpoint of solubility of the conjugated polymer compound.

In formula (7), a4 represents an integer of 3 to 20, and is preferably from 3 to 10. In formulas (8) to (14), a3 represents an integer of 0 or more. In formula (8), a3 is preferably from 0 to 30, and more preferably from 3 to 20. In formulas (9) to (12), a3 is preferably from 0 to 10, and more preferably from 0 to 5. In formula (13), a3 is preferably from 0 to 20, and more preferably from 3 to 20. In formula (14), a3 is preferably from 0 to 20, and more preferably from 0 to 10.

From the viewpoint of ease of synthesis of a monomer as a raw material, $Y^3$ is preferably —CN, a group represented by formula (7), a group represented by formula (8), a group represented by formula (12) or a group represented by formula (13), and more preferably a group represented by formula (7), a group represented by formula (8) or a group represented by formula (13). Still more preferable group is exemplified by the following groups.

—O—(CH$_2$O)$_4$Me     —O—(CH$_2$O)$_5$Me

—O—(CH$_2$O)$_6$Me     —O—(CH$_2$O)$_7$Me

—O—(CH$_2$O)$_4$H      —O—(CH$_2$O)$_5$H

—O—(CH$_2$O)$_6$H      —O—(CH$_2$O)$_7$H

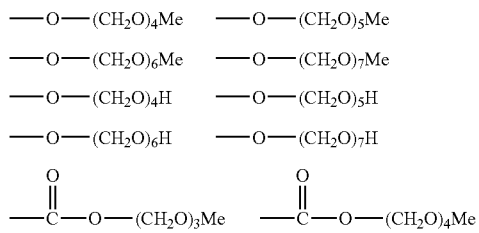

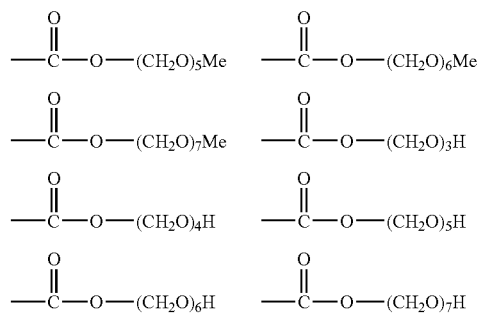

Among the repeating units represented by formula (5), a repeating unit in which Ar2 is a group in which two hydrogen atoms are removed from a ring represented by formula 38 is preferable, and a repeating unit represented by the following formula:

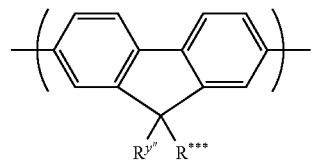

wherein $R^{y''}$ represents a substituent group having a group represented by formula (4), and R*** represents $R^{y''}$, a hydrogen atom, an alkyl group or an aryl group, is more preferable.

From the viewpoint of electron transporting property, the repeating unit represented by formula (5) is preferably a repeating unit represented by formula (17):

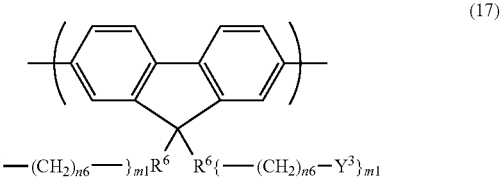

(17)

wherein n6, m1, $R^6$ and $Y^3$ have the same meanings as defined above, and a plurality of n6s, m1s, $R^6$s and $Y^3$s may be the same or different.

Specific examples of the repeating unit represented by formula (17) include the following repeating units.

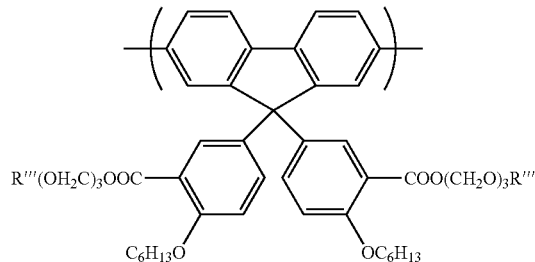

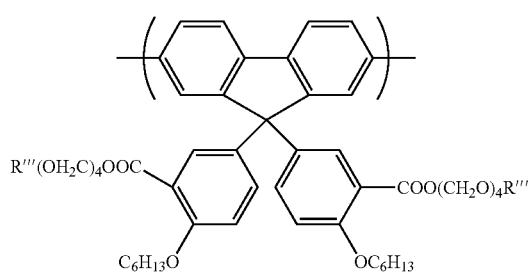

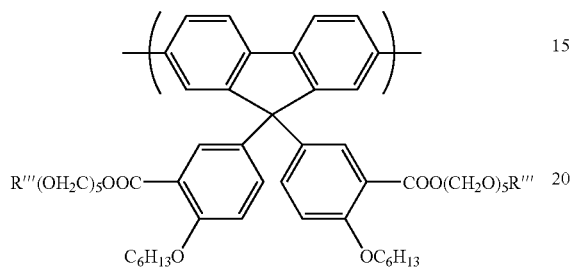

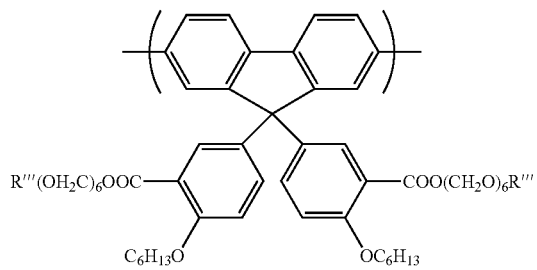

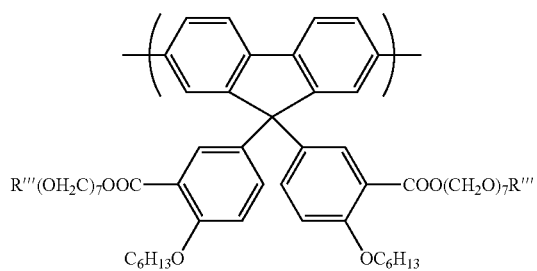

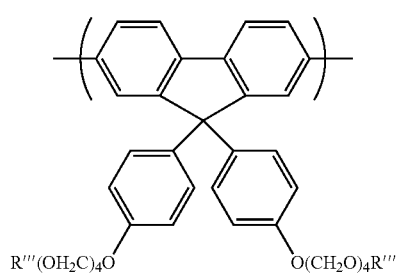

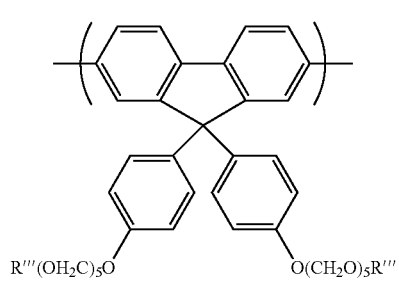

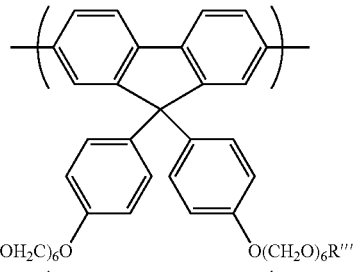

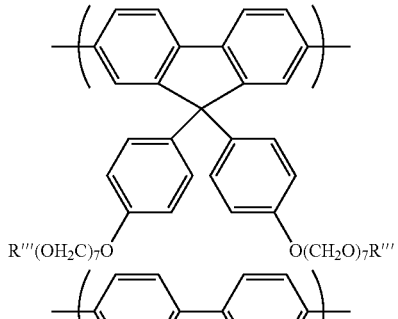

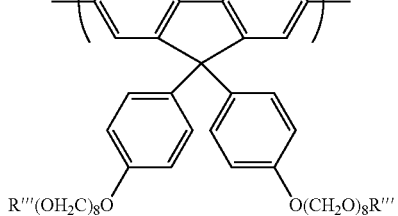

wherein R''' represents a hydrogen atom or a methyl group.

The conjugated polymer compound used in the present invention may further contain a repeating unit represented by formula (20):

(20)

wherein $Ar^4$ represents a divalent aromatic group which may have a substituent group, or a divalent aromatic amine residue which may have a substituent group, X represents an imino group which may have a substituent group, a silylene group which may have a substituent group, or an ethenylene group or ethynylene group which may have a substituent group, $m^2$ and $m^3$ each independently represents 0 or 1, and at least one of $m^2$ and $m^3$ is 1.

Examples of the divalent aromatic group represented by $Ar^4$ in formula (20) include a divalent aromatic hydrocarbon group, and a divalent aromatic heterocyclic group. Examples of the divalent aromatic group include a divalent group in which two hydrogen atoms are removed from a monocyclic aromatic ring such as a benzene ring, a pyridine ring, a 1,2-diazine ring, a 1,3-diazine ring, a 1,4-diazine ring, a 1,3,5-triazine ring, a furan ring, a pyrrole ring, a thiophene ring, a pyrazole ring, an imidazole ring, an oxazole ring, an oxadiazole ring or an azadiazole ring, a divalent group in which two hydrogen atoms are removed from a condensed polycyclic aromatic ring in which two or more rings selected independently from the monocyclic aromatic ring are condensed, a divalent group in which two hydrogen atoms are removed from a polycyclic ring in which two or more aromatic rings are linked by a single bond, an ethenylene group or an ethynylene group, and a divalent group in which two hydrogen atoms are removed from a bridged polycyclic aromatic ring having a structure that two aromatic rings are bridged by a divalent group such as a methylene group, an ethylene group, a carbonyl group or an imino group.

In the condensed polycyclic aromatic ring, the number of monocyclic aromatic rings to be condensed is preferably from 2 to 4, more preferably from 2 to 3, and still more preferably 2, from the viewpoint of solubility of the conjugated polymer compound. In the polycyclic ring in which two or more aromatic rings are linked by a single bond, an ethenylene group or an ethynylene group, the number of aromatic rings to be linked is preferably from 2 to 4, more preferably from 2 to 3, and still more preferably 2, from the viewpoint of solubility. In the bridged polycyclic aromatic ring, the number of aromatic rings to be linked is preferably from 2 to 4, more preferably from 2 to 3, and still more preferably 2, from the viewpoint of solubility of the conjugated polymer compound.

The monocyclic aromatic ring includes, for example, the following rings.

The condensed polycyclic aromatic ring includes, for example, the following rings.

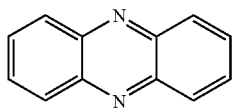
69
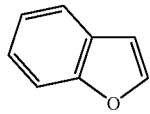
70
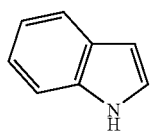
71
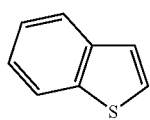
72
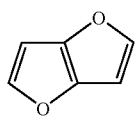
73
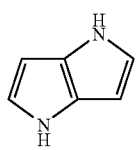
74
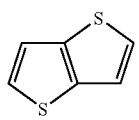
75
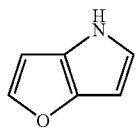
76
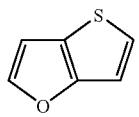
77
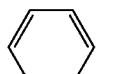
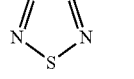
78
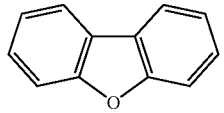
79
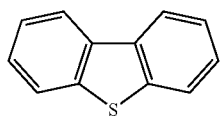
80
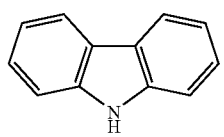
81
The polycyclic ring in which two or more aromatic rings are linked by a single bond, an ethenylene group or an ethynylene group includes, for example, the following rings.
82
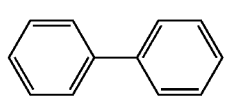
83
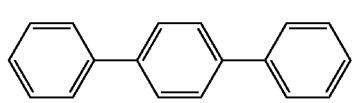
84
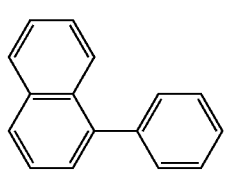
85
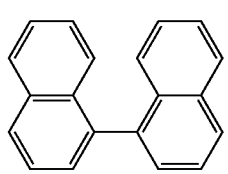
86
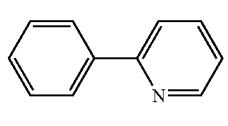
87
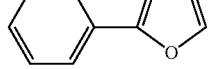
88
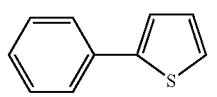
89
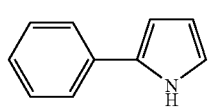
90
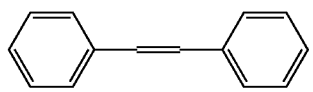
91
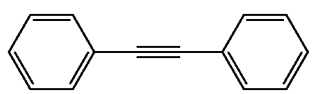
92
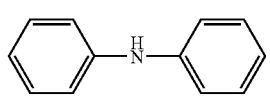
The bridged polycyclic aromatic ring includes, for example, the following rings.

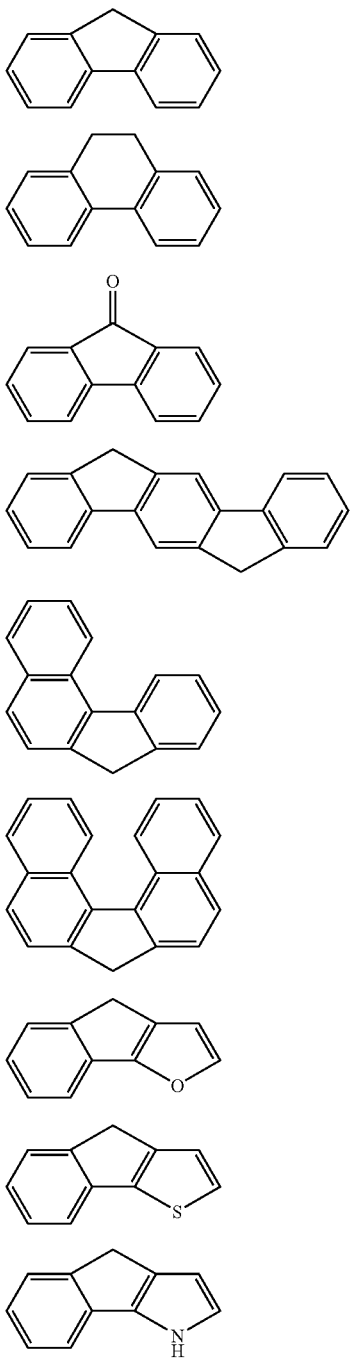

From the viewpoint of electron and/or hole accepting properties of the conjugated polymer compound, the divalent aromatic group represented by Ar$^4$ is preferably a divalent group in which two hydrogen atoms are removed from a ring represented by formulas 46 to 61, formulas 62 to 72, formulas 78 to 81, formula 92, formula 93, formula 94 or formula 97, and more preferably a divalent group in which two hydrogen atoms are removed from a ring represented by formulas 46 to 51, formula 60, formula 61, formula 78, formula 81, formula 92, formula 93 or formula 97.

The above divalent aromatic group may have a substituent group other than the substituent groups represented by R$^1$, R$^2$ and R$^3$. Examples of the substituent group include the same substituent groups as those other than R$^1$ which may be contained in the Ar$^1$.

The divalent aromatic group amine residue represented by Ar$^4$ in formula (20) includes a group represented by formula (21):

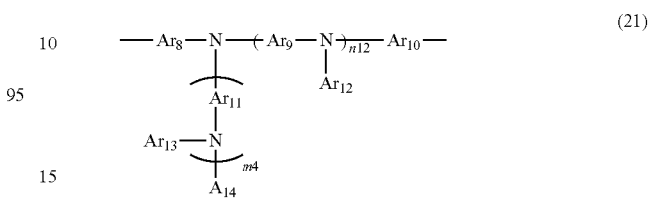

wherein Ar$^8$, Ar$^8$, Ar$^{10}$ and Ar$^{11}$ each independently represents an arylene group which may have a substituent group, or a divalent heterocyclic group which may have a substituent group, Ar$^{12}$, Ar$^{13}$ and Ar$^{14}$ represent an aryl group which may have a substituent group, or a monovalent heterocyclic group which may have a substituent group, and n12 and m4 each independently represents 0 or 1.

Examples of the substituent group which may be contained in the arylene group, the aryl group, the divalent heterocyclic group and the monovalent heterocyclic group include a halogen atom, an alkyl group, an alkyloxy group, an alkylthio group, an aryl group, an aryloxy group, an arylthio group, an arylalkyl group, an arylalkyloxy group, an arylalkylthio group, an alkenyl group, an alkynyl group, an arylalkenyl group, an arylalkynyl group, an acyl group, an acyloxy group, an amide group, an acid imide group, an imine residue, a substituted amino group, a substituted silyl group, a substituted silyloxy group, a substituted silylthio group, a substituted silylamino group, a cyano group, a nitro group, a monovalent heterocyclic group, a heteroaryloxy group, a heteroarylthio group, an alkyloxycarbonyl group, an aryloxycarbonyl group, an arylalkyloxycarbonyl group, an heteroaryloxycarbonyl group and a carboxyl group. The substituent group may be a crosslinking group such as a vinyl group, an acetylene group, a butenyl group, an acryl group, an acrylate group, an acrylamide group, a methacryl group, a methacrylate group, a methacrylamide group, a vinylether group, a vinylamino group, a silanol group, a group having a small-membered ring (for example, a cyclopropyl group, a cyclobutyl group, an epoxy group, an oxetane group, a diketene group and an episulfide group), a lactone group, a lactam group, or a group having a structure of a siloxane derivative.

When n12 is 0, a carbon atom in Ar$^8$ and a carbon atom in Ar$^{10}$ may be directly bonded, or may be bonded via a divalent group such as —O— or —S—. The arylene group capable of forming the above bond includes a phenylene group, and the divalent heterocyclic group includes a pyridinediyl group.

The conjugated polymer compound containing a divalent aromatic amine residue as a repeating unit may further contain the other repeating unit. Examples of the other repeating unit include an arylene group such as a phenylene group or a fluorenediyl group. Among these conjugated polymer compounds, those having a crosslinking group are more preferable.

The divalent aromatic amine residue represented by formula (21) includes, for example, groups in which two hydrogen atoms are removed from aromatic amines represented by following general formulas 102 to 111.

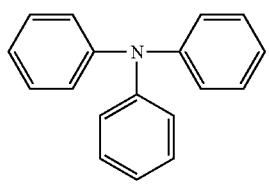

102

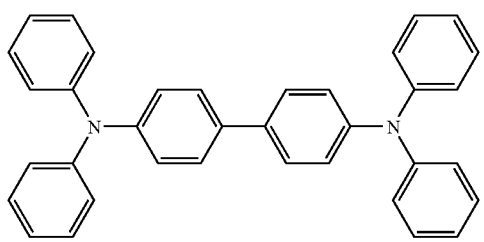

103

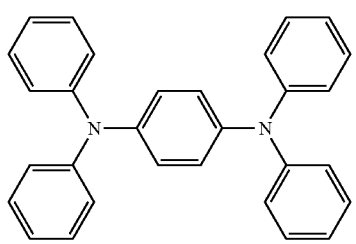

104

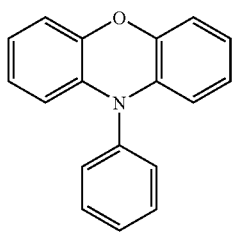

105

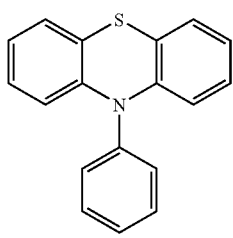

106

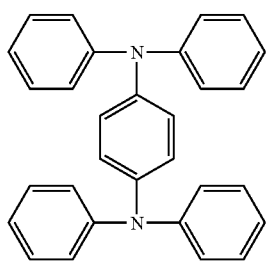

107

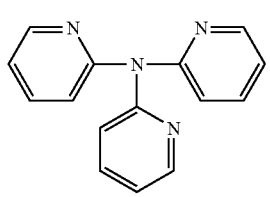

108

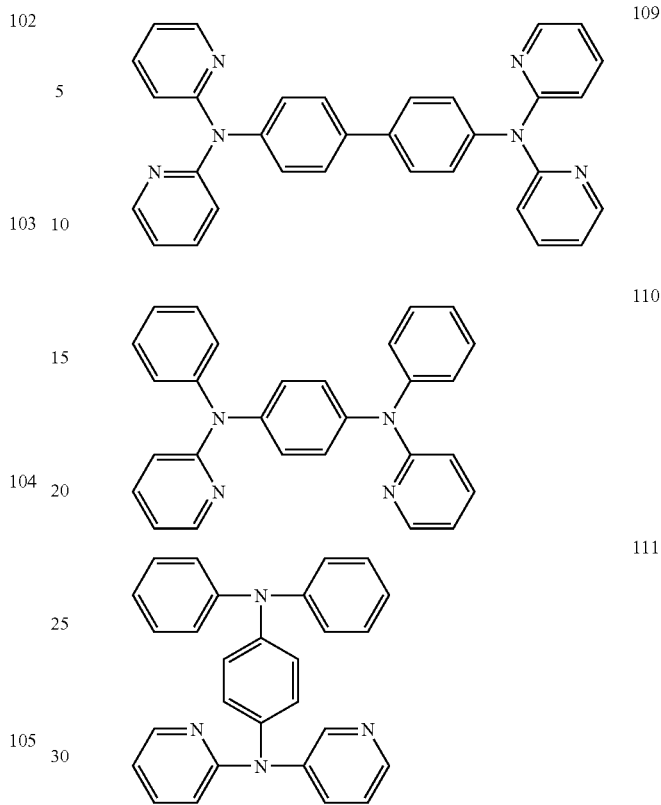

The aromatic amines represented by formulas 102 to 111 may have a substituent group and examples of the substituent group include the same substituent group as those other than $R^1$ which may be contained in the $Ar^1$. When a plurality of substituent groups are present, they may be the same or different.

In formula (20), X represents an imino group which may have a substituent group, a silylene group which may have a substituent group, or an ethenylene group or ethynylene group which may have a substituent group. Examples of the substituent group which may be contained in the imino group, the silyl group or the ethenylene group include an alkyl group having 1 to 20 carbon atoms, such as a methyl group, an ethyl group, a propyl group, an isopropyl group, a butyl group, an isobutyl group, a s-butyl group, a t-butyl group, a pentyl group, a hexyl group, a cyclohexyl group, a heptyl group, an octyl group, a 2-ethylhexyl group, a nonyl group, a decyl group, a 3,7-dimethyloctyl group or a lauryl group; and an aryl group having 6 to 30 carbon atoms, such as a phenyl group, a 1-naphthyl group, a 2-naphthyl group, a 1-anthracenyl group, a 2-anthracenyl group or a 9-anthracenyl group. When a plurality of substituent groups are contained, they may be the same or different.

From the viewpoint of stability against air, humidity or heat of the conjugated polymer compound, X is preferably an imino group, an ethenylene group or an ethynylene group.

From the viewpoint of electron and/or hole accepting properties of the conjugated polymer compound, m2 is preferably 1 and m3 is preferably 0.

From the viewpoint of electron accepting property of the conjugated polymer compound, the repeating unit represented by formula (20) is preferably a repeating unit represented by formula (22):

(22)

wherein $Ar^5$ represents a pyridinediyl group which may have a substituent group, a pyrazinediyl group which may have a substituent group, a pyrimidinediyl group which may have a substituent group, a pyridazinediyl group which may have a substituent group, or a triazinediyl group which may have a substituent group.

Examples of the substituent group which may be contained in the pyridinediyl group include the same substituent groups as those which may be contained in the $Ar^4$. When a plurality of substituent groups are present, they may be the same or different. Examples of the substituent group which may be contained in the pyrazinediyl group include the same substituent groups as those which may be contained in the $Ar^4$. When a plurality of substituent groups are present, they may be the same or different. Examples of the substituent group which may be contained in the pyrimidinediyl group include the same substituent groups as those which may be contained in the $Ar^4$. When a plurality of substituent groups are present, they may be the same or different. Examples of the substituent group which may be contained in the pyridazinediyl group include the same substituent groups as those which may be contained in the $Ar^4$. When a plurality of substituent groups are present, they may be the same or different. Examples of the substituent group which may be contained in the triazinediyl group include the same substituent groups as those which may be contained in the $Ar^4$. When a plurality of the substituent groups are present, they may be the same or different.

From the viewpoint of efficiency of the electroluminescence device, a conjugated polymer compound containing only a repeating unit represented by formula (1), a conjugated polymer compound containing only a repeating unit represented by formula (3), a conjugated polymer compound containing a repeating unit represented by formula (1) and a repeating unit represented by formula (5), a conjugated polymer compound containing a repeating unit represented by formula (3) and a repeating unit represented by formula (5) are preferable, and a conjugated polymer compound containing only a repeating unit represented by formula (1), a conjugated polymer compound containing only a repeating unit represented by formula (3) and a conjugated polymer compound containing a repeating unit represented by formula (3) and a repeating unit represented by formula (5) are more preferable.

The total number of a repeating unit represented by formula (1), a repeating unit represented by formula (3) and a repeating unit represented by formula (5) contained in the conjugated polymer compound used in the present invention is preferably from 15 to 100 mol when the total number of all repeating units contained in the conjugated polymer compound is assumed to be 100 mol, and more preferably from 50 to 100 mol from the viewpoint of efficiency of the electroluminescence device.

From the viewpoint of film forming property due to coating of the conjugated polymer compound, the polystyrene equivalent number average molecular weight of the conjugated polymer compound used in the present invention is preferably from $5 \times 10^3$ to $1 \times 10^8$, more preferably from $5 \times 10^3$ to $1 \times 10^7$, and still more preferably from $1 \times 10^4$ to $1 \times 10^7$. The polystyrene equivalent weight average molecular weight is preferably from $5 \times 10^3$ to $1 \times 10^8$, and still more preferably from $5 \times 10^3$ to $1 \times 10^7$.

The polystyrene equivalent number average molecular weight and weight average molecular weight of the conjugated polymer compound used in the present invention can be determined, for example, by gel permeation chromatography (GPC).

From the viewpoint of an improvement in electron and/or hole accepting properties of the conjugated polymer compound, orbital energy of a lowest unoccupied molecular orbital (LUMO) of the conjugated polymer compound used in the present invention is preferably −5.0 eV or more and −2.0 eV or less, and more preferably −4.5 eV or more and −2.0 eV or less. Orbital energy of a highest occupied molecular orbital (HOMO) is preferably −6.0 eV or more and −3.0 eV or less, and more preferably −5.5 eV or more and −3.0 eV or less.

As another embodiment of the present invention, a layered structure using a conjugated polymer compound insoluble in a solvent having a solubility parameter of less than 9.3 is exemplified and is preferably a layered structure using a conjugated polymer compound insoluble in a solvent having a solubility parameter of less than 9.3 and water.

As a value of the solubility parameter, the value described in "Solvent Handbook" (14th ed., Kodansha Ltd., published in 1996), written by shozo Asahara.

The phrase "a conjugated polymer compound is insoluble in a solvent" means that, when 10 mg of a conjugated polymer compound is mixed with 1 mL of a solvent, followed by stirring at 20° C., 5 mg or more of the conjugated polymer compound remains without being dissolved.

The conjugated polymer compound soluble in a solvent having a solubility parameter of less than 9.3 is not preferable since the solvent may dissolve an organic layer which is contacted with a layer containing the conjugated polymer compound during coating. When the conjugated polymer compound is soluble in water, it is not preferred since hygroscopic property of the layer containing the conjugated polymer compound tends to be higher.

Examples of the solvent having a solubility parameter of less than 9.3 (the value in each parenthesis denotes a value of a solubility parameter of each solvent) include isopentyl alcohol (9.2), chloroform (9.1), cyclohexane (8.2), hexane (7.3), diethylether (7.4), isooctane (7.0), carbon tetrachloride (8.6), tetrahydrofuran (9.1), toluene (8.9) or a mixed solvent. The solvent can be used alone or in combination as long as the solubility parameter is 9.3 or more and less than 20. When a solvent 1 is mixed with a solvent 2, the solubility parameter ($\delta_m$) is determined by the equation: $\delta_m = \delta_1 \times \phi_1 + \delta_2 \times \phi_2$ ($\delta_1$ denotes a solubility parameter of a solvent 1, $\phi_1$ denotes a volume fraction of a solvent 1, $\delta_2$ is a solubility parameter of a solvent 2, and $\phi_2$ denotes a volume fraction of a solvent 2).

The conjugated polymer compound insoluble in the solvent having a solubility parameter of less than 9.3 includes, for example, the following conjugated polymer compounds.

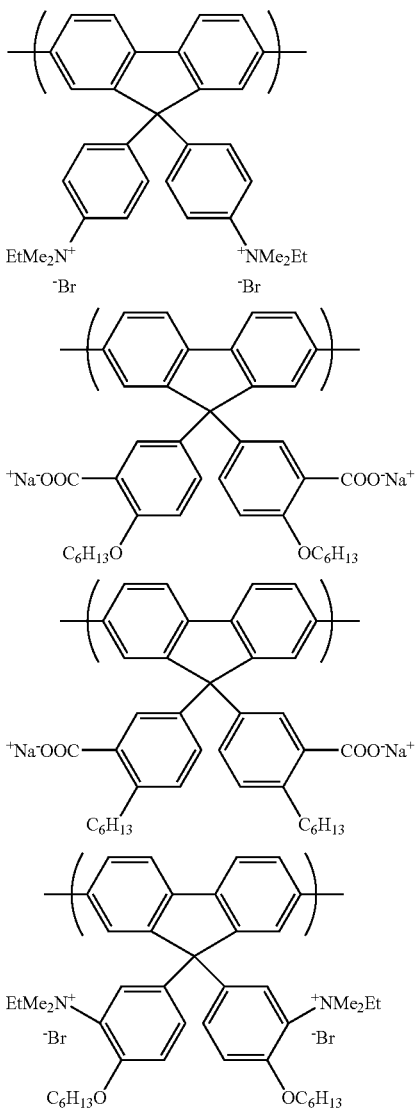

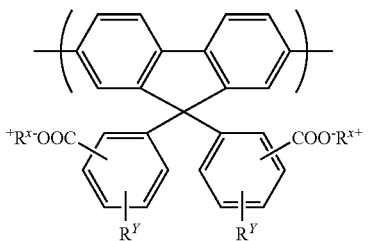

Preferred one aspect of the conjugated polymer compound used in the present invention is a conjugated polymer compound containing a repeating unit represented by formula (30):

(30)

wherein $R^x$ represents an alkali metal, and $R^Y$ represents an alkyl group or an alkoxy group.

The repeating unit represented by formula (30) is preferably a repeating unit represented by formula (31):

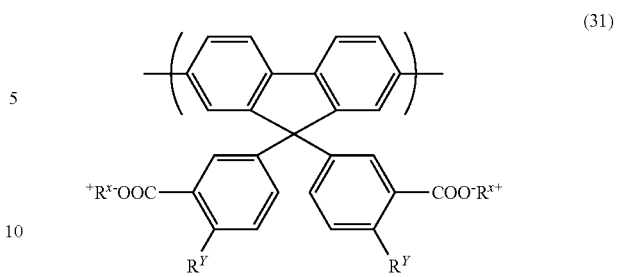

(31)

wherein $R^x$ and $R^Y$ have the same meanings as defined above.

Preferred another aspect of the conjugated polymer compound used in the present invention is a conjugated polymer compound containing a repeating unit represented by formula (30) and a repeating unit which is an arylene group. The arylene group is preferably a phenylene group or a fluorene-diyl group.

A method of producing a conjugated polymer compound used in the present invention will be described below. Suitable method of producing a conjugated polymer compound used in the present invention includes, for example, a method wherein a compound represented by general formula (23) shown below is appropriately selected and used as one of raw materials and, particularly, a compound in which $-A_a-$ in general formula (23) is each of repeating units represented by formulas (1), (3), (5) and (15) to (19) is contained as an essential component, and then this is subjected to condensation polymerization:

$$Y^4-A_a-Y^5 \qquad (23)$$

wherein $Y^4$ and $Y^5$ each independently represents a group involved in condensation polymerization.

When the repeating unit represented by $-A_a-$ in general formula (23) and a repeating unit other than $-A_a-$ are contained in the conjugated polymer compound used in the present invention, a compound having two groups involved in condensation polymerization, to be a repeating unit other than $-A_a-$ may be used and subjected to condensation polymerization together with the compound represented by formula (23).

As the compound having two groups involved in condensation polymerization, and used to contain the other repeating unit, the compound represented by formula (24) is exemplified. In such a manner, it is possible to produce a conjugated polymer further containing a repeating unit represented by $-A_b-$ according to the present invention by condensation polymerization of the compound represented by formula (24), in addition to the compound represented by $Y^4-A_a-Y^5$.

$$Y^9-A_b-Y^{10} \qquad (24)$$

wherein $A_b$ is a repeating unit represented by general formula (20) or a repeating unit represented by general formula (22), and $Y^9$ and $Y^{10}$ each independently represents a group involved in condensation polymerization.

Examples of the group ($Y^4$, $Y^5$, $Y^9$ and $Y^{10}$) involved in condensation polymerization include a halogen atom, an alkyl sulfonate group, an aryl sulfonate group, an arylalkyl sulfonate group, a boric acid ester residue, a sulfoniummethyl group, a phosphoniummethyl group, an phosphonatemethyl group, an monohalogenated methyl group, $-B(OH)_2$, a formyl group, a cyano group and a vinyl group.

Examples of the halogen atom which can be selected as the group involved in condensation polymerization include a fluorine atom, a chlorine atom, a bromine atom or an iodine atom.

Examples of the alkyl sulfonate group which can be selected as the group involved in condensation polymerization include a methanesulfonate group, an ethanesulfonate group and a trifluoromethanesulfonate group. Examples of the aryl sulfonate group include a benzenesulfonate group and a p-toluenesulfonate group, and examples of the aryl sulfonate group include a benzylsulfonate group.

The boric acid ester residue which can be selected as the group involved in condensation polymerization is exemplified by the group of the following formulas.

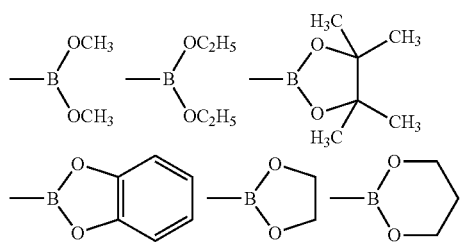

Furthermore, the sulfoniummethyl group which can be selected as the group involved in condensation polymerization is exemplified by the group of the following formulas:

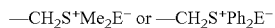

E represents a halogen atom and Ph represents a phenyl group.

The phosphoniummethyl group which can be selected as the group involved in condensation polymerization is exemplified by the group of the following formula:

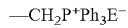

wherein E represents a halogen atom.

The phosphonatemethyl group which can be selected as the group involved in condensation polymerization is exemplified by the group of the following formula:

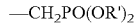

wherein R' represents an alkyl group, an aryl group or an arylalkyl group.

Furthermore, examples of the monohalogenated methyl group which can be selected as the group involved in condensation polymerization include a fluorinated methyl group, a chlorinated methyl group, a brominated methyl group or an iodinated methyl group.

Furthermore, the group suited for use as the group involved in condensation polymerization varies depending on the kind of the polymerization reaction and it is impossible to say unconditionally. For example, when a zero-valent nickel complex is used, like the Yamamoto coupling reaction, the group is exemplified by a halogen atom, an alkyl sulfonate group, an aryl sulfonate group and an arylalkyl sulfonate group. When a nickel catalyst or a palladium catalyst is used, like the Suzuki coupling reaction, the group is exemplified by an alkyl sulfonate group, a halogen atom, a boric acid ester residue and —B(OH)$_2$. When an oxidizing agent is used or electrochemically oxidative polymerization is conducted, a hydrogen atom is shown.

When the conjugated polymer compound used in the present invention is produced, for example, it is possible to employ a polymerization method in which a compound (monomer) having a plurality of groups involved in condensation polymerization represented by the general formula (23) or (24) is optionally dissolved in an organic solvent and the obtained solution is reacted at a temperature of a melting point or higher and a boiling point or lower of the organic solvent using appropriately an alkali or a proper catalyst. It is possible to appropriately employ, as such a polymerization method, known methods, for example, described in "Organic Reactions", Vol. 14, pp. 270-490, John Wiley&Sons, Inc., 1965, "Organic Syntheses", Collective Volume VI, pages 407-411, John Wiley&Sons, Inc., 1988, Chem. Rev., Vol. 95, page 2457 (1995), J. Organomet. Chem., Vol. 576, page 147 (1999), and Macromol. Chem., Macromol. Symp., Vol. 12, page 229 (1987).

When the conjugated polymer compound used in the present invention is produced, known condensation polymerization reaction may be appropriately employed according to the group involved in condensation polymerization. Such a polymerization method includes, for example, a method of polymerizing a corresponding monomer by the Suzuki coupling reaction, a method of polymerizing by the Grignard reaction, a method of polymerizing by a Ni(0) complex, a method of polymerizing by an oxidizing agent such as FeCl$_3$, a method of electrochemically oxidative polymerization, or a method by decomposition of an intermediate polymer having a proper leaving group. Among these polymerization reactions, a method of polymerizing by the Suzuki coupling reaction, a method of polymerizing by the Grignard reaction and a method of polymerizing by a nickel zero-valent complex are preferable since it is easy to control the structure of the obtained polymer compound.

As one aspect of a preferred method of producing a conjugated polymer compound used in the present invention, there is exemplified a method of producing a polymer compound, in which each of groups ($Y^4, Y^5, Y^9$ and $Y^{10}$) involved in condensation polymerization is independently selected from a halogen atom, an alkyl sulfonate group, an aryl sulfonate group or an arylalkyl sulfonate group, and condensation polymerization is conducted in the presence of a nickel zero-valent complex. The raw compound used in these methods includes, for example, a dihalogenated compound, a bis(alkyl sulfonate) compound, a bis(aryl sulfonate) compound, a bis(arylalkyl sulfonate) compound, a halogen-alkyl sulfonate compound, a halogen-aryl sulfonate compound, a halogen-arylalkyl sulfonate compound, an alkyl sulfonate-aryl sulfonate compound, an alkyl sulfonate-arylalkyl sulfonate compound and an aryl sulfonate-arylalkyl sulfonate compound.

Another aspect of the preferable method of producing a conjugated polymer compound is exemplified by a method of producing a conjugated polymer, in which each of groups ($Y^4, Y^5, Y^9$ and $Y^{10}$) involved in condensation polymerization is independently selected from a halogen atom, an alkyl sulfonate group, an aryl sulfonate group, an arylalkyl sulfonate group, a boric acid group, or a boric acid ester residue, and a ratio of the total mols (J) of a halogen atom, an alkyl sulfonate group, an aryl sulfonate group and an arylalkyl sulfonate group contained in all raw compounds to the total mols (K) of a boric acid group (—B(OH)$_2$) and a boric acid ester residue is substantially 1 (usually, K/J is within a range from 0.7 to 1.2), and also condensation polymerization is conducted using a nickel catalyst or a palladium catalyst.

Examples of a combination of specific raw compounds in the case of employing the method of producing a conjugated polymer compound include a combination of only a dihalogenated compound, a combination of only a bis(alkyl sulfonate) compound, a combination of either a bis(aryl sulfonate) compound or a bis(arylalkyl sulfonate) compound and either a diboric acid compound or a diboric acid ester compound. From the viewpoint of production of a conjugated polymer with controlled sequence, it is preferred to use a halogen-boric acid compound, a halogen-boric acid ester compound, an alkyl sulfonate-boric acid compound, an alkyl sulfonate-boric acid ester compound, an aryl sulfonate-boric acid compound, an aryl sulfonate-boric acid ester compound, an arylalkyl sulfonate-boric acid compound and an arylalkyl sulfonate-boric acid ester compound.

Although the organic solvent varies depending on the compound and reaction to be used, it is preferred to use those subjected sufficiently to a deoxidation treatment so as to inhibit the side reaction. In the production of a polymer compound, the reaction is preferably allowed to proceed using such an organic solvent under an inert atmosphere. In the organic solvent, a dehydration treatment is preferably conducted similarly to the deoxidation treatment. In the case of the reaction in two-phase system with water like the Suzuki coupling reaction, this shall not apply.

Examples of the organic solvent include saturated hydrocarbons such as pentane, hexane, heptane, octane and cyclohexane; unsaturated hydrocarbons such as benzene, toluene, ethylbenzene and xylene; halogenated saturated hydrocarbons such as carbon tetrachloride, chloroform, dichloromethane, chlorobutane, bromobutane, chloropentane, bromopentane, chlorohexane, bromohexane, chlorocyclohexane and bromocyclohexane; halogenated unsaturated hydrocarbons such as chlorobenzene, dichlorobenzene and trichlorobenzene; alcohols such as methanol, ethanol, propanol, isopropanol, butanol and t-butyl alcohol; carboxylic acids such as formic acid, acetic acid and propionic acid; ethers such as dimethylether, diethylether, methyl t-butyl ether, tetrahydrofuran, tetrahydropyran and dioxane; amines such as trimethylamine, triethylamine, N,N,N',N'-tetramethylethylenediamine and pyridine; and amides such as N,N-dimethylformamide, N,N-dimethylacetamide, N,N-diethylacetamide and N-methylmorpholine oxide. These organic solvents may be used alone, or two or more kinds of them may be used in combination. Among these organic solvents, from the viewpoint of reactivity, ethers are preferable, and tetrahydrofuran and diethylether are more preferable. From the viewpoint of the reaction rate, toluene and xylene are preferable.

In the production of the conjugated polymer compound, it is preferred to appropriately add an alkali or a proper catalyst so as to react the raw compound. Such an alkali or catalyst may be selected according to the polymerization method to be employed. Such an alkali or catalyst is preferably dissolved sufficiently in a solvent used for the reaction. The method of mixing the alkali or catalyst is exemplified by a method of slowly adding a solution of an alkali or catalyst while stirring a reaction solution under an inert atmosphere such as argon or nitrogen, or a method of slowly adding a reaction solution to a solution of an alkali or catalyst.

In the polymer compound according to the present invention, when an polymerization active group remains at the end group as it is, luminescence characteristics or lifetime characteristics of a polymer light-emitting device of the present invention may deteriorate, and therefore the end group may be protected with a stable group. When the end group is protected with a stable group in such a manner, it is preferred to have a conjugated bond continuous with a conjugated structure of a main chain, and the structure includes, for example, a structure bonded with an aryl group or a heterocyclic group via a carbon-carbon bond. The stable group which protecting the end group includes, for example, a substituent group such as a monovalent aromatic compound group represented by the structural formula of Chemical Formula 10 in Japanese Unexamined Patent Publication (Kokai) No. 9-45478.

The other preferred method of producing a conjugated polymer compound containing a repeating unit represented by formula (1) is exemplified by a method in which a conjugated polymer compound containing no ions is polymerized in a first step and a conjugated polymer compound containing ions is produced from the conjugated polymer compound of the first step in a second step. The method of polymerizing the conjugated polymer compound containing no ions of the first step is exemplified by the above condensation polymerization reaction. The reaction of the second step is exemplified by a reaction of conversion of amine into a quaternary ammonium salt using a halogenated alkyl and a hydrogen abstraction reaction using $SbF_5$.

Another preferred method of producing a conjugated polymer compound containing a repeating unit represented by formula (3) is exemplified by a method in which a conjugated polymer compound containing no cations is polymerized in a first step, and a conjugated polymer compound containing cations are produced from the conjugated polymer compound in a second step. The method of polymerizing the conjugated polymer compound containing no cations of the first step is exemplified by the above condensation polymerization reaction. The reaction of the second step is exemplified by a hydrolysis reaction using metal hydroxide and alkylammonium hydroxide.

<Layered Structure>

A layered structure according to the present invention will be described below.

The layered structure of the present invention includes a first electrode and a second electrode, a light-emitting layer or a charge separation layer between the first electrode and the second electrode, and a layer containing a conjugated polymer compound between the light-emitting layer or the charge separation layer and the first electrode, wherein the conjugated polymer compound contains one or more repeating units selected from the group consisting of a repeating unit represented by formula (1), a repeating unit represented by formula (3) and a repeating unit represented by formula (5).

The layered structure of the present invention can be used for an electroluminescence device and a photoelectric conversion device. When the layered structure is used for the electroluminescence device, the light-emitting layer is present in the layered structure. When the layered structure is used for the photoelectric conversion device, the charge separation layer is present in the layered structure.

Since the conjugated polymer compound used in the present invention is excellent in charge injecting property and charge transporting property, when a layer containing the conjugated polymer compound is used for the electroluminescence device, a device capable of emitting light with high luminance can be obtained. When a layer containing the conjugated polymer compound is used for the photoelectric conversion device, a device having high conversion efficiency is obtained.

<Electroluminescence Device>

The electroluminescence device using the layered structure of the present invention includes a cathode, an anode, and a light-emitting layer between the cathode and the anode. Usually, the electroluminescence device of the present invention can further include a substrate as any constituent element, and can have the configuration in which the cathode, anode, light-emitting layer and layer containing a conjugated polymer compound of the present invention, and optionally any other constituent element are provided on the substrate.

In one aspect of the electroluminescence device of the present invention, an anode is provided on a substrate, a light-emitting layer is layered thereon, and also a cathode is layered thereon. In another aspect, a cathode is provided on a substrate and an anode may be provided on a light-emitting layer. In still another aspect, the electroluminescence device may be any electroluminescence device of a so-called bottom emission type for lighting from a substrate side, a so-called top emission type for lighting from the side opposite to the substrate or a type for lighting from both sides. In further another aspect, layers having other functions, such as any protective film, a buffer film and reflection layer may also be provided. The configuration of the electroluminescence device will be separately described in detail hereinafter. The electroluminescence device is further covered with a sealing film or a sealing substrate to form a light-emitting device in which the electroluminescence device is blocked from the outside air.

The layer containing a conjugated polymer compound used in the present invention can be used as a layer between a cathode and a light-emitting layer or a layer between an anode and a light-emitting layer in the electroluminescence device, and is used as a charge injecting layer or a charge transporting layer.

The method of forming a layer containing a conjugated polymer compound includes, for example, a method of forming a film using a solution containing a conjugated polymer compound.

The solvent used to form a film from such a solution is preferably a solvent having a solubility parameter of 9.3 or more, excluding water. Examples of the solvent (the value in each parenthesis denotes a value of a solubility parameter of each solvent) include methanol (12.9), ethanol (11.2), 2-propanol (11.5), 1-butanol (9.9), t-butyl alcohol (10.5), acetonitrile (11.8), 1,2-ethanediol (14.7), N,N-dimethylformamide (11.5), dimethyl sulfoxide (12.8), acetic acid (12.4), nitrobenzene (11.1), nitromethane (11.0), 1,2-dichloroethane (9.7), dichloromethane (9.6), chlorobenzene (9.6), bromobenzene (9.9), dioxane (9.8), propylene carbonate (13.3), pyridine (10.4), carbon disulfide (10.0), or a mixed solvent of these solvents. In the case of a mixed solvent of a solvent 1 and a solvent 2, the solubility parameter ($\delta_m$) is determined by the equation: $\delta_m = \delta_1 \times \phi_1 + \delta_2 \times \phi_2$ ($\delta_1$ denotes a solubility parameter of a solvent 1, $\phi_1$ denotes a volume fraction of a solvent 1, $\delta_2$ is a solubility parameter of a solvent 2, and $\phi_2$ denotes a volume fraction of a solvent 2).

Examples of the method of forming a film from a solution include coating methods such as a spin coating method, a casting method, a micro gravure coating method, a gravure coating method, a bar coating method, a roll coating method, a wire bar coating method, a dip coating method, a slit coating method, a cap coating method, a spray coating method, a screen printing method, a flexographic printing method, an offset printing method, an ink jet printing method and a nozzle coating method.

Since an optimum value of the thickness of the layer containing a conjugated polymer compound varies depending on the conjugated polymer compound, the thickness may be appropriately selected so that a drive voltage and a luminous efficiency are a suitable value, and it is necessary that the thickness is preferably a thickness which prevents at least generation of pinholes. From the viewpoint of decrease in a drive voltage of the device, the thickness is preferably from 1 nm to 1 µm, more preferably from 2 nm to 500 nm, and still preferably from 2 nm to 200 nm.

The electroluminescence device includes a cathode and an anode, and a light-emitting layer between the cathode and the anode, and further includes a constituent element.

For example, the electroluminescence device can include one or more layers among a hole injecting layer, an interlayer and a hole transporting layer between the anode and the light-emitting layer. When the hole injecting layer is present, it is possible to include one or more layers among an interlayer and a hole transporting layer between the light-emitting layer the hole injecting layer.

On the other hand, it is possible to include one or more layers among an electron injecting layer, an electron transporting layer and a hole blocking layer between the cathode and the organic light-emitting layer. When the electron injecting layer is present, it is possible to include one or more layers among an electron transporting layer and a hole blocking layer between the organic light-emitting layer and the electron injecting layer.

The layer containing a conjugated polymer compound used in the present invention can be used as a hole injecting layer, a hole transporting layer, an interlayer, an electron injecting layer, an electron transporting layer and a hole blocking layer. When the layer containing a conjugated polymer compound is used as a hole injecting layer, a hole transporting layer or an interlayer, a first electrode serves as an anode and a second electrode serves as a cathode. When the layer containing a conjugated polymer compound is used as an electron injecting layer, an electron transporting layer or a hole blocking layer, a first electrode serves as a cathode and a second electrode serves as an anode.

The anode feeds holes to a hole injecting layer, a hole transporting layer, an interlayer or a light-emitting layer, while the cathode feeds electrons to an electron injecting layer, an electron transporting layer, a hole blocking layer or a light-emitting layer.

The light-emitting layer means a layer having a function of accepting holes from a layer adjacent to the anode side and accepting electrons from a layer adjacent to the cathode side when an electric field is applied, a function of moving accepted charges (electrons and holes) by a force of the electric field, and a function of providing a place where electrons and holes are recombined, thus leading to light emission.

The electron injecting layer and the electron transporting layer mean layers having any one of a function of accepting electrons from a cathode, a function of transporting electrons, and a function of blocking holes injected from an anode. The hole blocking layer means a layer which has a function of blocking holes injected mainly from an anode, and optionally has either a function of accepting electrons from a cathode or a function of transporting electrons.

The hole injecting layer and the hole transporting layer are layers having any one of a function of accepting holes from an anode, a function of transporting holes, a function of feeding holes to a light-emitting layer, and a function of blocking electrons injected from a cathode. The interlayer layer has at least one or more functions of a function of accepting holes from an anode, a function of transporting holes, a function of feeding holes to a light-emitting layer, and a function of blocking electrons injected from a cathode, and is usually disposed adjacent to the light-emitting layer, and has a role of isolating the light-emitting layer and the anode, or the light-emitting layer and the hole injecting layer or the hole transporting layer.

The electron transporting layer and the hole transporting layer are generically referred to as a charge transporting layer. The electron injecting layer and the hole injecting layer are generically referred to as a charge injecting layer.

That is, the electroluminescence device of the present invention can have the following layer configuration (a), or the layer configuration in which one or more layers of a hole injecting layer, a hole transporting layer, an interlayer, a hole blocking layer, an electron transporting layer and an electron injecting layer are omitted from the layer configuration (a). In the layer configuration (a), the layer containing a conjugated polymer compound used in the present invention can be used as one or more layers selected from a hole injecting layer, a hole transporting layer, an interlayer, an electron injecting layer, an electron transporting layer and a hole blocking layer.
(a) Anode-hole injecting layer-(hole transporting layer and/or interlayer)-light-emitting layer-(hole blocking layer and/or electron transporting layer)-electron injecting layer-cathode The symbol "-" means that the respective layers are layered adjacent to one another.

"(Hole transporting layer and/or interlayer)" means a layer composed only of a hole transporting layer, a layer composed only of an interlayer, a layer configuration of hole transporting layer-interlayer, a layer configuration of interlayer-hole transporting layer, or any layer configuration including one or more hole transporting layers and one or more interlayers.

"(Hole blocking layer and/or electron transporting layer)" means a layer composed only of a hole blocking layer, a layer composed only of an electron transporting layer, a layer configuration of hole blocking layer-electron transporting layer, a layer configuration of electron transporting layer-hole blocking layer, or any layer configuration including one or more hole blocking layers and one or more electron transporting layers. The same shall apply in the description of the following layer configuration.

Furthermore, the electroluminescence device of the present invention can include a two-layered light-emitting layer in one layered structure. In this case, the electroluminescence device can have the following layer configuration (b) or the layer configuration in which one or more layers of a hole injecting layer, a hole transporting layer, an interlayer, a hole blocking layer, an electron transporting layer, an electron injecting layer and an electrode are omitted from the layer configuration (b). In the layer configuration (b), a layer containing a conjugated polymer compound is used as a layer existing between an anode and a light-emitting layer closest to the anode, or used as a layer existing between a cathode and a light-emitting layer closest to the cathode.
(b) Anode-hole injecting layer-(hole transporting layer and/or interlayer)-light-emitting layer-(hole blocking layer and/or electron transporting layer)-electron injecting layer-electrode-hole injecting layer-(hole transporting layer and/or interlayer)-light-emitting layer-(hole blocking layer and/or electron transporting layer)-electron injecting layer-cathode Furthermore, the electroluminescence device of the present invention can include a three- or more multi-layered light-emitting layer in one laminate structure. In this case, the electroluminescence device can have the following layer configuration (c), or the layer configuration in which one or more layers of a hole injecting layer, a hole transporting layer, an interlayer, a hole blocking layer, an electron transporting layer, an electron injecting layer and an electrode are omitted from the layer configuration (c). In the layer configuration (c), a layer containing a conjugated polymer compound is used as a layer existing between an anode and a light-emitting layer closest to the anode, or used as a layer existing between a cathode and a light-emitting layer closest to the cathode.
(c) Anode-hole injecting layer-(hole transporting layer and/or interlayer)-light-emitting layer-(hole blocking layer and/or electron transporting layer)-electron injecting layer-repeating unit A-repeating unit A-cathode The "repeating unit A" means a unit of a layer configuration of electrode-hole injecting layer-(hole transporting layer and/or interlayer)-light-emitting layer-(hole blocking layer and/or electron transporting layer)-electron injecting layer.

Preferred examples of the layer configuration of the electroluminescence device of the present invention include the followings. In the following layer configuration, a layer containing a conjugated polymer compound used in the present invention can be used as one or more layers selected from the group consisting of a hole injecting layer, a hole transporting layer, an interlayer, an electron injecting layer, an electron transporting layer and a hole blocking layer.
(d) Anode-hole transporting layer-light-emitting layer-cathode
(e) Anode-light-emitting layer-electron transporting layer-cathode
(f) Anode-hole transporting layer-light-emitting layer-electron transporting layer-cathode Each one of these structures is also exemplified by a structure in which an interlayer layer is provided adjacent to a light-emitting layer between the light-emitting layer and an anode. That is, the following structures (d') to (g') are shown.
(d') Anode-interlayer layer-light-emitting layer-cathode
(e') Anode-hole transporting layer-interlayer layer-light-emitting layer-cathode
(f') Anode-interlayer layer-light-emitting layer-electron transporting layer-cathode
(g') Anode-hole transporting layer-interlayer layer-light-emitting layer-electron transporting layer-cathode In the present invention, examples of the electroluminescence device provided with a charge injecting layer (electron injecting layer, hole injecting layer) include an electroluminescence device in which a charge injecting layer is provided adjacent to a cathode, and an electroluminescence device in which a charge injecting layer is provided adjacent to an anode. Specifically, the following structures (h) to (s) are shown.
(h) Anode-charge injecting layer-light-emitting layer-cathode
(i) Anode-light-emitting layer-charge injecting layer-cathode
(j) Anode-charge injecting layer-light-emitting layer-charge injecting layer-cathode
(k) Anode-charge injecting layer-hole transporting layer-light-emitting layer-cathode
(l) Anode-hole transporting layer-light-emitting layer-charge injecting layer-cathode
(m) Anode-charge injecting layer-hole transporting layer-light-emitting layer-charge injecting layer-cathode
(n) Anode-charge injecting layer-light-emitting layer-electron transporting layer-cathode
(o) Anode-light-emitting layer-electron transporting layer-charge injecting layer-cathode
(p) Anode-charge injecting layer-light-emitting layer-electron transporting layer-charge injecting layer-cathode
(q) Anode-charge injecting layer-hole transporting layer-light-emitting layer-electron transporting layer-cathode
(r) Anode-hole transporting layer-light-emitting layer-electron transporting layer-charge injecting layer-cathode
(s) Anode-charge injecting layer-hole transporting layer-light-emitting layer-electron transporting layer-charge injecting layer-cathode Similar to (d') to (g'), as each one of these structures, there is also exemplified a structure in which an interlayer layer is provided adjacent to a light-emitting layer between the light-emitting layer and an anode. In this case, the interlayer layer may serve as both a hole injecting layer and/or a hole transporting layer.

The layer containing a conjugated polymer compound used in the present invention is preferably an electron injecting layer or an electron transporting layer. When the layer containing a conjugated polymer compound is an electron injecting layer or an electron transporting layer, a first electrode is usually a cathode.

The electroluminescence device of the present invention may be further provided with an insulating layer adjacent to an electrode so as to improve tight adhesion with the electrode and to improve injection of charges (that is, holes or electrons) from the electrode. It is also possible to insert a thin buffer layer into an interface of a charge transporting layer (that is, a hole transporting layer or an electron transporting layer) or a light-emitting layer so as to improve tight adhesion of the interface and to prevent mixing. The order or number of the layer to be layered as well as the thickness of each layer can be appropriately used taking luminous efficiency and device lifetime into consideration.

Materials and forming methods of each layer constituting the electroluminescence device of the present invention will be described in more detail.

<Substrate>

A substrate constituting the electroluminescence device of the present invention may be any one which does not vary when an electrode is formed and a layer of an organic substance is formed. For example, glasses, plastics, polymer films, metal films, silicone substrates, and layered articles thereof can be used. The substrate is commercially available, or can be produced by a known method.

When the electroluminescence device of the present invention constitutes a picture element of a display device, a circuit for driving a picture element may be provided on the substrate, and a flattened film may be provided on the drive circuit. When the flattened film is provided, center line average roughness (Ra) of the flattened film preferably satisfies the following inequality: Ra<10 nm.

Ra can be measured based on Japanese Industrial Standard (JIS) JIS-B0601-2001 with reference to JIS-B0651 to JIS-B0656 and JIS-B0671-1.

<Anode>

Regarding an anode constituting the electroluminescence device of the present invention, a work function of a surface of the light-emitting layer side of the anode is preferably 4.0 eV or more from the viewpoint of hole feeding property to an organic semiconductor material used for a hole injecting layer, a hole transporting layer, an interlayer and a light-emitting layer.

It is possible to use, as the material of the anode, electrical conductive compounds such as metals, alloys, metal oxides and metal sulfides, or mixtures thereof. Examples of the material of the anode include conductive metal oxides such as tin oxide, zinc oxide, indium oxide, indium tin oxide (ITO), indium zinc oxide (IZO) and molybdenum oxide; metals such as gold, silver, chromium and nickel; and also mixtures of these conductive metal oxides and metals.

The anode may have a single-layered structure composed of one, or two or more kinds of these materials, or a multi-layered structure composed of a plurality of layers with the same or different composition. In the case of the multi-layered structure, it is more preferred to use a material having a work function of 4.0 eV or more as an outermost layer at the light-emitting layer side.

The method of producing an anode is not particularly limited and a known method can be employed, and examples thereof include a vacuum deposition method, a sputtering method, an ion plating method and a plating method.

The thickness of the anode is usually from 10 nm to 10 μm, and preferably from 50 nm to 500 nm.

From the viewpoint of the prevention of poor electrical connection such as short circuit, center line average roughness (Ra) of a surface of the light-emitting layer side of the anode preferably satisfies the inequality: Ra<10 nm, and more preferably Ra<5 nm.

Furthermore, the anode may be sometimes subjected to a surface treatment with a solution containing UV ozone, a silane coupling agent, or an electron accepting compound such as 2,3,5,6-tetrafluoro-7,7,8,8-tetracyanoquinodimethane after forming by the above method. Electrical connection with an organic layer contacted with the anode is improved by the surface treatment.

When the anode is used as a light reflecting electrode in the electroluminescence device of the present invention, the anode preferably has a multi-layered structure in which a light reflecting layer made of a high light reflecting metal and a high work function material layer containing a material having a work function of 4.0 eV or more are used in combination.

Specific examples of the configuration of the anode include:
(i) Ag—$MoO_3$,
(ii) (Ag—Pd—Cu alloy)-(ITO and/or IZO),
(iii) (Al—Nd alloy)-(ITO and/or IZO),
(iv) (Mo—Cr alloy)-(ITO and/or IZO), and
(V) (Ag—Pd—Cu alloy)-(ITO and/or IZO)— $MoO_3$.

In order to obtain a sufficient light reflectance, the thickness of the high light reflecting metal layer made of Al, Ag, an Al alloy, an Ag alloy, a Cr alloy or the like is preferably 50 nm or more, and more preferably 80 nm or more. The thickness of the high work function material layer made of ITO, IZO or $MoO_3$ is usually within a range from 5 nm to 500 nm.

<Hole Injecting Layer>

In the electroluminescence device of the present invention, examples of the material which, forms the hole injecting layer, other than the conjugated polymer compound used in the present invention include a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, a starburst type amine, a phthalocyanine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidyne-based compound, a porphyrin-based compound, a polysilane-based compound, a poly(N-vinylcarbazole) derivative, an organic silane derivative, and a polymer containing them. The material also includes conductive metal oxides such as vanadium oxide, tantalum oxide, tungsten oxide, molybdenum oxide, ruthenium oxide and aluminum oxide; conductive polymers and oligomers, such as polyaniline, an aniline-based copolymer, a thiophene oligomer and polythiophene; organic conductive materials such as poly(3,4-ethylenedioxythiophene) polystyrenesulfonic acid and polypyrrole and polymers containing them; and amorphous carbon. It is also possible to suitably use acceptable organic compounds such as a tetracyanoquinodimethane derivative (for example, 2,3,5,6-tetrafluoro-7,7,8,8-tetracyanoquinodimethane), a 1,4-naphthoquinone derivative, a diphenoquinone derivative, a polynitro compound; and silane coupling agents such as octadecyltrimethoxysilane.

The material may be used in the form of a single component or a composition of a plurality of components. The hole injecting layer may have a single-layered structure composed of one, or two or more kinds of the above materials. The hole injecting layer may also have a multi-layered structure composed of a plurality of layers with the same or different composition. It is also possible to use materials, which are listed as materials usable in the hole transporting layer or interlayer, in the hole injecting layer.

As the method of producing a hole injecting layer, known various methods can be employed. In the case of an inorganic compound material, the method is exemplified by a vacuum deposition method, a sputtering method and an ion plating method. In the case of a low molecular organic material, the method is exemplified by a vacuum deposition method, a transfer method such as a laser transfer or heat transfer method, and a method of forming a film from a solution (a mixed solution with a polymer binder may be used). In the case of a polymer organic material, the method is exemplified by a method of forming a film from a solution.

When the hole injecting material is a low molecular compound such as a pyrazoline derivative, an arylamine derivative, a stilbene derivative or a triphenyldiamine derivative, a hole injecting layer can be formed by a vacuum deposition method.

It is also possible to form a hole injecting layer using a mixed solution containing a polymer compound binder and the low molecular hole injecting material dispersed therein. The polymer compound binder mixed is preferably a binder which does not extremely inhibit charge transporting and also a binder which does not show strong absorption to visible light. Specific examples thereof include poly(N-vinylcarbazole), polyaniline or a derivative thereof, polythiophene or a derivative thereof, poly(p-phenylenevinylene) or a derivative thereof, poly(2,5-thienylene vinylene) or a derivative thereof, polycarbonate, polyacrylate, polymethyl acrylate, polymethyl methacrylate, polystyrene, polyvinyl chloride and polysiloxane.

The solvent used to form a film from the solution is not particularly limited as long as it dissolves the hole injecting material. Examples of the solvent include water, chlorine-containing solvents such as chloroform, methylene chloride and dichloroethane; ether solvents such as tetrahydrofuran; aromatic hydrocarbon solvents such as toluene and xylene; ketone solvents such as acetone and methyl ethyl ketone; and ester solvents such as ethyl acetate, butyl acetate and ethyl cellosolve acetate.

It is possible to use, as the method of forming a film from the solution, applying methods from a solution, such as a spin coating method, a casting method, a micro gravure coating method, a gravure coating method, a bar coating method, a roll coating method, a wire bar coating method, a dip coating method, a slit coating method, a capillary coating method, a spray coating method and a nozzle coating method; and printing methods such as a gravure printing method, a screen printing method, a flexographic printing method, an offset printing method, an inverse printing method and an ink jet printing method. From the viewpoint of easy formation of a pattern, printing methods such as a gravure printing method, a screen printing method, a flexographic printing method, an offset printing method, an inverse printing method and an ink jet printing method; and a nozzle coating method are preferred.

When organic compound layers such as a hole transporting layer, an interlayer and a light-emitting layer are formed after forming the hole injecting layer, particularly when both layers are formed by an applying method, it may become impossible to form a layered structure since the layer applied previously is dissolved in a solvent contained in a solution of a layer to be applied later. In this case, a method of making a lower layer insoluble in a solvent can be used. Examples of the method of making a lower layer insoluble in a solvent include a method of making a polymer compound insoluble by crosslinking after imparting a crosslinking group; a method of making a low molecular compound having a crosslinking group with an aromatic ring, such as an aromatic bisazide, insoluble by crosslinking after mixing with a crosslinking agent; a method of making a low molecular compound having a crosslinking group with no aromatic ring, such as an acrylate group, insoluble by crosslinking after mixing with a crosslinking agent; a method of making a lower layer insoluble in an organic solvent used to produce an upper layer by crosslinking through exposure to ultraviolet light; and a method of making a lower layer insoluble in an organic solvent used to produce an upper layer by crosslinking through heating. The temperature at which the lower layer is heated is usually from about 100° C. to 300° C., and the heating time is usually from about 1 minute to 1 hour.

The other laminating method without dissolving a lower layer through the operation other than crosslinking includes a method of using solutions each having different polarity in the production of adjacent layers, for example, a method of preventing a lower layer from dissolving even when applied by using a water-soluble polymer compound as a material of the lower layer and using an oil-soluble polymer compound as a material of the upper layer.

An optimum value of the thickness of the hole injecting layer varies depending on the material used, and the thickness may be selected so that a drive voltage and a luminous efficiency are a suitable value, and it is necessary that the thickness is a thickness which prevents at least generation of pinholes. When the thickness is too large, a drive voltage of the device becomes higher, and therefore it is not preferred. Therefore, the thickness of the hole injecting layer is, for example, from 1 nm to 1 μm, preferably from 2 nm to 500 nm, and more preferably from 10 nm to 100 nm.

<Hole Transporting Layer and Interlayer>

In the electroluminescence device of the present invention, examples of the material, which constitutes the hole transporting layer and the interlayer, other than the conjugated polymer compound used in the present invention include a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidyne-based compound, a porphyrin-based compound, a polysilane-based compound, a poly(N-vinylcarbazole) derivative, an organic silane derivative, and a polymer containing these structures. The material can also include conductive polymers and oligomers, such as an aniline-based copolymer, a thiophene oligomer and polythiophene; and organic conductive material such as polypyrrole.

The above material may be a single component, or may be a composition composed of a plurality of components. The hole transporting layer and the interlayer may be a single-layered structure composed of one, or two or more kinds of the materials, or a multi-layered structure composed of a plurality of layers with the same or different composition. It is also possible to use materials, which are listed as materials usable in the hole injecting layer, in the hole transporting layer.

It is possible to use, as the material which constitutes the hole transporting layer and the interlayer, for example, compounds disclosed in Japanese Unexamined Patent Publication (Kokai) No. 63-70257, Japanese Unexamined Patent Publication (Kokai) No. 63-175860, Japanese Unexamined Patent Publication (Kokai) No. 2-135359, Japanese Unexamined Patent Publication (Kokai) No. 2-135361, Japanese Unexamined Patent Publication (Kokai) No. 2-209988, Japanese Unexamined Patent Publication (Kokai) No. 3-37992, Japanese Unexamined Patent Publication (Kokai) No. 3-152184, Japanese Unexamined Patent Publication (Kokai) No. 5-263073, Japanese Unexamined Patent Publication (Kokai) No. 6-1972, WO 2005/52027 and Japanese Unexamined Patent Publication (Kokai) No. 2006-295203. Among these compounds, polymers containing a divalent aromatic amine residue as a repeating unit are suitably used.

The divalent aromatic amine residue is exemplified by a group represented by formula (21).

The method of forming a hole transporting layer and an interlayer can be exemplified by the same method as those of forming a hole injecting layer. Examples of the method of forming a film from the solution include the applying methods and the printing methods, such as a spin coating method, a casting method, a bar coating method, a slit coating method, a spray coating method, a nozzle coating method, a gravure printing method, a screen printing method, a flexographic printing method and an ink jet printing method. When a sublimable compound material is used, a vacuum deposition method and a transfer method are exemplified. Examples of the solvent used to form a film from the solution include solvents listed in the method of forming a hole injecting layer.

In the case of forming an organic compound layer such as a light-emitting layer by an applying method after forming the hole transporting layer and the interlayer, when a lower layer is dissolved in a solvent contained in a solution of a layer to be applied later, it is possible to make the lower layer insoluble in the solvent by the same method as those listed in the method of forming a hole injecting layer.

An optimum value of the thickness of the hole transporting layer and the interlayer varies depending on the material used, and the thickness may be selected so that a drive voltage and a luminous efficiency are a suitable value, and it is necessary that the thickness is a thickness which prevents at least generation of pinholes. When the thickness is too large, a drive voltage of the device becomes higher, and therefore it is not preferred. Therefore, the thickness of the hole transporting layer and the interlayer is, for example, from 1 nm to 1 µm, preferably from 2 nm to 500 nm, and more preferably from 5 nm to 100 nm.

<Light-Emitting Layer>

In the electroluminescence device of the present invention, when the light-emitting layer contains a polymer compound, it is possible to suitably use, as a polymer compound, conjugated polymer compounds such as a polyfluorene derivative, a polyparaphenylene vinylene derivative, a polyphenylene derivative, a polyparaphenylene derivative, a polythiophene derivative, polydialkylfluorene, polyfluorenebenzothiadiazole and polyalkylthiophene.

The light-emitting layer containing these polymer compounds may contain polymer pigment compounds such as a perylene-type pigment, a coumarin-type pigment and a rhodamine-type pigment; and low molecular pigment compounds such as rubrene, perylene, 9,10-diphenylanthracene, tetraphenylbutadiene, nile red, coumarin 6 and quinacridone. It is also possible to contain a naphthalene derivative, anthracene or a derivative thereof, perylene or a derivative thereof, polymethine-, xanthene-, coumarin- and cyanine-type pigments, a metal complex of 8-hydroxyquinoline or a derivative thereof, aromatic amine, tetraphenylcyclopentadiene or a derivative thereof, or tetraphenylbutadiene or a derivative thereof, and a metal complex capable of emitting phosphorescence, such as tris(2-phenylpyridine)iridium.

The light-emitting layer of the electroluminescence device of the present invention may be composed of a composition of a non-conjugated polymer compound, and a luminous organic compound such as the above organic pigment or the above metal complex. Examples of the non-conjugated polymer compound include polyethylene, polyvinyl chloride, polycarbonate, polystyrene, polymethyl methacrylate, polybutyl methacrylate, polyester, polysulfone, polyphenylene oxide, polybutadiene, poly(N-vinylcarbazole), a hydrocarbon resin, a ketone resin, a phenoxy resin, polyamide, ethyl cellulose, vinyl acetate, an ABS resin, polyurethane, a melamine resin, an unsaturated polyester resin, an alkyd resin, an epoxy resin and a silicone resin. The above non-conjugated polymer compound may have a structure represented by one or more derivatives or compounds selected from the group consisting of a carbazole derivative, a triazole derivative, an oxazole derivative, an oxadiazole derivative, an imidazole derivative, a polyarylalkane derivative, a pyrazoline derivative, a pyrazolone derivative, a phenylenediamine derivative, an arylamine derivative, an amino-substituted chalcone derivative, a styrylanthracene derivative, a fluorenone derivative, a hydrazone derivative, a stilbene derivative, a silazane derivative, an aromatic tertiary amine compound, a styrylamine compound, an aromatic dimethylidyne compound, a porphyrin compound and an organic silane derivative, on the side chain.

When the light-emitting layer contains a low molecular compound, examples of the low molecular compound include low molecular pigment compounds such as rubrene, perylene, 9,10-diphenylanthracene, tetraphenylbutadiene, nile red, coumarin 6, carbazole and quinacridone; a naphthalene derivative, anthracene or a derivative thereof, perylene or a derivative thereof, polymethine-, xanthene-, coumarin-, cyanine- and indigo-type pigments, a metal complex of 8-hydroxyquinoline or a derivative thereof, a metal complex of phthalocyanine or a derivative thereof, an aromatic amine, tetraphenylcyclopentadiene or a derivative thereof, or tetraphenylbutadiene or a derivative thereof.

When the light-emitting layer contains a metal complex capable of emitting phosphorescence, examples of the metal complex include tris(2-phenylpyridine)iridium, a thienylpyridine ligand-containing iridium complex, a phenylquinoline ligand-containing iridium complex and a triazacyclononane skeleton-containing terbium complex.

Specific examples of the polymer compound used in the light-emitting layer include polyfluorenes disclosed in WO 97/09394, WO 98/27136, WO 99/54385, WO 00/22027, WO 01/19834, GB2340304A, GB2348316, U.S. Pat. No. 573, 636, U.S. Pat. No. 5,741,921, U.S. Pat. No. 5,777,070, EP0707020, Japanese Unexamined Patent Publication (Kokai) No. 9-111233, Japanese Unexamined Patent Publication (Kokai) No. 10-324870, Japanese Unexamined Patent Publication (Kokai) No. 2000-80167, Japanese Unexamined Patent Publication (Kokai) No. 2001-123156, Japanese Unexamined Patent Publication (Kokai) No. 2004-168999, Japanese Unexamined Patent Publication (Kokai) No. 2007-162009 and "Development and Constitute Materials of Organic EL Device" (CMC Publishing CO., LTD., published in 2006), derivatives and copolymers thereof, polyarylene, derivatives and copolymers thereof, polyarylenevinylene, derivatives and copolymers thereof, aromatic amines and (co)polymers of derivatives thereof.

Examples of the low molecular compound include compounds described in Japanese Unexamined Patent Publication (Kokai) No. 57-51781, "Collection of Work function Data of Organic Thin Film [2nd ed.]" (CMC Publishing CO., LTD., published in 2006) and "Development and Constitute Materials of Organic EL Device" (CMC Publishing CO., LTD., published in 2006).

The material may be a single component, or a composition composed of a plurality of components. The light-emitting layer may have a single-layered structure composed of one, or two or more kinds of the above materials, or may have a multi-layered structure composed of a plurality of layers with the same or different composition.

Examples of the method of forming a light-emitting layer include the same method as the method of forming a hole injecting layer. Examples of the method of forming a film from the solution include the coating methods and the printing methods, such as a spin coating method, a casting method, a bar coating method, a slit coating method, a spray coating method, a nozzle coating method, a gravure printing method, a screen printing method, a flexographic printing method and an ink jet printing method. When a sublimable compound material is used, a vacuum deposition method and a transfer method are exemplified.

Examples of the solvent used to form a film from the solution include solvents listed in the method of forming a hole injecting layer.

In the case of forming an organic compound layer such as an electron transporting layer by a coating method after forming the light-emitting layer, when a lower layer is dissolved in a solvent contained in a solution of a layer to be applied later, it is possible to make the lower layer insoluble in the solvent by the same method as those listed in the method of forming a hole injecting layer.

An optimum value of the thickness of the light-emitting layer varies depending on the material used, and the thickness may be selected so that a drive voltage and a luminous efficiency are a suitable value, and it is necessary that the thickness is a thickness which prevents at least generation of pinholes. When the thickness is too large, a drive voltage of the device becomes higher, and therefore it is not preferred. Therefore, the thickness of the light-emitting layer is, for example, from 5 nm to 1 µm, preferably from 10 nm to 500 nm, and more preferably from 30 nm to 200 nm.

<Electron Transporting Layer and Hole Blocking Layer>

In the electroluminescence device of the present invention, it is possible to use known materials as the material, which constitutes an electron transporting layer and a hole blocking layer, other than the conjugated polymer compound used in the present invention, and examples thereof include a triazole derivative, an oxazole derivative, an oxadiazole derivative, an imidazole derivative, a fluorenone derivative, benzoquinone or a derivative thereof, naphthoquinone or a derivative thereof, anthraquinone or a derivative thereof, tetracyanoanthraquinodimethane or a derivative thereof, a fluorenone derivative, diphenyldicyanoethylene or a derivative thereof, a diphenoquinone derivative, an anthraquinodimethane derivative, an anthrone derivative, a thiopyran dioxide derivative, a carbodiimide derivative, a fluorenylidenemethane derivative, a distyrylpyrazine derivative, an aromacyclic tetracarboxylic anhydride such as naphthalene or perylene, a phthalocyanine derivative, a metal complex or a metal phthalocyanine of a 8-quinolinol derivative, various metal complexes such as a metal complex containing benzoxazole or benzothiazole as a ligand, an organic silane derivative, a metal complex of 8-hydroxyquinoline or a derivative thereof, polyquinoline or a derivative thereof, polyquinoxaline or a derivative thereof, and polyfluorene or a derivative thereof. Among these materials, a triazole derivative, an oxadiazole derivative, benzoquinone or a derivative thereof, anthraquinone or a derivative thereof, or a metal complex of 8-hydroxyquinoline or a derivative thereof, polyquinoline or a derivative thereof, polyquinoxaline or a derivative thereof, and polyfluorene or a derivative thereof are preferred.

The material may be a single component, or a composition composed of a plurality of components. The electron transporting layer and the hole blocking layer may have a single-layered structure composed of one, or two or more kinds of the above materials, or a multi-layered structure composed of a plurality of layers with the same or different composition. It is also possible to use materials, which are listed as materials usable in the electron injecting layer, in the electron transporting layer and the hole blocking layer.

Examples of the method of forming an electron transporting layer and a hole blocking layer include the same method as the method of forming a hole injecting layer. Examples of the method of forming a film from the solution include the coating methods and the printing methods, such as a spin coating method, a casting method, a bar coating method, a slit coating method, a spray coating method, a nozzle coating method, a gravure printing method, a screen printing method, a flexographic printing method and an inkjet printing method. When a sublimable compound material is used, the method is exemplified by a vacuum deposition method and a transfer method.

Examples of the solvent used to form a film from the solution include solvents listed in the method of forming a hole injecting layer.

In the case of forming an organic compound layer such as an electron injecting layer by a coating method after forming the electron transporting layer and the hole blocking layer, when a lower layer is dissolved in a solvent contained in a solution of a layer to be applied later, it is possible to make the lower layer insoluble in the solvent by the same method as those listed in the method of forming a hole injecting layer.

An optimum value of the thickness of the electron transporting layer and hole blocking layer varies depending on the material used, and the thickness may be selected so that a drive voltage and a luminous efficiency are a suitable value, and it is necessary that the thickness is a thickness which prevents at least generation of pinholes. When the thickness is too large, a drive voltage of the device becomes higher, and therefore it is not preferred. Therefore, the thickness of electron transporting layer and hole blocking layer is, for example, from 1 nm to 1 µm, preferably from 2 nm to 500 nm, and more preferably from 5 nm to 100 nm.

<Electron Injecting Layer>

In the electroluminescence device of the present invention, it is possible to use known materials, as the material constituting the electron injecting layer, other than the conjugated polymer compound used in the present invention, and examples thereof include a triazole derivative, an oxazole derivative, an oxadiazole derivative, an imidazole derivative, a fluorenone derivative, benzoquinone or a derivative thereof, naphthoquinone or a derivative thereof, anthraquinone or a derivative thereof, tetracyanoanthraquinodimethane or a derivative thereof, a fluorenone derivative, diphenyldicyanoethylene or a derivative thereof, a diphenoquinone derivative, an anthraquinodimethane derivative, an anthrone derivative, a thiopyran dioxide derivative, a carbodiimide derivative, a fluorenylidenemethane derivative, a distyrylpyrazine derivative, an aromacyclic tetracarboxylic anhydride such as naphthalene or perylene, a phthalocyanine derivative, a metal complex and a metal phthalocyanine of a 8-quinolinol derivative, various metal complexes such as a metal complex containing benzoxazole or benzothiazole as a ligand, and an organic silane derivative.

The material may be a single component, or a composition composed of a plurality of components. The electron injecting layer may have a single-layered structure composed of one, or two or more kinds of the above materials, or a multi-layered structure composed of a plurality of layers with the same or different composition. It is also possible to use materials, which are listed as materials usable in the electron transporting layer and the hole blocking layer, in the electron injecting layer.

The method of forming an electron injecting layer is not particularly limited and the same method as the method of forming a hole injecting layer is shown. Examples of the method of forming a film from the solution include the coating methods and the printing methods, such as a spin coating method, a casting method, a bar coating method, a slit coating method, a spray coating method, a nozzle coating method, a gravure printing method, a screen printing method, a flexographic printing method and an ink jet printing method. When a sublimable compound material is used, the method is exemplified by a vacuum deposition method and a transfer method.

Examples of the solvent used to form a film from the solution include the solvents listed in the method of forming a hole injecting layer.

An optimum value of the thickness of the electron injecting layer varies depending on the material used, and the thickness may be selected so that a drive voltage and a luminous efficiency are a suitable value, and it is necessary that the thickness is a thickness which prevents at least generation of pinholes. When the thickness is too large, a drive voltage of the device becomes higher, and therefore it is not preferred. Therefore, the thickness of the electron injecting layer is, for example, from 1 nm to 1 µm, preferably from 2 nm to 500 nm, and more preferably from 5 nm to 100 nm.

<Cathode>

In the electroluminescence device of the present invention, a cathode is adjacent to a light-emitting layer, an electron transporting layer, a hole blocking layer and an electron injecting layer, and has a function of feeding electrons to these layers. The cathode may have a single-layered structure composed of a material alone or a plurality of materials, or a multi-layered structure composed of a plurality of layers. In the case of the multi-layered structure, a two-layered structure of a first cathode layer and a cover cathode layer, or a three-layered structure of a first cathode layer, a second cathode layer and a cover cathode layer is preferable. As used herein, the first cathode layer means a layer closest to the light-emitting layer side among the cathodes. The cover cathode layer means a first cathode layer in the case of the two-layered structure, or means a layer which covers the first cathode layer and the second cathode layer in the case of the three-layered structure. From the viewpoint of electron feeding ability, the work function of the material of the first cathode layer is preferably 3.5 eV or less. It is also possible to suitably use, as the first cathode layer material, an oxide, a fluoride, a carbonate and a complex oxide of metal having a work function of 3.5 eV or less. It is possible to be suitably used, as the material of the cover cathode layer, metal and metal oxide, which have low resistivity and high corrosion resistance against moisture.

Examples of the first cathode layer material include one or more materials selected from the group consisting of alkali metals, alkali earth metals, alloys containing one or more kinds of the metals, oxides, halides, carbonates and complex oxides of the metals, and mixtures thereof. Examples of the alkali metal or oxide, halide, carbonate and complex oxide thereof include lithium, sodium, potassium, rubidium, cesium, lithium oxide, sodium oxide, potassium oxide, rubidium oxide, cesium oxide, lithium fluoride, sodium fluoride, potassium fluoride, rubidium fluoride, cesium fluoride, lithium carbonate, sodium carbonate, potassium carbonate, rubidium carbonate, cesium carbonate, potassium molybdate, potassium titanate, potassium tungstate and cesium molybdate. Examples of the alkali earth metal or oxide, halide, carbonate and complex oxide thereof include magnesium, calcium, strontium, barium, magnesium oxide, calcium oxide, strontium oxide, barium oxide, magnesium fluoride, calcium fluoride, strontium fluoride, barium fluoride, magnesium carbonate, calcium carbonate, strontium carbonate, barium carbonate, barium molybdate and barium tungstate. Examples of the alloy containing one or more kinds of alkali metals or alkali earth metals include a Li—Al alloy, a Mg—Ag alloy, an Al—Ba alloy, a Mg—Ba alloy, a Ba—Ag alloy and a Ca—Bi—Pb—Sn alloy. It is also possible to use a composition of materials listed as the first cathode layer material and materials listed as the material constituting the electron injecting layer for the first cathode layer. Examples of the material of the second cathode layer include the same materials as those of the first cathode layer.

Specific examples of the cover cathode layer material include low resistance metals such as gold, silver, copper, aluminum, chromium, tin, lead, nickel and titanium, alloys containing these metals, conductive metal oxides such as tin oxide, zinc oxide, indium oxide, indium tin oxide (ITO), indium zinc oxide (IZO) and molybdenum oxide, and mixtures of these conductive metal oxides and metals.

Examples of the case where the cathode has a multi-layered structure include a two-layered structure of a first cathode layer made of Mg/Al, Ca/Al, Ba/Al, NaF/Al, KF/Al, RbF/Al, CsF/Al, Na$_2$CO$_3$/Al, K$_2$CO$_3$/Al and Cs$_2$CO$_3$/Al and a cover cathode layer; and a three-layered structure of a first cathode layer made of LiF/Ca/Al, NaF/Ca/Al, KF/Ca/Al, RbF/Ca/Al, CsF/Ca/Al, Ba/Al/Ag, KF/Al/Ag, KF/Ca/Ag and K$_2$CO$_3$/Ca/Ag, a second cathode layer and a cover cathode layer (in which the symbol "/" means that each layer is adjacent to one another). The material of the second cathode layer preferably has a reducing action on the material of the first cathode layer. Herein, the absence or presence and degree of the reducing action between materials can be estimated from bond dissociation energy($\Delta$rH°) between compounds. In other words, in the case of a combination in which bond dissociation energy is positive in the reductive reaction of the material constituting the second cathode layer with the material constituting the first cathode layer, it can be said that the material of the second cathode layer has a reducing action on the material of the first cathode layer. It is possible to refer the bond dissociation energy, for example, to "Electrochemical Handbook (Denki-Kagaku Binran), 5th ed." (MARUZEN Co., Ltd., published in 2000) and "Thermodynamic Databases MALT" (Kagaku Gijutsu-Sha, published in 1992).

As the method of producing a cathode, known various methods can be employed and examples thereof include a vacuum deposition method, a sputtering method and an ion plating method. When metals, and oxides, fluorides and carbonates of metals are used, a vacuum deposition method is often used. When metal oxides and metal complex oxides having a high boiling point and conductive metal oxides such as indium tin oxide (ITO) are used, a sputtering method and an ion plating method are often used. When a film of a composition of different kinds of materials is formed, a codeposition method, a sputtering method and an ion plating method are used. When a film of a composition of a low molecular organic substance and metals or oxides, fluorides or carbonates of metals is formed, a codeposition method is suitable.

An optimum value of the thickness of the cathode varies depending on the material and layer structure used, and the thickness may be selected so that a drive voltage, a luminous efficiency and a device lifetime are a suitable value. Usually, the thickness of the first cathode layer is within a range from 0.5 nm to 20 nm and the thickness of the cover cathode layer is within a range from 10 nm to 1 µm. For example, when Ba or Ca is used in the first cathode layer and Al is used in the cover cathode layer, the thickness of Ba or Ca is preferably from 2 nm to 10 nm, and the thickness of Al is preferably from 10 nm to 500 nm. When NaF or KF is used in the first cathode layer and Al is used in the cover cathode layer, the thickness of NaF or KF is preferably form 1 nm to 8 nm and the thickness of Al is preferably from 10 nm to 500 nm.

In the electroluminescence device of the present invention, when the cathode is used as a light transmitting electrode, a visible light transmittance of the cover cathode layer is preferably 40% or more, and preferably 50% or more. Such a visible light transmittance can be achieved by using a transparent conductive metal oxide such as indium tin oxide (ITO), indium zinc oxide (IZO) or molybdenum oxide as the cover cathode layer material, or adjusting the thickness of the cover cathode layer using a low resistance metal such as gold, silver, copper, aluminum, chromium, tin or lead, and alloys containing these metals to 30 nm or less. For example, in the case of a cathode structure in which the first cathode layer is made of Ba having a thickness of 5 nm, the second cathode layer is made of Al having a thickness of 1 nm and the cover cathode layer is made of Ag having a thickness of 15 nm, the visible light transmittance of the cathode becomes 50%.

For the purpose of improving the light transmittance from the cathode side, it is also possible to form an anti-reflection layer on the cover cathode layer as the cathode. The material used in the anti-reflection layer preferably has a refractive index of about 1.8 to 3.0, and examples thereof include ZnS, ZnSe and $WO_3$. The thickness of the anti-reflection layer varies depending on the combination of materials, but is usually within a range from 10 nm to 150 nm. For example, when the cathode is produced by stacking a first cathode layer made of Ba having a thickness of 5 nm, a second cathode layer made of Al having a thickness of 1 nm and a cover cathode layer made of Ag having a thickness of 15 nm, the light transmittance from the light-emitting layer side increases by about 10% by stacking an anti-reflection layer made of $WO_3$ having a thickness of 21 nm adjacent to the cover cathode layer.

<Insulating Layer>

An insulating layer having a thickness of 5 nm or less, which can be optionally included in the electroluminescence device of the present invention, has functions of improving tight adhesion with an electrode, improving of injection of charge (that is, holes or electrons) from the electrode and preventing mixing with the adjacent layer. Examples of the material of the insulating layer include metal fluorides, metal oxides and organic insulating materials (polymethyl methacrylate and the like). Examples of the electroluminescence device provided with an insulating layer having a thickness of 5 nm or less include one provided with an insulating layer having a thickness of 5 nm or less adjacent to a cathode, and one provided with an insulating layer having a thickness of 5 nm or less adjacent to an anode.

The electroluminescence device of the present invention can be produced, for example, by sequentially stacking the respective layers on a substrate. Specifically, the electroluminescence device can be produced by providing an anode on a substrate, optionally providing layers such as a hole injecting layer, a hole transporting layer and an interlayer thereon, providing a light-emitting layer thereon, optionally providing layers such as an electron transporting layer and an electron injecting layer thereon, and stacking a cathode thereon.

A display device can be produced by using the electroluminescence device of the present invention. The display device is provided with the electroluminescence device as one picture element unit. An aspect of an arrangement of the picture element unit is not particularly limited. It is possible to use an arrangement which is usually employed in a display device such as television, and it is possible to employ an aspect in which a lot of picture elements are arranged on a common substrate. In the device of the present invention, picture elements arranged on a substrate can be optionally formed in the picture element range defined in a bank.

If necessary, the device can be provided with a sealing member opposite to a substrate via a light-emitting layer. If necessary, the device can be provided with a filter such as a color filter or a fluorescence conversion filter, and any constituent element for constituting a display device, such as a circuit and a wiring required to operate the picture element.

<Photoelectric Conversion Device>

A photoelectric conversion device, which can be produced by using the layered structure of the present invention, will be described below.

The photoelectric conversion device of the present invention includes a cathode and an anode, a charge separation layer between the cathode and the anode, and a layer containing a conjugated polymer compound used in the present invention between the charge separation layer and the cathode and/or the charge separation layer and the cathode. When the photoelectric conversion device includes the layer containing a conjugated polymer compound between the anode and the charge separation layer, a first electrode is an anode, a second electrode is a cathode, and the layer containing a conjugated polymer compound is used as a hole transporting layer. When the photoelectric conversion device includes the layer containing a conjugated polymer compound between the cathode and the charge separation layer, a first electrode is a cathode, a second electrode is an anode, and the layer containing a conjugated polymer compound is used as an electron transporting layer.

The charge separation layer of the photoelectric conversion device of the present invention usually contains an electron donating compound and an electron accepting compound. The electron donating compound is exemplified by a conjugated polymer compound, and specifically a polymer compound having a thiophenediyl group and a polymer compound having a fluorenediyl group. The electron accepting compound is exemplified by fullerene and fullerene derivatives.

The photoelectric conversion device of the present invention is usually formed on a support substrate. Although the material of the support substrate is not particularly limited as long as it does not inhibit characteristics required as an organic photoelectric conversion device, a glass substrate, a flexible film substrate and a plastic substrate can be used.

The photoelectric conversion device of the present invention can be produced by a known method, for example, by the method described in Synth. Met., 102, 982 (1999), or the method described in Science, 270, 1789 (1995).

EXAMPLES

The present invention will be described in more detail by way of examples and comparative examples, but the present invention is not limited to the following examples.

A weight average molecular weight (Mw) and a number average molecular weight (Mn) of a polymer were respectively determined as a polystyrene equivalent number average molecular weight and a polystyrene equivalent weight average molecular weight using gel permeation chromatography (GPC) (HLC-8220GPC, manufactured by TOSOH CORPORATION). A sample to be measured is dissolved in tetrahydrofuran so as to give a concentration of about 0.5% by weight and 50 μL of the obtained solution is injected into GPC. Furthermore, tetrahydrofuran was used as a mobile phase of GPC and was allowed to flow at a flow rate of 0.5 mL/min. Structural analysis of the polymer was conducted by $^1$H-NMR analysis using a 300 MHz NMR spectrometer manufactured by Varian, Inc. The measurement was conducted after dissolving the sample in a deuterated solvent capable of dissolving the sample so as to give a concentration of 20 mg/mL. Orbital energy of a highest occupied molecular orbital (HOMO) of the polymer was determined from an ionization potential of the polymer, while orbital energy of a lowest unoccupied molecular orbital (LUMO) was determined from an ionization potential and an energy difference between HOMO and LUMO. In the measurement of the ionization potential, a photoelectron spectrometer (AC-2, manufactured by RIKEN KEIKI Co., Ltd.) was used. After the measurement of an absorption spectrum of the polymer using an ultraviolet/visible/near infrared spectrophotometer (Cary5E, manufactured by Varian, Inc.), the energy difference between HOMO and LUMO was determined from the absorption end.

Reference Example 1

Synthesis of 2,7-dibromo-9,9-bis(4-hexyloxy-3-ethoxycarbonylphenyl)-fluo rene (BSAFBr$_2$)

2,7-Dibromo-9-fluorenone (20.3 g), ethyl salicylate (59.8 g) and mercaptoacetic acid (0.55 g) were charged into a 300 mL flask and the atmosphere in the flask was replaced by nitrogen. Methanesulfonic acid (250 mL) was added and the mixture was stirred at 75° C. overnight. The mixture was left standing to cool and added to ice water, followed by stirring for 1 hour. The solid thus produced was removed by filtration and washed with warm acetonitrile. The mixture was recrystallized from acetone to obtain a solid. This solid (3.3 g), 1-bromohexane (2.5 g), potassium carbonate (3.5 g) and 18-crown-6 (0.4 g) were dissolved in N,N-dimethylformamide (DMF) (35 mL) and the solution was transferred to the flask, followed by stirring overnight at 105° C. The mixture was left standing to cool to room temperature and added to ice water, followed by stirring for 1 hour. The solid thus produced was collected and recrystallized from ethanol to obtain 2,7-dibromo-9,9-bis(4-hexyloxy-3-ethoxycarbonylphenyl)-fluo rene (BSAFBr$_2$).

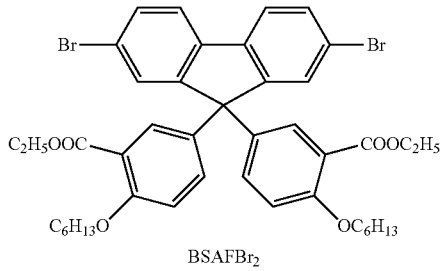

BSAFBr$_2$

Reference Example 2

Synthesis of poly(9,9-bis(4-hexyloxy-3-ethoxycarbonylphenyl)-fluorene) (BSAFP)

BSAFBr$_2$ (2.0 g) was charged into a 200 mL flask and the atmosphere in the flask was replaced by nitrogen. Dry tetrahydrofuran (75 mL) was added using a syringe and the mixture was heated to 55° C. To the mixture, 2,2'-bipyridine (0.68 g) and bis(1,5-cyclooctadiene)nickel (1.2 g) were added, followed by stirring at 55° C. for 5 hours. After the mixture was cooled to room temperature, the reaction solution was added dropwise in a mixed solution of methanol (200 mL), water (200 mL) and 15% ammonia water (50 mL). The precipitate thus produced was collected by filtration, vacuum-dried and then redissolved in toluene. The solution was filtered through celite and the filtrate was passed through an alumina column, and then the column-treated solution was concentrated under reduced pressure. To the concentrated solution, methanol was added dropwise, and the precipitate thus produced was collected and then vacuum-dried to obtain white BSAFP (752 mg) composed of a repeating unit represented by formula (A). BSAFP had a number average molecular weight (Mn) of 398,000, a weight average molecular weight (Mw) of 729,000 and a distribution (Mw/Mn) of 1.83.

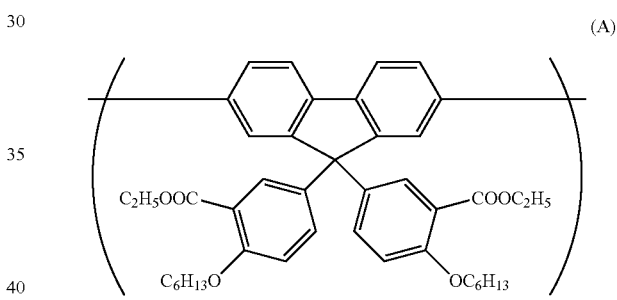

(A)

Example 1

Synthesis of BSAFP Lithium Salt (BSAFLi)

BSAFP (160 mg) was charged into a 100 mL flask and the atmosphere in the flask was replaced by nitrogen. Tetrahydrofuran (20 mL) and ethanol (20 mL) were added and the mixture was heated to 55° C. To the mixture, an aqueous solution prepared by dissolving lithium hydroxide (100 mg) in water (2 mL) was added, followed by stirring at 55° C. for 1 hour. After a solid precipitated in the reaction system, methanol (40 mL) was added, followed by stirring for another 2 hours. After the mixture was cooled to room temperature, the reaction solvent was distilled off under reduced pressure. The solid thus produced was washed with water and vacuum-dried to obtain a pale yellow solid (150 mg). NMR spectrum revealed that a signal attributed to an ethyl group at an ethyl ester site in BSAFP completely disappeared. A lithium salt of the obtained BSAFP is referred to as a conjugated polymer compound 1. The conjugated polymer compound 1 is composed of a repeating unit represented by formula (B). The conjugated polymer compound 1 had an orbital energy of HOMO of −5.78 eV and an orbital energy of LUMO of −3.14 eV.

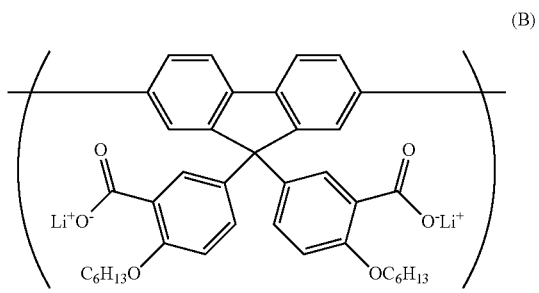

Example 2

Synthesis of BSAFP Sodium Salt (BSAFNa)

BSAFP (200 mg) was charged into a 100 mL flask and the atmosphere in the flask was replaced by nitrogen. Tetrahydrofuran (20 mL) and ethanol (20 mL) were added and the mixture was heated to 55° C. To the mixture, an aqueous solution prepared by dissolving sodium hydroxide (200 mg) in water (2 mL) was added, followed by stirring at 55° C. for 3 hours. After the mixture was cooled to room temperature, the reaction solvent was distilled off under reduced pressure. The solid thus produced was washed with water and vacuum-dried to obtain a pale yellow solid (180 mg). NMR spectrum revealed that a signal attributed to an ethyl group at an ethyl ester site in BSAFP completely disappeared. A sodium salt of the obtained BSAFP is referred to as a conjugated polymer compound 2. The conjugated polymer compound 2 is composed of a repeating unit represented by formula (C). The conjugated polymer compound 2 had an orbital energy of HOMO of −5.67 eV and an orbital energy of LUMO of −3.04 eV.

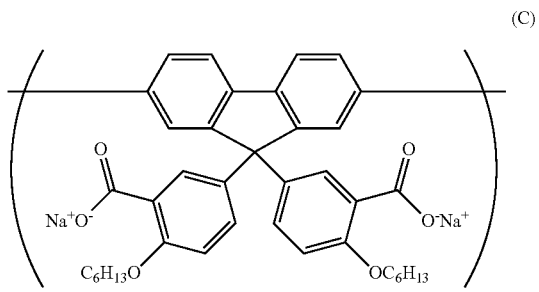

Example 3

Synthesis of BSAFP Potassium Salt (BSAFK)

BSAFP (150 mg) was charged into a 100 mL flask and the atmosphere in the flask was replaced by nitrogen. Tetrahydrofuran (20 mL) and ethanol (20 mL) were added and the mixture was heated to 55° C. To the mixture, an aqueous solution prepared by dissolving potassium hydroxide (200 mg) in water (2 mL) was added, followed by stirring at 55° C. for 3 hours. After the mixture was cooled to room temperature, the reaction solvent was distilled off under reduced pressure. The solid thus produced was washed with water and vacuum-dried to obtain a pale yellow solid (130 mg). NMR spectrum revealed that a signal attributed to an ethyl group at an ethyl ester site in BSAFP completely disappeared. A potassium salt of the obtained BSAFP is referred to as a conjugated polymer compound 3. The conjugated polymer compound 3 is composed of a repeating unit represented by formula (D). The conjugated polymer compound 3 had an orbital energy of HOMO of −5.65 eV and an orbital energy of LUMO of −3.02 eV.

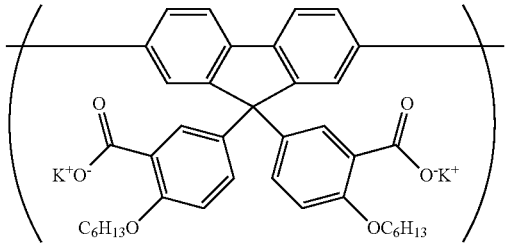

Example 4

Synthesis of BSAFP Cesium Salt (BSAFCs)

BSAFP (100 mg) was charged into a 100 mL flask and the atmosphere in the flask was replaced by nitrogen. Tetrahydrofuran (20 mL) and ethanol (20 mL) were added and the mixture was heated to 55° C. To the mixture, an aqueous solution prepared by dissolving cesium hydroxide (200 mg) in water (2 mL) was added, followed by stirring at 55° C. for 3 hours. After the mixture was cooled to room temperature, the reaction solvent was distilled off under reduced pressure. The solid thus produced was washed with water and vacuum-dried to obtain a pale yellow solid (90 mg). NMR spectrum revealed that a signal attributed to an ethyl group at an ethyl ester site in BSAFP completely disappeared. A cesium salt of the obtained BSAFP is referred to as a conjugated polymer compound 4. The conjugated polymer compound 4 is composed of a repeating unit represented by formula (E). The conjugated polymer compound 4 had an orbital energy of HOMO of −5.65 eV and an orbital energy of LUMO of −3.11 eV.

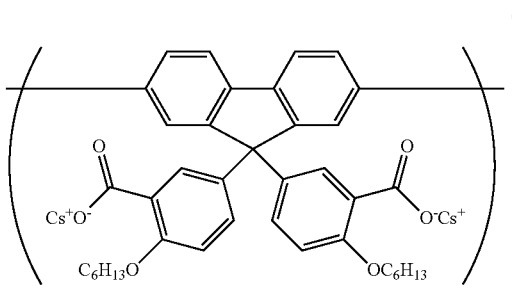

Example 5

Synthesis of BSAFP Tetramethylammonium Salt (BSAFNMe$_4$)

BSAFP (100 mg) was charged into a 100 mL flask and the atmosphere in the flask was replaced by nitrogen. Tetrahydrofuran (20 mL) and ethanol (20 mL) were added and the mixture was heated to 55° C. To the mixture, an aqueous solution prepared by dissolving tetramethylammonium hydroxide (27.3 mg) in water (2 mL) was added, followed by stirring at 55° C. for 3 hours. After the mixture was cooled to room temperature, the reaction solvent was distilled off under reduced pressure. The solid thus produced was washed with water and vacuum-dried to obtain a pale yellow solid (90 mg). NMR spectrum revealed that a signal attributed to an ethyl group at an ethyl ester site in BSAFP completely disappeared and a signal attributed to a tetramethylammonium ion appeared in place of the signal. An ammonium salt of the obtained BSAFP is referred to as a conjugated polymer compound 5. The conjugated polymer compound 5 is composed of a repeating unit represented by formula (F). The conjugated polymer compound 5 had an orbital energy of HOMO of −5.75 eV and an orbital energy of LUMO of −2.89 eV.

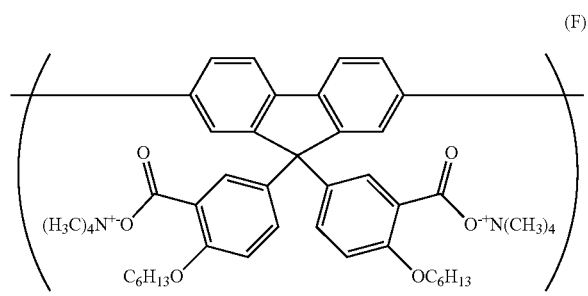

(F)

Example 6

Synthesis of Ethylene Glycol Chain-Containing BSAFP (BSAF-EG)

BSAFP (100 mg) was charged into a 100 mL flask and the atmosphere in the flask was replaced by nitrogen. Triethylene glycol monomethyl ester (20 mL), triethylene glycol dimethyl ester (20 mL) and concentrated sulfuric acid (1 mL) were added and the mixture was heated to 150° C., followed by stirring for 2 days. The mixture was cooled to room temperature and then added dropwise in a mixed solution of water (100 mL) and methanol (100 mL). The precipitate thus produced was collected by filtration and vacuum-dried to obtain a pale yellow solid (90 mg). NMR spectrum revealed that a signal attributed to an ethyl group at an ethyl ester site in BSAFP completely disappeared and a signal attributed to a triethylene glycol methyl ester appeared in place of the signal. The obtained ethylene glycol chain-containing BSAFP is referred to as a conjugated polymer compound 6. The conjugated polymer compound 6 is composed of a repeating unit represented by formula (G). The conjugated polymer compound 6 had an orbital energy of HOMO of −5.84 eV and an orbital energy of LUMO of −3.18 eV.

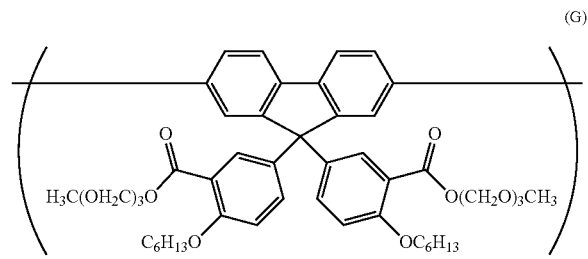

(G)

Reference Example 3

Synthesis of 2,7-bis(4,4,5,5-tetramethyl-1,3,2-dioxaborolan-2-yl)-9,9-bi s(4-hexyloxy-3-ethoxycarbonylphenyl)-fluorene (BSAFBE)

Under a nitrogen atmosphere, BSAFBr₂ (100 g), bis(pinacolate)diboron (68.08 g), [1,1′-bis(diphenylphosphino)ferrocene]dichloropalladium(II) dichloromethane complex (5.97 g), 1,1′-bis(diphenylphosphino)ferrocene (4.05 g), potassium acetate (71.75 g) and dioxane (1,300 mL) were mixed, and the mixture was heated to 110° C. and then heated at reflux for 10 hours. After being left standing to cool, the reaction solution was filtered and the filtrate was concentrated under reduced pressure. The reaction mixture was dissolved in toluene and reprecipitation was conducted by adding the solution to acetonitrile, and then the obtained precipitate was collected. The precipitate was dissolved in toluene and activated carbon was added to the solution, followed by stirring and further filtration. The obtained filtrate was concentrated under reduced pressure. Furthermore, acetonitrile and water were added, followed by stirring and filtration. The solid collected by filtration was dissolved in toluene and reprecipitated from acetonitrile to obtain 2,7-bis(4,4,5,5-tetramethyl-1,3,2-dioxaborolan-2-yl)-9,9-bi s(4-hexyloxy-3-ethoxycarbonylphenyl)-fluorene (BSAFBE) (78.6 g).

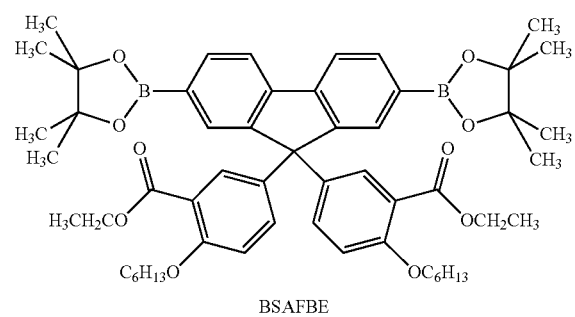

BSAFBE

Reference Example 4

Synthesis of Phenyl Group Copolymer (Polymer A (BSAF-Ph))

Under an inert atmosphere, 1,4-dibromobenzene (0.21 g), BSAFBE (0.80 g), triphenylphosphine palladium (0.01 g), methyltrioctylammonium chloride (manufactured by Aldrich under the trade name of Aliquat336®) (0.20 g) and toluene (10 mL) were mixed and heated to 105° C. To this reaction solution, an aqueous 2 M sodium carbonate (Na₂CO₃) solution (5 mL) was added dropwise and the mixed solution was refluxed for 10 hours. After the reaction, this reaction solution was cooled to room temperature and added dropwise in 120 mL of methanol and, after stirring for 1 hour, the precipitate was filtered, vacuum-dried for 2 hours and then dissolved in 20 mL of tetrahydrofuran. This solution was added dropwise in a mixed solvent of 120 mL of methanol and 50 mL of water and, after stirring for 1 hour, the precipitate was filtered, vacuum-dried for 2 hours and then dissolved in 20 mL of tetrahydrofuran. This solution was added dropwise in 120 mL of acetone and, after stirring for 30 minutes, the precipitate was filtered and vacuum-dried for 20 hours. The yield of the obtained phenyl group copolymer (polymer A (BSAF-Ph)) was 400 mg.

The polymer A (BSAF-Ph) had a polystyrene equivalent number average molecular weight of $1.2 \times 10^4$. The repeating unit contained in BSAF-Ph, which is estimated by charging, is a repeating unit represented by formula (H).

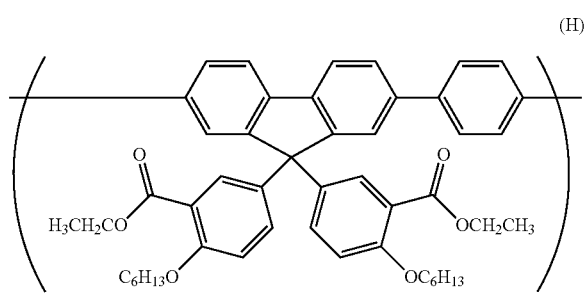

(H)

Example 7

Synthesis of Cesium Salt (BSAFCs-Ph) of Polymer A (BSAF-Ph)

The polymer A (BSAF-Ph) (200 mg) was charged into a 100 mL flask and the atmosphere in the flask was replaced by nitrogen. Tetrahydrofuran (20 mL) and ethanol (5 mL) were added and the mixture was heated to 55° C. To the mixture, an aqueous solution prepared by dissolving cesium hydroxide (200 mg) in water (1 mL) was added, followed by stirring at 55° C. for 3 hours. After the mixture was cooled to room temperature, the reaction solvent was distilled off under reduced pressure. The solid thus produced was washed with water and vacuum-dried to obtain a pale yellow solid (190 mg). NMR spectrum revealed that a signal attributed to an ethyl group at an ethyl ester site of the polymer A (BSAF-Ph) completely disappeared. A cesium salt of the obtained polymer A (BSAF-Ph) is referred to as a conjugated polymer compound 7. The conjugated polymer compound 7 is composed of a repeating unit represented by formula (1). The conjugated polymer compound 7 had an orbital energy of HOMO of −5.78 eV and an orbital energy of LUMO of −3.19 eV.

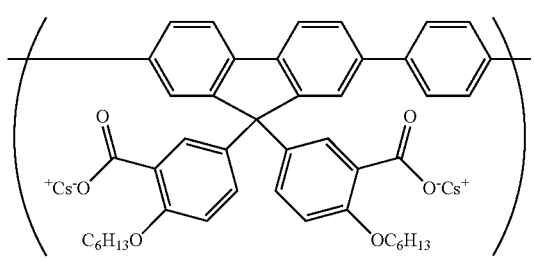

(I)

Reference Example 5

Synthesis of Pyrazine Copolymer (9:1) (Polymer B (BSAF-Pyrazine (9:1)))

Under an inert atmosphere, BSAFBr$_2$ (0.35 g), BSAFBE (0.5 g), 2,5-dibromopyrazine (0.03 g), triphenylphosphine palladium (0.002 g), methyltrioctylammonium chloride (manufactured by Aldrich under the trade name of Aliquat336®) (0.20 g) and toluene (10 mL) were mixed and heated to 105° C. To this reaction solution, an aqueous 2 M Na$_2$CO$_3$ solution (5 mL) was added dropwise and the mixed solution was refluxed for 5 hours. After the reaction, this reaction solution was cooled to room temperature and added dropwise in 120 mL of methanol and, after stirring for 1 hour, the precipitate was filtered, vacuum-dried for 2 hours and then dissolved in 20 mL of tetrahydrofuran. This solution was added dropwise in a mixed solvent of 120 mL of methanol and 50 mL of water and, after stirring for 1 hour, the precipitate was filtered, vacuum-dried for 2 hours and then dissolved in 20 mL of tetrahydrofuran. This solution was added dropwise in 120 mL of acetone and, after stirring for 30 minutes, the precipitate was filtered and vacuum-dried for 20 hours. The yield of a pyrazine copolymer (9:1) (polymer B (BSAF-pyrazine (9:1))) was 550 mg.

The polymer B (BSAF-pyrazine (9:1)) had a polystyrene equivalent number average molecular weight of 4.5×10$^4$. The polymer B (BSAF-pyrazine (9:1)) is represented by formula (J). In formula (J), m:n represents a molar ratio of repeating units.

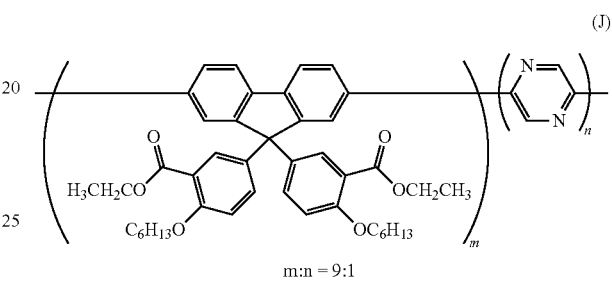

(J)

m:n = 9:1

Example 8

Synthesis of Sodium Salt (BSAFNa-Pyrazine (9:1)) of Polymer B (BSAF-Pyrazine (9:1))

The polymer B (BSAF-pyrazine (9:1)) (200 mg) was charged into a 100 mL flask and the atmosphere in the flask was replaced by nitrogen. Tetrahydrofuran (20 mL) and ethanol (5 mL) were added and the mixture was heated to 55° C. To the mixture, an aqueous solution prepared by dissolving sodium hydroxide (120 mg) in water (1 mL) was added, followed by stirring at 55° C. for 3 hours. After the mixture was cooled to room temperature, the reaction solvent was distilled off under reduced pressure. The solid thus produced was washed with water and vacuum-dried to obtain a pale yellow solid (120 mg). NMR spectrum revealed that a signal attributed to an ethyl group at an ethyl ester site of the polymer B (BSAF-pyrazine (9:1)) completely disappeared. A sodium salt of the obtained polymer B (BSAF-pyrazine (9:1)) is referred to as a conjugated polymer compound 8. The conjugated polymer compound 8 is represented by formula (K). In formula (K), m:n represents a molar ratio of repeating units. The conjugated polymer compound 8 had an orbital energy of HOMO of −5.65 eV and an orbital energy of LUMO of −3.14 eV.

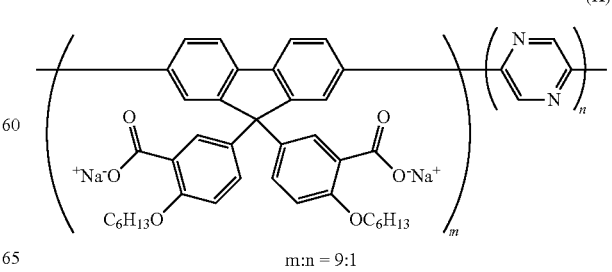

(K)

m:n = 9:1

Reference Example 6

Synthesis of Pyrazine Copolymer (99:1) (Polymer C (BSAF-Pyrazine (99:1)))

Under an inert atmosphere, BSAFBr$_2$ (0.43 g), BSAFBE (0.5 g), 2,5-dibromopyrazine (0.003 g), triphenylphosphine palladium (0.002 g), methyltrioctylammonium chloride (manufactured by Aldrich under the trade name of Aliquat336®) (0.20 g) and toluene (10 mL) were mixed and heated to 105° C. To this reaction solution, an aqueous 2 M Na$_2$CO$_3$ solution (5 mL) was added dropwise and the mixed solution was refluxed for 5 hours. After the reaction, this reaction solution was cooled to room temperature and added dropwise in 120 mL of methanol and, after stirring for 1 hour, the precipitate was filtered, vacuum-dried for 2 hours and then dissolved in 20 mL of tetrahydrofuran. This solution was added dropwise in a mixed solvent of 120 mL of methanol and 50 mL of water and, after stirring for 1 hour, the precipitate was filtered, vacuum-dried for 2 hours and then dissolved in 20 mL of tetrahydrofuran. This solution was added dropwise in 120 mL of acetone and, after stirring for 30 minutes, the precipitate was filtered and vacuum-dried for 20 hours. The yield of the pyrazine copolymer (99:1) (polymer C (BSAF-pyrazine (99:1))) was 530 mg.

The polymer C (BSAF-pyrazine (99:1)) had a polystyrene equivalent number average molecular weight of $6.8 \times 10^4$. The polymer C (BSAF-pyrazine (99:1)) is represented by formula (L). In formula (L), m:n represents a molar ratio of repeating units.

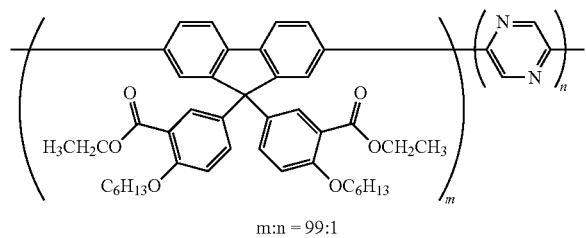

m:n = 99:1

Example 9

Synthesis of Sodium Salt (BSAFNa-Pyrazine (99:1)) of Polymer C (BSAF-Pyrazine (99:1))

The polymer C (BSAF-pyrazine (99:1)) (200 mg) was charged into a 100 mL flask and the atmosphere in the flask was replaced by nitrogen. Tetrahydrofuran (20 mL) and ethanol (5 mL) were added and the mixture was heated to 55° C. To the mixture, an aqueous solution prepared by dissolving sodium hydroxide (120 mg) in water (1 mL) was added, followed by stirring at 55° C. for 3 hours. After the mixture was cooled to room temperature, the reaction solvent was distilled off under reduced pressure. The solid thus produced was washed with water and vacuum-dried to obtain a pale yellow solid (150 mg). NMR spectrum revealed that a signal attributed to an ethyl group at an ethyl ester site of the polymer C (BSAF-pyrazine (99:1)) completely disappeared. A sodium salt of the obtained polymer C (BSAF-pyrazine (99:1)) is referred to as a conjugated polymer compound 9. The conjugated polymer compound 9 is represented by formula (M). In formula (M), m:n represents a molar ratio of repeating units. The conjugated polymer compound 9 had an orbital energy of HOMO of −5.58 eV and an orbital energy of LUMO of −2.99 eV.

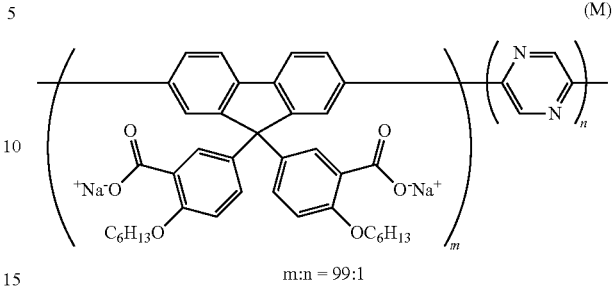

m:n = 99:1

Reference Example 7

Synthesis of N,N-bis(4-bromophenyl)-N',N'-bis(4-butylphenyl)-1,4-phenylenediamine (aromatic amine A)

Under an inert atmosphere, in a 300 mL three-necked flask, 0.24 g (0.27 mmol) of tris(dibenzylideneacetone)dipalladium, 0.22 g (0.4 mmol) of diphenylphosphinoferrocene, 2.56 g (26.7 mmol) of sodium tertiary butoxide and 125 mL of toluene were charged, followed by stirring at room temperature for 10 minutes. Subsequently, 12.9 g (26.7 mmol) of tris-(4-bromophenyl)amine was charged, followed by stirring at room temperature for 10 minutes. Thereafter, 5 g (17.8 mmol) of bis(4-butylphenyl) amine was charged, and the mixture was heated to 125° C. and refluxed for 9 hours. After the completion of the reaction, the reaction solution was filtered to remove insolubles, passed through a short column of silica gel and then purified by a silica gel column using cyclohexane as an eluent to obtain N,N-bis(4-bromophenyl)-N',N'-bis(4-butylphenyl)-1,4-phenylenediamine (aromatic amine A) (2.96 g, yield: 24%).

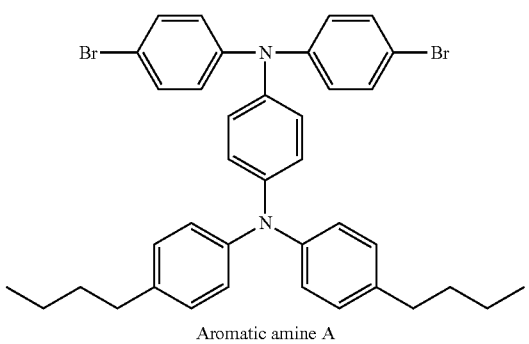 [SMILES: CCCCc1ccc(N(c2ccc(CCCC)cc2)c2ccc(N(c3ccc(Br)cc3)c3ccc(Br)cc3)cc2)cc1]

Aromatic amine A

Reference Example 8

Synthesis of Aromatic Amine A Copolymer (Polymer D (BSAF-Aromatic Amine A))

The aromatic amine A (0.21 g), 0.38 g of BSAFBr$_2$ and 390 mg of 2,2'-bipyridyl were dissolved in 28 mL of dehydrated tetrahydrofuran and 690 mg of bis(1,5-cyclooctadiene)nickel (0) was added to this solution under a nitrogen atmosphere, and then the solution was reacted for 3 hours by heating to 60° C. After the reaction, this reaction solution was cooled to room temperature and added dropwise in a mixed solution of 10 mL of 25% ammonia water, 120 mL of methanol and 50 mL of ion-exchange water. After stirring for 1 hour, the precipitate was filtered, vacuum-dried for 2 hours and then dissolved in 50 mL of toluene. To this solution, 30 mL of 1 N hydrochloric acid was added, followed by stirring at room temperature for 3 hours. After removing the aqueous layer, 30 mL of 4% ammonia water was added, followed by stirring at room temperature for 3 hours and further removal of the aqueous layer. The remaining toluene solution was reprecipitated by vaporizing with 150 mL of methanol and then insolubles were removed by filtration. Thereafter, the solution was redissolved in toluene and purified by passing through an alumina column (10 g of active alumina). The toluene solution thus collected was added dropwise in 200 mL of methanol, followed by stirring for 30 minutes. The precipitate was filtered and vacuum-dried for 2 hours. The yield of the obtained aromatic amine A copolymer (polymer D (BSAF-aromatic amine A)) was 300 mg.

The polymer D (BSAF-aromatic amine A) had a polystyrene equivalent number average molecular weight of $4.8 \times 10^4$. The polymer D (BSAF-aromatic amine A) is represented by formula (N). In formula (N), m:n represents a molar ratio of repeating units.

was replaced by nitrogen. Tetrahydrofuran (20 mL) and ethanol (10 mL) were added and the mixture was heated to 55° C. To the mixture, an aqueous solution prepared by dissolving cesium hydroxide (200 mg) in water (2 mL) was added, followed by stirring at 55° C. for 3 hours. After the mixture was cooled to room temperature, the reaction solvent was distilled off under reduced pressure. The solid thus produced was washed with water and vacuum-dried to obtain a pale yellow solid (190 mg). NMR spectrum revealed that a signal attributed to an ethyl group at an ethyl ester site of the polymer D (BSAF-aromatic amine A) completely disappeared. A cesium salt of the obtained polymer D (BSAF-aromatic amine A) is referred to as a conjugated polymer compound 10. The conjugated polymer compound 10 is represented by formula (O). In formula (O), m:n represents a molar ratio of repeating units. The conjugated polymer compound 10 had an orbital energy of HOMO of −5.63 eV and an orbital energy of LUMO of −3.02 eV.

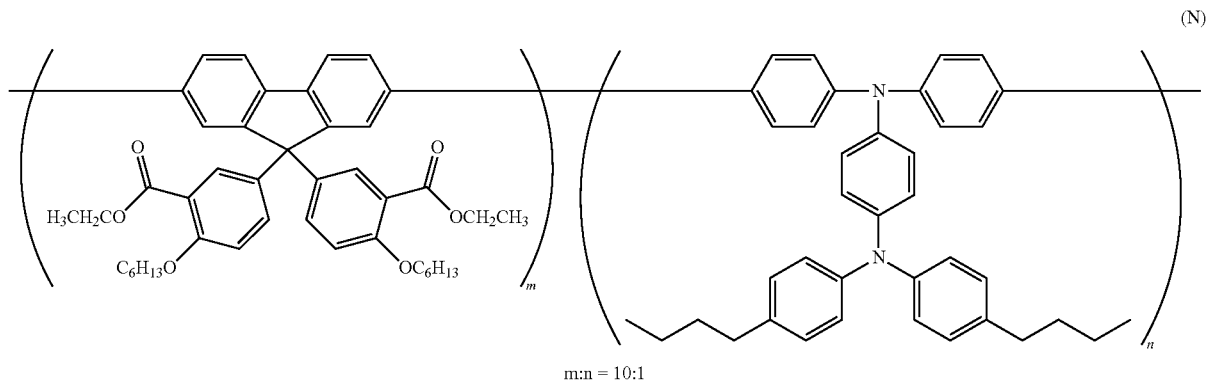

(N)

m:n = 10:1

Example 10

Synthesis of Cesium Salt (BSAFCs-Aromatic Amine A) of Polymer D (BSAF-Aromatic Amine A)

The polymer D (BSAF-aromatic amine A) (200 mg) was charged into a 100 mL flask and the atmosphere in the flask

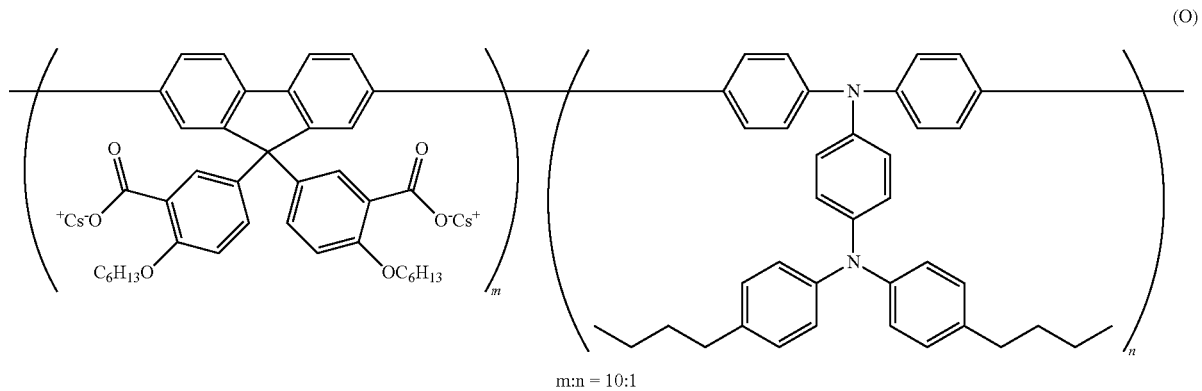

(O)

m:n = 10:1

Reference Example 9

Synthesis of Aromatic Amine B Copolymer (Polymer E (BSAF-Aromatic Amine B))

Under an inert atmosphere, $BSAFBr_2$ (0.41 g), BSAFBE (0.5 g), N,N'-bis(4-bromophenyl)-N,N'-bis(4-t-butyl-2,6-dimethylphenyl)1,4-phenylenediamine (0.11 g), triphenylphosphine palladium (0.002 g), methyltrioctylammonium chloride (manufactured by Aldrich under the trade name of Aliquat336®) (0.20 g) and toluene (10 mL) were mixed and heated to 105° C. To this reaction solution, an aqueous 2 M $Na_2CO_3$ solution (5 mL) was added dropwise and the mixed solution was refluxed for 8 hours. After the reaction, this reaction solution was cooled to room temperature and added dropwise in 120 mL of methanol and, after stirring for 1 hour, the precipitate was filtered, vacuum-dried for 2 hours and then dissolved in 20 mL of tetrahydrofuran. This solution was added dropwise in a mixed solvent of 120 mL of methanol and 50 mL of water and, after stirring for 1 hour, the precipitate was filtered, vacuum-dried for 2 hours and then dissolved in 20 mL of tetrahydrofuran. This solution was added dropwise in 120 mL of acetone and, after stirring for 30 minutes, the precipitate was filtered and vacuum-dried for 20 hours. The yield of the obtained aromatic amine B copolymer (polymer E (BSAF-aromatic amine B)) was 400 mg.

The polymer E (BSAF-aromatic amine B) had a polystyrene equivalent number average molecular weight of $3.6 \times 10^5$. The polymer E (BSAF-aromatic amine B) is represented by formula (P). In formula (P), m:n represents a molar ratio of repeating units.

N,N'-bis(4-bromophenyl)-N,N'-bis(4-t-butyl-2,6-dimethylphenyl)1,4-phenylenediamine can be synthesized, for example, by the method described in Synthesis Example 1 of Japanese Unexamined Patent Publication (Kokai) No. 2008-74917.

Example 11

Synthesis of Cesium Salt (BSAFCs-Aromatic Amine B) of Polymer E (BSAF-Aromatic Amine B)

The polymer E (BSAF-aromatic amine B) (200 mg) was charged into a 100 mL flask and the atmosphere in the flask was replaced by nitrogen. Tetrahydrofuran (20 mL) and ethanol (5 mL) were added and the mixture was heated to 55° C. To the mixture, an aqueous solution prepared by dissolving cesium hydroxide (200 mg) in water (1 mL) was added, followed by stirring at 55° C. for 3 hours. After the mixture was cooled to room temperature, the reaction solvent was distilled off under reduced pressure. The solid thus produced was washed with water and vacuum-dried to obtain a pale yellow solid (160 mg). NMR spectrum revealed that a signal attributed to an ethyl group at an ethyl ester site of the polymer E (BSAF-aromatic amine B) completely disappeared. A cesium salt of the obtained polymer E (BSAF-aromatic amine B) is referred to as a conjugated polymer compound 11. The conjugated polymer compound 11 is represented by formula (Q). In formula (Q), m:n represents a molar ratio of repeating units. The conjugated polymer compound 11 had an orbital energy of HOMO of −5.21 eV and an orbital energy of LUMO of −2.62 eV.

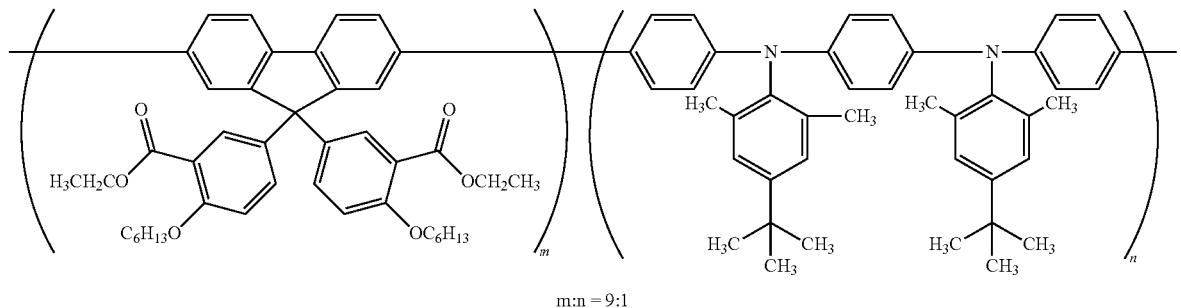

(P)

m:n = 9:1

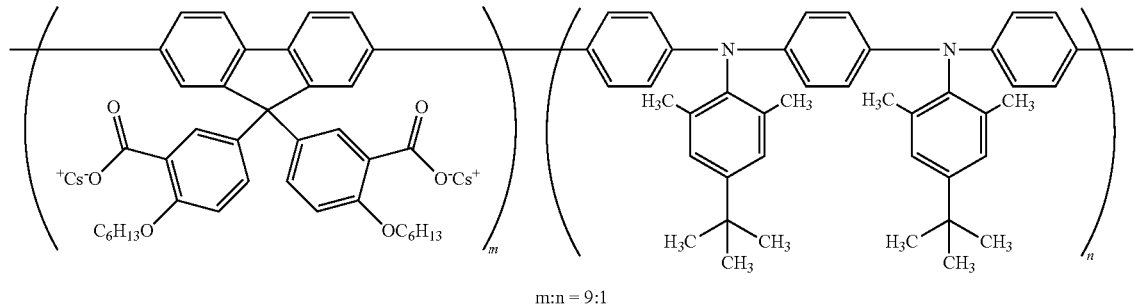

(Q)

m:n = 9:1

Reference Example 10

Synthesis of Amino Group-Containing Fluorene Polymer (Polymer F (BSAF-FN))

Under an inert atmosphere, BSAFBr₂ (0.41 g), BSAFBE (0.5 g), 2,7-dibromo-9,9-bis(4-N,N-diethylaminophenyl)-fluorene (0.08 g), triphenylphosphine palladium (0.002 g), methyltrioctylammonium chloride (manufactured by Aldrich under the trade name of Aliquat336®) (0.20 g) and toluene (10 mL) were mixed and heated to 105° C. To this reaction solution, an aqueous 2 M $Na_2CO_3$ solution (5 mL) was added dropwise and the mixed solution was refluxed for 7 hours. After the reaction, this reaction solution was cooled to room temperature and added dropwise in 120 mL of methanol and, after stirring for 1 hour, the precipitate was filtered, vacuum-dried for 2 hours and then dissolved in 20 mL of tetrahydrofuran. This solution was added dropwise in a mixed solvent of 120 mL of methanol and 50 mL of water and, after stirring for 1 hour, the precipitate was filtered, vacuum-dried for 2 hours and then dissolved in 20 mL of tetrahydrofuran. This solution was added dropwise in 120 mL of acetone and, after stirring for 30 minutes, the precipitate was filtered and vacuum-dried for 20 hours. The yield of the obtained amino group-containing fluorene polymer (polymer F (BSAF-FN)) was 430 mg.

The polymer F (BSAF-FN) had a polystyrene equivalent number average molecular weight of $1.2 \times 10^4$. The polymer F (BSAF-FN) is represented by formula (R). In formula (R), m:n represents a molar ratio of repeating units.

Example 12

Synthesis of Cesium Salt (BSAFCs-FN) of Polymer F (BSAF-FN)

The polymer F (BSAF-FN) (200 mg) was charged into a 100 mL flask and the atmosphere in the flask was replaced by nitrogen. Tetrahydrofuran (20 mL) and ethanol (5 mL) were added and the mixture was heated to 55° C. To the mixture, an aqueous solution prepared by dissolving cesium hydroxide (200 mg) in water (1 mL) was added, followed by stirring at 55° C. for 3 hours. After the mixture was cooled to room temperature, the reaction solvent was distilled off under reduced pressure. The solid thus produced was washed with water and vacuum-dried to obtain a pale yellow solid (180 mg). NMR spectrum revealed that a signal attributed to an ethyl group at an ethyl ester site of the polymer F (BSAF-FN) completely disappeared. A cesium salt of the obtained polymer F (BSAF-FN) is referred to as a conjugated polymer compound 12. The conjugated polymer compound 12 is represented by formula (S). In formula (S), m:n represents a

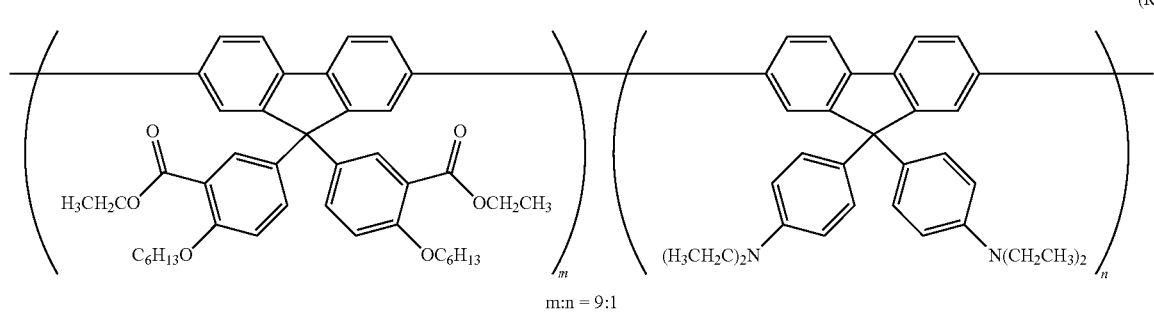

(R)

m:n = 9:1

2,7-Dibromo-9,9-bis(4-N, N-diethylaminophenyl)-fluorene can be synthesized, for example, by the method described in Polymer, Vol. 49, page 218 (2008).

molar ratio of repeating units. The conjugated polymer compound 12 had an orbital energy of HOMO of −5.53 eV and an orbital energy of LUMO of −2.76 eV.

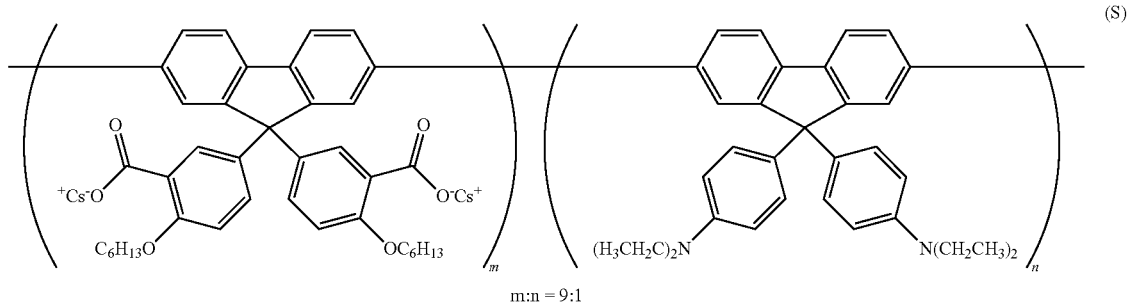

(S)

m:n = 9:1

Reference Example 11

Synthesis of 2,7-dibromo-9,9-bis[3,4-bis[2-[2-(2-methoxyethoxy)ethoxy]ethoxy]phenyl]fluorene (FEGBr$_2$)

Under an inert atmosphere, 2,7-dibromofluorenone (50 g) and catechol (345 g) were mixed and heated to 130° C. 3-Mercaptopropionic acid (1.96 g) and sulfuric acid (7 g) were added, and the mixture was reacted at 130° C. for 1.5 hours. The reaction solution was left standing to cool and poured into water (2 L), and the precipitated crystal was collected by filtration. The obtained crystal was dissolved in ethanol and filtered, and then the filtrate was concentrated and reprecipitated by adding the concentrated solution to water. The solid thus produced was collected by filtration, dissolved in toluene and filtered. Thereafter, ethanol was added and the solution was added dropwise in hexane, followed by cooling to 5° C. The solid thus produced was collected by filtration and then vacuum-dried to obtain a white solid. Under an inert atmosphere, 20 g of the white solid, triethylene glycol monomethyl ester tosylate (72 g), anhydrous potassium carbonate (52 g) and acetonitrile (500 mL) were mixed, followed by stirring under heating and reflux for 4 hours. After being left standing to cool, the reaction solution was filtered and the filtrate was concentrated under reduced pressure. The reaction mixture was purified by silica gel chromatography using ethyl acetate as an eluent and then silica gel chromatography using a mixed solvent of THF and ethyl acetate to obtain 2,7-dibromo-9,9-bis[3,4-bis[2-[2-(2-methoxyethoxy)ethoxy]ethoxy]phenyl]fluorene (FEGBr$_2$) (18 g, yield: 43.2%).

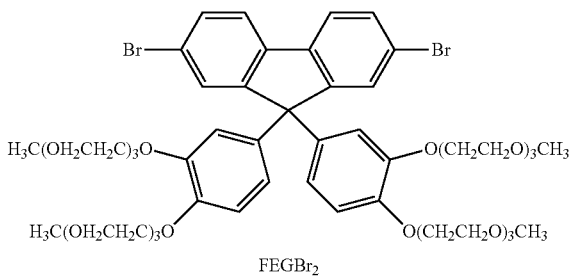

FEGBr$_2$

Reference Example 12

Synthesis of Ethylene Glycol Chain-Containing Fluorene Copolymer (Polymer G (BSAF-FEG))

Under an inert atmosphere, FEGBr$_2$ (0.80 g), BSAFBE (0.98 g), triphenylphosphine palladium (0.01 g), methyltrioctylammonium chloride (manufactured by Aldrich under the trade name of Aliquat336®) (0.20 g) and toluene (10 mL) were mixed and heated to 105° C. To this reaction solution, an aqueous 2 M Na$_2$CO$_3$ solution (5 mL) was added dropwise and the mixed solution was refluxed for 10 hours. After the reaction, this reaction solution was cooled to room temperature and added dropwise in 120 mL of methanol and, after stirring for 1 hour, the precipitate was filtered, vacuum-dried for 2 hours and then dissolved in 20 mL of tetrahydrofuran. This solution was added dropwise in a mixed solvent of 120 mL of methanol and 50 mL of water and, after stirring for 1 hour, the precipitate was filtered, vacuum-dried for 2 hours and then dissolved in 20 mL of tetrahydrofuran. This solution was added dropwise in 120 mL of acetone and, after stirring for 30 minutes, the precipitate was filtered and vacuum-dried for 20 hours. The yield of the obtained ethylene glycol chain-containing fluorene copolymer (polymer G (BSAF-FEG)) was 920 mg.

BSAF-FEG had a polystyrene equivalent number average molecular weight of 1.2×10$^4$. The polymer G (BSAF-FEG) is composed of a repeating unit represented by formula (T).

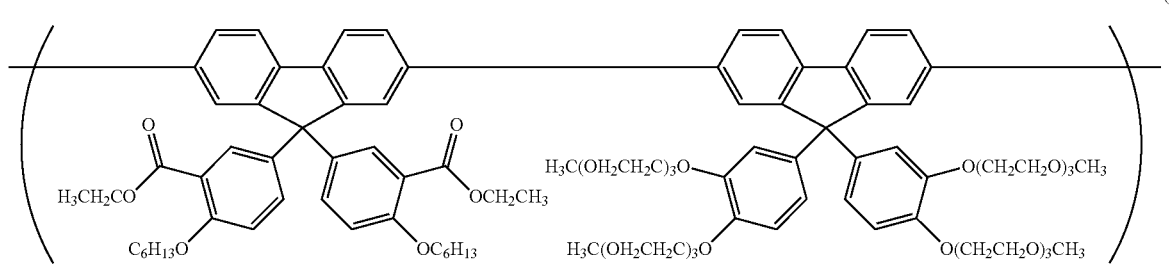

(T)

Example 13

Synthesis of Cesium Salt (BSAFCs-FEG) of Polymer G (BSAF-FEG)

The polymer G (BSAFCs-FEG) (200 mg) was charged into a 100 mL flask and the atmosphere in the flask was replaced by nitrogen. Tetrahydrofuran (20 mL) and ethanol (5 mL) were added and the mixture was heated to 55° C. To the mixture, an aqueous solution prepared by dissolving cesium hydroxide (200 mg) in water (1 mL) was added, followed by stirring at 55° C. for 3 hours. After the mixture was cooled to room temperature, the reaction solvent was distilled off under reduced pressure. The solid thus produced was washed with water and vacuum-dried to obtain a pale yellow solid (170 mg). NMR spectrum revealed that a signal attributed to an ethyl group at an ethyl ester site of the polymer G (BSAFCs-FEG) completely disappeared. A cesium salt of the obtained polymer G (BSAFCs-FEG) is referred to as a conjugated polymer compound 13. The conjugated polymer compound 13 is composed of a repeating unit represented by formula (U). The conjugated polymer compound 13 had an orbital energy of HOMO of −5.52 eV and an orbital energy of LUMO of −2.91 eV.

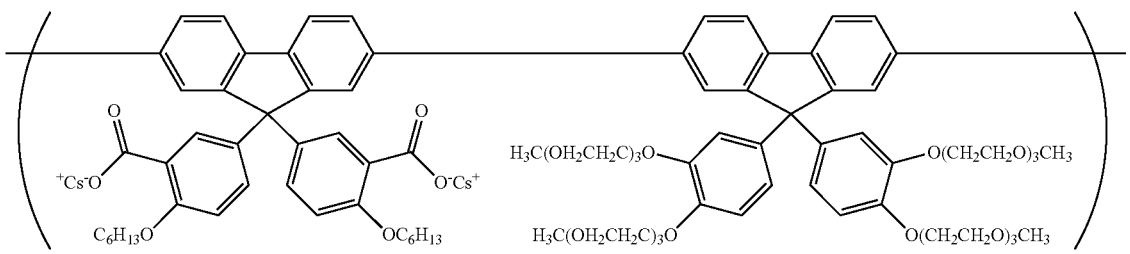

(U)

Reference Example 13

Synthesis of (2,7-dibromo)-9H-fluorene-9,9-dipropionic acid dibutyl ester (F2COOBuBr$_2$)

After 2,7-dibromofluorene (8.02 g) and benzyltriethylammonium chloride (0.56 g) were dissolved in 30 mL of benzene, 8 mL of an aqueous 50% sodium hydroxide solution was added dropwise under a nitrogen atmosphere, followed by stirring for 15 minutes. N-butyl acrylate (12.65 g) was added dropwise and the mixture was reacted at room temperature for 5 hours. The reaction solution was diluted with 200 mL of ethyl acetate, washed three times with water, washed once with brine, and then the organic layer was dried over magnesium sulfate. The solution was filtered and the solvent was distilled off. The solution was purified by silica gel column chromatography using dichloromethane as an eluent and then recrystallized from hexane to obtain (2,7-dibromo)-9H-fluorene-9,9-dipropionic acid (F2COOBuBr$_2$) (7.87 g, 55%).

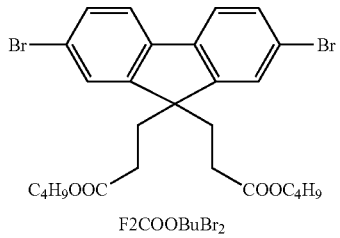

F2COOBuBr$_2$

Reference Example 14

Synthesis of Carboxylic Acid Group-Containing Fluorene Polymer (Polymer H (F8-F2COOBu))

Under an inert atmosphere, 2,7-bis(1,3,2-dioxaborolan-2-yl)-9,9-dioctylfluorene (1.00 g), F2COOBuBr$_2$ (1.09 g), triphenylphosphine palladium (0.03 g), methyltrioctylammonium chloride (manufactured by Aldrich under the trade name of Aliquat336®) (0.20 g, manufactured by Aldrich) and toluene (20 mL) were mixed and heated to 105° C. To this reaction solution, an aqueous 2 M Na$_2$CO$_3$ solution (5 mL) was added dropwise and the mixed solution was refluxed for 4 hours. After the reaction, this reaction solution was cooled to room temperature and added dropwise in 120 mL of methanol and, after stirring for 1 hour, the precipitate was filtered, vacuum-dried for 2 hours and then dissolved in 20 mL of tetrahydrofuran. This solution was added dropwise in a mixed solvent of 120 mL of methanol and 50 mL of water and, after stirring for 1 hour, the precipitate was filtered, vacuum-dried for 2 hours and then dissolved in 20 mL of tetrahydrofuran. This solution was added dropwise in 120 mL of acetone and, after stirring for 30 minutes, the precipitate was filtered and vacuum-dried for 20 hours. The yield of the obtained carboxylic acid group-containing fluorene polymer (polymer H (F8-F2COOBu)) was 300 mg.

The polymer H (F8-F2COOBu) had a polystyrene equivalent number average molecular weight of $3.5 \times 10^4$. The polymer H (F8-F2COOBu) is composed of a repeating unit represented by formula (V).

(V)

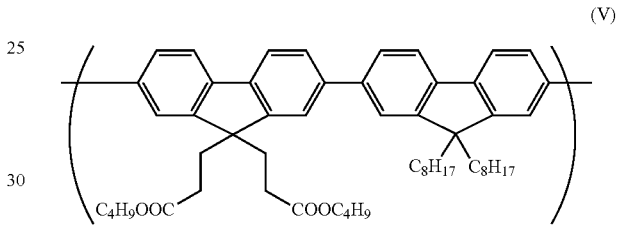

Example 14

Synthesis of Carboxylic Acid Group-Containing Fluorene Polymer Sodium Salt (F8-F2COONa)

The polymer H (F8-F2COOBu) (200 mg) was charged into a 100 mL flask and the atmosphere in the flask was replaced by nitrogen. Tetrahydrofuran (20 mL) and ethanol (5 mL) were added and the mixture was heated to 55° C. To the mixture, an aqueous solution prepared by dissolving sodium hydroxide (120 mg) in water (1 mL) was added, followed by stirring at 55° C. for 3 hours. After the mixture was cooled to room temperature, the reaction solvent was distilled off under reduced pressure. The solid thus produced was washed with water and vacuum-dried to obtain a pale yellow solid (120 mg). NMR spectrum revealed that a signal attributed to a butyl group at a butyl ester site of the polymer H (F8-F2COOBu) completely disappeared. A sodium salt of the obtained polymer H (F8-F2COOBu) is referred to as a conjugated polymer compound 14. The conjugated polymer compound 14 is composed of a repeating unit represented by formula (W). The conjugated polymer compound 14 had an orbital energy of HOMO of −5.56 eV and an orbital energy of LUMO of −2.75 eV.

(W)

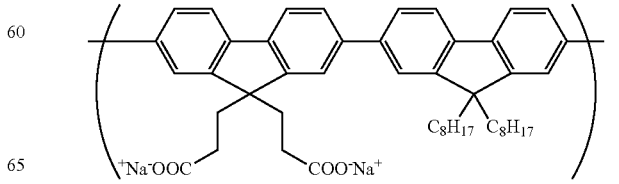

Reference Example 15

Synthesis of Carboxylic Acid Group-Containing Phenylene Polymer (polymer I (F8-PhCOOMe))

Under an inert atmosphere, 2,7-bis(1,3,2-dioxaborolan-2-yl)-9,9-dioctylfluorene (1.00 g), methyl 2,5-dibromobenzoate (manufactured by Aldrich) (0.52 g), tris(dibenzylideneacetone)dipalladium (0.01 g), methyltrioctylammonium chloride (manufactured by Aldrich under the trade name of Aliquat336®) (0.20 g, manufactured by Aldrich) and toluene (20 mL) were mixed and heated to 105° C. To this reaction solution, an aqueous 2 M $Na_2CO_3$ solution (5 mL) was added dropwise and the mixed solution was refluxed for 4 hours. After the reaction, this reaction solution was cooled to room temperature and added dropwise in 120 mL of methanol and, after stirring for 1 hour, the precipitate was filtered, vacuum-dried for 2 hours and then dissolved in 20 mL of tetrahydrofuran. This solution was added dropwise in a mixed solvent of 120 mL of methanol and 50 mL of water and, after stirring for 1 hour, the precipitate was filtered, vacuum-dried for 2 hours and then dissolved in 20 mL of tetrahydrofuran. This solution was added dropwise in 120 mL of acetone and, after stirring for 30 minutes, the precipitate was filtered and vacuum-dried for 20 hours. The yield of the obtained carboxylic acid group-containing phenylene polymer (polymer I (F8-PhCOOMe)) was 300 mg.

The polymer I (F8-PhCOOMe) had a polystyrene equivalent number average molecular weight of $3.5\times10^4$. The polymer I (F8-PhCOOMe) is composed of a repeating unit represented by formula (X).

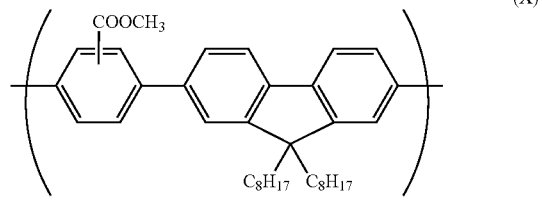

(X)

Example 15

Synthesis of Carboxylic Acid Group-Containing Phenylene Polymer Cesium Salt (F8-PhCOOCs)

The polymer I (F8-PhCOOMe) (160 mg) was charged into a 100 mL flask and the atmosphere in the flask was replaced by nitrogen. Tetrahydrofuran (20 mL) and ethanol (5 mL) were added and the mixture was heated to 55° C. To the mixture, an aqueous solution prepared by dissolving cesium hydroxide (120 mg) in water (1 mL) was added, followed by stirring at 55° C. for 3 hours. After the mixture was cooled to room temperature, the reaction solvent was distilled off under reduced pressure. The solid thus produced was washed with water and vacuum-dried to obtain a pale yellow solid (110 mg). NMR spectrum revealed that a signal attributed to a methyl group at a methyl ester site of polymer I (F8-PhCOOMe) completely disappeared. A sodium salt of the obtained polymer I (F8-PhCOOMe) is referred to as a conjugated polymer compound 15. The conjugated polymer compound 15 is composed of a repeating unit represented by formula (Y). The conjugated polymer compound 15 had an orbital energy of HOMO of $-5.72$ eV and an orbital energy of LUMO of $-2.93$ eV.

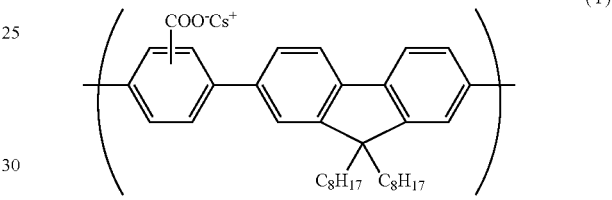

(Y)

Reference Example 16

Synthesis of Polyurethane Sodium Salt (Non-Conjugated Ion-Na)

1,3-Butanediol (1.0 g), dibutyltindilaurate (7.5 mg) and dimethylolpropionic acid (0.5 g) were charged into a 100 mL flask and DMF (50 mL) was added, followed by stirring at 90° C. for 30 minutes. Isophorone diisocyanate (3.3 g) was added, followed by heating at 90° C. for 3 hours. The temperature was decreased to 60° C. and the mixture was neutralized by adding an aqueous 1 M sodium hydroxide solution. After the mixture was stirred at 60° C. for another 1 hour, the solvent was distilled off to obtain a white solid (2.0 g). The obtained polyurethane sodium salt is referred to as a non-conjugated polymer compound 1. The non-conjugated polymer compound 1 is composed of a repeating unit represented by formula (Z).

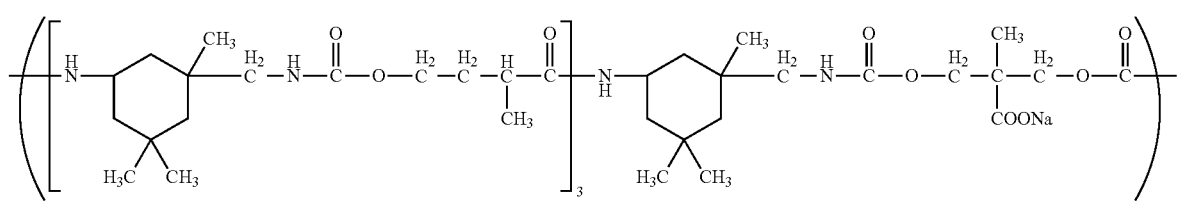

(Z)

Example 16

Electroluminescence Device

To an ITO anode of a glass substrate with a film of ITO formed and patterned thereon, a hole injecting material solution was applied by a spin coating method to form a hole injecting layer having a thickness of 60 nm.

The glass substrate with the layer formed thereon was heated in air at 200° C. for 10 minutes to insolubilize the hole injecting layer, and then the substrate was naturally cooled to room temperature to obtain a hole injecting layer.

As the hole injecting material solution, a PEDOT:PSS solution manufactured by Starck-V TECH Ltd. (poly(3,4-ethylenedioxythiophene)polystyrenesulfonic acid, "trade name: Baytron") was used.

Next, a hole transporting polymer material was mixed with xylene to obtain a composition for formation of a hole transporting layer, containing 0.7% by weight of the hole transporting polymer material. The hole transporting polymer material was synthesized by the following method.

Into a 1 L three-necked round bottom flask equipped with a reflux condenser and an overhead stirrer, 2,7-bis(1,3,2-dioxyborole)-9,9-di(1-octyl)fluorene (3.863 g, 7.283 mmol), N,N-di(p-bromophenyl)-N-(4-(butan-2-yl)phenyl)amine (3.177 g, 6.919 mmol) and di(4-bromophenyl)benzocyclobutaneamine (156.3 mg, 0.364 mmol) were charged. Methyltrioctylammonium chloride (manufactured by Aldrich under the trade name of Aliquat336®) (2.29 g) was added and then 50 mL of toluene was added. After adding a $PdCl_2$ $(PPh_3)_2$ catalyst (4.9 mg), the mixture was stirred in an oil bath of 105° C. for 15 minutes. An aqueous sodium carbonate solution (2.0 M, 14 mL) was added and the reaction product was stirred in an oil bath of 105° C. for 16.5 hours. Then, phenylboronic acid (0.5 g) was added and the reaction product was stirred for 7 hours. The aqueous layer was removed and the organic layer was washed with 50 mL of water. The organic layer was returned to the reaction flask, and 0.75 g of sodium diethyldithiocarbamate and 50 mL of water were added. The reaction product was stirred in an oil bath of 85° C. for 16 hours. The aqueous layer was removed, and the organic layer was washed three times with 100 mL of water and then passed through a column of silica gel and basic alumina. Then, the operation of precipitating a polymer in methanol from a toluene solution containing the polymer was repeated twice and the polymer was vacuum-dried at 60° C. to obtain 4.2 g of a hole transporting polymer. The hole transporting polymer material had a polystyrene equivalent weight average molecular weight of 124,000 and a distribution of (Ww/Mn) of 2.8.

To the hole injecting layer of the substrate with the hole injecting layer formed thereon obtained above, a composition for formation of a hole transporting layer was applied by a spin coating method to obtain a coating film having a thickness of 20 nm.

The substrate with the coating film formed thereon was heated under an inert (nitrogen) atmosphere at 190° C. for 20 minutes to insolubilize the coating film, and then naturally cooled to room temperature to obtain a hole transporting layer.

Then, a luminous polymer material ("BP361", manufactured by Sumation Co., Ltd.) was mixed with xylene to obtain a composition for formation of a light-emitting layer, containing 1.4% by weight of the luminous polymer material.

To the hole transporting layer of the substrate with the hole transporting layer formed thereon obtained above, a composition for formation of a light-emitting layer was applied by a spin coating method to obtain a coating film having a thickness of 80 nm.

This substrate with the coating film formed thereon was heated under an inert (nitrogen) atmosphere at 130° C. fro 20 minutes to vaporize the solvent, and then naturally cooled to room temperature to obtain a light-emitting layer.

A solvent obtained by mixing methanol and tetrahydrofuran in a volume ratio of 9:1 (solubility parameter: 12.5) was mixed with the conjugated polymer compound 1 to obtain a composition containing 0.2% by weight of the conjugated polymer compound 1.

To the light-emitting layer of the substrate with the light-emitting layer formed thereon obtained above, the above composition was applied by a spin coating method to obtain a coating film having a thickness of 10 nm.

This substrate with the coating film formed thereon was heated under an inert (nitrogen) atmosphere at 100° C. for 10 minutes to vaporize the solvent, and then naturally cooled to room temperature to obtain a layer containing the conjugated polymer compound 2.

The substrate with the layer containing the conjugated polymer compound 1 formed thereon obtained above was inserted into a vacuum device and an Al film having a thickness of 80 nm was formed by a vacuum deposition method to form a cathode, and thus a layered structure 1 was produced.

The substrate with the cathode formed thereon obtained above was taken out from the vacuum device and then sealed with sealing glass and a two-component epoxy resin under an inert (nitrogen) atmosphere to obtain an electroluminescence device 1.

Example 16

The operation was conducted in the same manner as in Example 15 except that the conjugated polymer compound 2 was used in place of the conjugated polymer compound 1, and an electroluminescence device 2 was obtained.

Example 17

The operation was conducted in the same manner as in Example 15 except that the conjugated polymer compound 3 was used in place of the conjugated polymer compound 1, and an electroluminescence device 3 was obtained.

Example 18

The operation was conducted in the same manner as in Example 15 except that the conjugated polymer compound 4 was used in place of the conjugated polymer compound 1, and an electroluminescence device 4 was obtained.

Example 19

The operation was conducted in the same manner as in Example 15 except that the conjugated polymer compound 5 was used in place of the conjugated polymer compound 1, and an electroluminescence device 5 was obtained.

Example 20

The operation was conducted in the same manner as in Example 15 except for the formation of a layer containing a conjugated polymer compound, and an electroluminescence device 6 was obtained. Regarding the layer containing a conjugated polymer compound, a solvent obtained by mixing methanol and tetrahydrofuran in a volume ratio of 1:1 (solubility parameter 11.0) was mixed with the conjugated polymer compound 6 to obtain a composition containing 0.2% by weight of the conjugated polymer compound 6 and the composition was applied to a light-emitting layer of a substrate with the light-emitting layer formed thereon by a spin coating method to form a layer having a thickness of 10 nm.

Example 21

The operation was conducted in the same manner as in Example 15 except that the conjugated polymer compound 7 was used in place of the conjugated polymer compound 1, and an electroluminescence device 7 was obtained.

Example 22

The operation was conducted in the same manner as in Example 15 except that the conjugated polymer compound 8 was used in place of the conjugated polymer compound 1, and an electroluminescence device 8 was obtained.

Example 23

The operation was conducted in the same manner as in Example 15 except that the conjugated polymer compound 9 was used in place of the conjugated polymer compound 1, and an electroluminescence device 9 was obtained.

Example 24

The operation was conducted in the same manner as in Example 15 except that the conjugated polymer compound 10 was used in place of the conjugated polymer compound 1, and an electroluminescence device 10 was obtained.

Example 25

The operation was conducted in the same manner as in Example 15 except that the conjugated polymer compound 11 was used in place of the conjugated polymer compound 1, and an electroluminescence device 11 was obtained.

Example 26

The operation was conducted in the same manner as in Example 15 except that the conjugated polymer compound 12 was used in place of the conjugated polymer compound 1, and an electroluminescence device 12 was obtained.

Example 27

The operation was conducted in the same manner as in Example 15 except that the conjugated polymer compound 13 was used in place of the conjugated polymer compound 1, and an electroluminescence device 13 was obtained.

Example 28

The operation was conducted in the same manner as in Example 15 except that the conjugated polymer compound 14 was used in place of the conjugated polymer compound 1, and an electroluminescence device 14 was obtained.

Example 29

The operation was conducted in the same manner as in Example 15 except that the conjugated polymer compound 15 was used in place of the conjugated polymer compound 1, and an electroluminescence device 15 was obtained.

Comparative Example 1

The operation was conducted in the same manner as in Example 7 except that the layer containing the conjugated polymer compound 1 was not formed, and an electroluminescence device 16 was obtained.

Comparative Example 2

The operation was conducted in the same manner as in Example 7 except that the non-conjugated polymer compound 1 was used in place of the conjugated polymer compound 1, and an electroluminescence device 17 was obtained.

10 V of a forward voltage was applied to the electroluminescence devices 1 to 17 obtained above and a light-emission luminance and luminous efficiency were measured. The results are shown in Table 1.

TABLE 1

|  | Conjugated polymer compound in layer containing conjugated polymer compound | Luminance (cd/m$^2$) | Efficiency (cd/A) |
| --- | --- | --- | --- |
| Example 15 (Electroluminescence device 1) | Conjugated polymer compound 1 | 729 | 1.3 |
| Example 16 (Electroluminescence device 2) | Conjugated polymer compound 2 | 290 | 4.8 |
| Example 17 (Electroluminescence device 3) | Conjugated polymer compound 3 | 1315 | 4.2 |
| Example 18 (Electroluminescence device 4) | Conjugated polymer compound 4 | 361 | 4.7 |
| Example 19 (Electroluminescence device 5) | Conjugated polymer compound 5 | 807 | 5.3 |
| Example 20 (Electroluminescence device 6) | Conjugated polymer compound 6 | 300 | 2.9 |
| Example 21 (Electroluminescence device 7) | Conjugated polymer compound 7 | 8316 | 5.1 |
| Example 22 (Electroluminescence device 8) | Conjugated polymer compound 8 | 282 | 2.7 |

TABLE 1-continued

| | Conjugated polymer compound in layer containing conjugated polymer compound | Luminance (cd/m²) | Efficiency (cd/A) |
|---|---|---|---|
| Example 23 (Electroluminescence device 9) | Conjugated polymer compound 9 | 1373 | 2.2 |
| Example 24 (Electroluminescence device 10) | Conjugated polymer compound 10 | 4208 | 4.5 |
| Example 25 (Electroluminescence device 11) | Conjugated polymer compound 11 | 195 | 0.6 |
| Example 26 (Electroluminescence device 12) | Conjugated polymer compound 12 | 7862 | 4.0 |
| Example 27 (Electroluminescence device 13) | Conjugated polymer compound 13 | 16736 | 5.8 |
| Example 28 (Electroluminescence device 14) | Conjugated polymer compound 14 | 124 | 1.8 |
| Example 29 (Electroluminescence device 15) | Conjugated polymer compound 15 | 301 | 1.1 |
| Comparative Example 1 (Electroluminescence device 16) | None | 0.8 | 0.1 |
| Comparative Example 2 (Electroluminescence device 17) | Non-conjugated polymer compound 1 | 10 | 1.5 |

As is apparent from Table 1, an electroluminescence device containing a layered structure of the present invention is remarkably excellent in the light-emission luminance as compared with an electroluminescence device which does not contain the layered structure.

INDUSTRIAL APPLICABILITY

Since an electroluminescence device with high luminance can be produced by the layered structure of the present invention, the present invention is industrially extremely useful.

The invention claimed is:

1. A layered structure comprising a first electrode and a second electrode, a light-emitting layer or a charge separation layer between the first electrode and the second electrode, and a layer containing a conjugated polymer compound between the light-emitting layer or the charge separation layer and the first electrode, wherein the first electrode is a cathode and wherein the conjugated polymer compound contains one or more repeating units selected from the group consisting of a repeating unit represented by formula (1) and a repeating unit represented by formula (3):

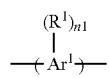
(1)

wherein $Ar^1$ represents a divalent aromatic group, $R^1$ represents a substituent group having a group represented by formula (2), $Ar^1$ may have a substituent group other than $R^1$, n1 represents an integer of 1 or more and, when a plurality of $R^1$s are present, they may be the same or different;

(2)

wherein $R^2$ represents a 1,3-phenylene group which has a substituent selected from the group consisting of (1) an alkyl group in which a hydrogen atom may be substituted with a fluorine atom and (2) an alkoxy group which may have a substituent, $Q^1$ represents a divalent organic group which may have a substituent group, $Y^1$ represents a carbocation, an ammonium cation, a phosphonyl cation or a sulfonyl cation, $M^1$ represents $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$, $Z^1$ represents a metal ion or an ammonium ion which may have a substituent group, c1 represents 1, n2 represents 0, a1 represents an integer of 1 or more, b1 represents an integer of 0 or more, a1 and b1 are selected so that the charge of the substituent group represented by formula (2) is 0, $R^a$ represents an alkyl group having 1 to 30 carbon atoms, which may have a substituent group, or an aryl group having 6 to 50 carbon atoms, which may have a substituent group, when a plurality of $Q^1$s are present, they may be the same or different, when a plurality of $M^1$s are present, they may be the same or different, and when a plurality of $Z^1$s are present, they may be the same or different;

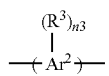
(3)

wherein $Ar^2$ represents a divalent aromatic group, $R^3$ represents a substituent group having a group represented by formula (4), $Ar^2$ may have a substituent group other than $R^3$, n3 represents an integer of 1 or more and, when a plurality of $R^3$s are present, they may be the same or different;

(4)

wherein $R^4$ represents a 1,3-phenylene group which has a substituent selected from the group consisting of (1) an alkyl group in which a hydrogen atom may be substituted with a fluorine atom and (2) an alkoxy group which may have a substituent, $Q^2$ represents a divalent organic group which may have a substituent group, $Y^2$ represents $—CO_2^-$, $M^2$ represents a metal cation or an ammonium cation which may have a substituent group, $Z^2$ represents $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$, c2 represents 1, n4 represents $0^-$, a2 represents an integer of 1 or more, b2 represents an integer of 0 or more, a2 and b2 are selected so that the charge of the substituent group represented by formula (4) is 0, $R^b$ represents an alkyl group having 1 to 30 carbon atoms, which may have a substituent group, or an aryl group having 6 to 50 carbon atoms, which may have a substituent group, when a plurality of $Q^2$s are present, they may be the same or different, when a plurality of $M^2$s are present, they may be the same or different, and when a plurality of $Z^2$s are present, they may be the same or different.

2. The layered structure according to claim 1, wherein the divalent aromatic group represented by $Ar^1$ is a group in which two hydrogen atoms are removed from a ring represented by formulas 1 to 6, formula 8, formula 14, formula 27, formula 28, formula 38 or formula 42

1

2

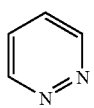
3

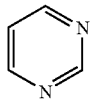
4

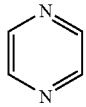
5

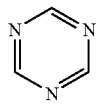
6

8

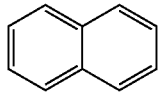
14

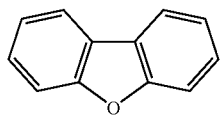
27

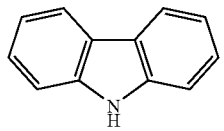
28

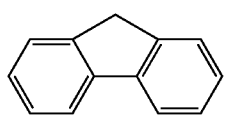
38

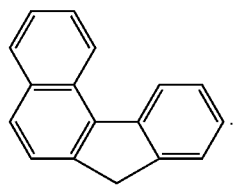
42

3. The layered structure according to claim 2, wherein the divalent aromatic group represented by $Ar^1$ is a group in which two hydrogen atoms are removed from a ring represented by formula 1, formula 38 or formula 42.

4. The layered structure according to claim 1, wherein the divalent aromatic group represented by $Ar^2$ is a group in which two hydrogen atoms are removed from a ring represented by formulas 1 to 6, formula 8, formula 14, formula 27, formula 28, formula 38 or formula 42

1

2

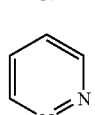
3

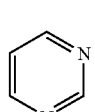
4

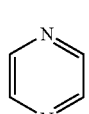
5

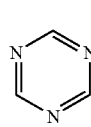
6

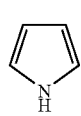
8

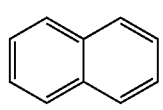
14

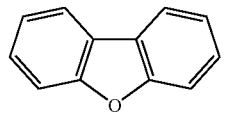
27

-continued

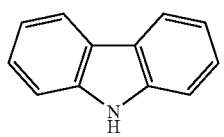

28

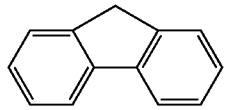

38

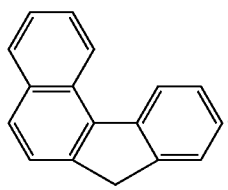

42

5. The layered structure according to claim 4, wherein the divalent aromatic group represented by $Ar^2$ is a group in which two hydrogen atoms are removed from a ring represented by formula 1, formula 38 or formula 42.

6. The layered structure according to claim 3, wherein the repeating unit represented by formula (1) is a repeating unit represented by formula (15):

(15)

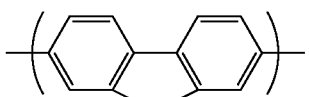

$(Z^1)_{b1}(M^1)_{a1}Y^1-(Q^3)_{n2}-R^7 \quad R^7-(Q^3)_{n2}-Y^1(M^1)_{a1}(Z^1)_{b1}$ wherein $R^7$ represents a 1,3-phenylene group which has a substituent selected from the group consisting of (1) an alkyl group in which a hydrogen atom may be substituted with a fluorine atom and (2) an alkoxy group which may have a substituent, $Q^3$ represents an alkylene group which may have a substituent group, or an oxyalkylene group which may have a substituent group, n2, $Y^1$, $M^1$, $Z^1$, a1 and b1 have the same meanings as defined above, a plurality of n2s, $R^7$s, $Y^1$s, $M^1$s, a1s and b1s may be the same or different, when a plurality of $Z^1$s are present, they may be the same or different, and when a plurality of $Q^3$s are present, they may be the same or different.

7. The layered structure according to claim 5, wherein the repeating unit represented by formula (3) is a repeating unit represented by formula (16):

(16)

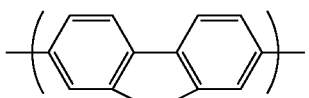

$(Z^2)_{b2}(M^2)_{a2}Y^2-(Q^4)_{n4}-R^8 \quad R^8-(Q^4)_{n4}-Y^2(M^2)_{a2}(Z^2)_{b2}$ wherein $R^8$ represents a 1,3-phenylene group which has a substituent selected from the group consisting of (1) an alkyl group in which a hydrogen atom may be substituted with a fluorine atom and (2) an alkoxy group which may have a substituent, $Q^4$ represents an alkylene group which may have a substituent group, or an oxyalkylene group which may have a substituent group, n4, $Y^2$, $M^2$, $Z^2$, a2 and b2 have the same meanings as defined above, a plurality of n4s, $R^8$s, $Y^2$s, $M^2$s, a2s and b2s may be the same or different, when a plurality of $Z^2$s are present, they may be the same or different, and when a plurality of $Q^4$s are present, they may be the same or different.

8. The layered structure according to claim 1, wherein the conjugated polymer compound further contains a repeating unit represented by formula (20):

(20)

wherein $Ar^4$ represents a divalent aromatic group which may have a substituent group, or a divalent aromatic amine residue which may have a substituent group, X represents an imino group which may have a substituent group, a silylene group which may have a substituent group, an ethenylene group or an ethynylene group which may have a substituent group, $m^2$ and $m^3$ each independently represents 0 or 1, and at least one of $m^2$ and $m^3$ is 1.

9. The layered structure according to claim 1, wherein the total number of the repeating unit represented by formula (1) and the repeating unit represented by formula (3) in the conjugated polymer compound is from 15 to 100 mol when the total number of all repeating units contained in the conjugated polymer compound is assumed to be 100 mol.

10. The layered structure according to claim 1, wherein a number average molecular weight of the conjugated polymer compound is in the range of $5 \times 10^3$ to $5 \times 10^6$.

11. The layered structure according to claim 1, wherein the orbital energy of the lowest unoccupied molecular orbital (LUMO) of the conjugated polymer compound is in the range of $-5.0$ eV to $-2.0$ eV.

12. The layered structure according to claim 1, wherein orbital energy of a highest occupied molecular orbital (HOMO) of the conjugated polymer compound is in the range of $-6.0$ eV to $-3.0$ eV.

13. A layered structure according to claim 1, comprising a first electrode and a second electrode, a light-emitting layer or a charge separation layer between the first electrode and the second electrode, and a layer containing a conjugated polymer compound insoluble in a solvent having a solubility parameter of less than 9.3 between the light-emitting layer or the charge separation layer and the first electrode.

14. An electroluminescence device comprising the layered structure according to claim 1.

15. A photoelectric conversion device comprising the layered structure according to claim 1.

16. A conjugated polymer compound comprising a repeating unit represented by formula (15):

(15)

$(Z^1)_{b1}(M^1)_{a1}Y^1-(Q^3)_{n2}-R^7 \quad R^7-(Q^3)_{n2}-Y^1(M^1)_{a1}(Z^1)_{b1}$ wherein $R^7$ represents a 1,3-phenylene group which has a substituent selected from the group consisting of (1) an alkyl group in which a hydrogen atom may be substituted with a fluorine atom and (2) an alkoxy group which may have a substituent, $Q^3$ represents an alkylene group which may have a substituent group, or an oxyalkylene group which may have a substituent group, $Y^1$ represents a carbocation, an ammonium cation, a phosphonyl cation or a sulfonyl cation, $M^1$ represents $OH^-$, $R^aSO_3^-$, $R^aCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$, $Z^1$ represents a metal ion or an ammonium ion which may have a substituent group, n2 represents 0, a1 represents an integer of 1 or more, b1 represents an integer of 0 or more, a1 and b1 are selected so that the charge of the repeating unit represented by formula (15) is 0, $R^a$ represents an alkyl group having 1 to 30 carbon atoms, which may have a substituent group, or an aryl group having 6 to 50 carbon atoms, which may have a substituent group, a plurality of $R^7$s, $Y^1$s, $M^1$s, a1s, b1s and n2s may be the same or different, when a plurality of $Z^1$s are present, they may be the same or different, and when a plurality of $Q^3$s are present, they may be the same or different.

17. A conjugated polymer compound comprising a repeating unit represented by formula (16-1):

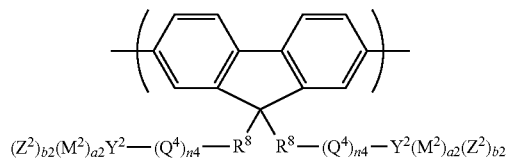

(16-1)

wherein $R^8$ represents a 1,3-phenylene group which has a substituent selected from the group consisting of (1) an alkyl group in which a hydrogen atom may be substituted with a fluorine atom and (2) an alkoxy group which may have a substituent, $Q^4$ represents an alkylene group which may have a substituent group, or an oxyalkylene group which may have a substituent group, $Y^2$ represents $-CO_2^-$, $M^2$ represents a metal cation or an ammonium cation which may have a substituent group, $Z^2$ represents $F^-$, $Cl^-$, $Br^-$, $I^-$, $OH^-$, $R^bSO_3^-$, $R^bCOO^-$, $ClO^-$, $ClO_2^-$, $ClO_3^-$, $ClO_4^-$, $SCN^-$, $CN^-$, $NO_3^-$, $SO_4^{2-}$, $HSO_4^-$, $PO_4^{3-}$, $HPO_4^{2-}$, $H_2PO_4^-$, $BF_4^-$ or $PF_6^-$, n4 represents 0, a2 represents an integer of 1 or more, b2 represents an integer of 0 or more, a2 and b2 are selected so that the charge of the repeating unit represented by formula (16-1) is 0, $R^b$ represents an alkyl group having 1 to 30 carbon atoms, which may have a substituent group, or an aryl group having 6 to 50 carbon atoms, which may have a substituent group, a plurality of $R^8$s, $Y^2$s, $M^2$s, a2s, b2s and n4s may be the same or different, when a plurality of $Z^2$s are present, they may be the same or different, and when a plurality of $Q^4$s are present, they may be the same or different.

18. The conjugated polymer compound according to claim 16, further comprising a repeating unit represented by formula (20):

(20)

wherein $Ar^4$ represents a divalent aromatic group which may have a substituent group, or a divalent aromatic amine residue which may have a substituent group, X represents an imino group which may have a substituent group, a silylene group which may have a substituent group, an ethenylene group or an ethynylene group which may have a substituent group, $m^2$ and $m^3$ each independently represents 0 or 1, and at least one of $m^2$ and $m^3$ is 1.

19. The conjugated polymer compound according to claim 16, wherein the total number of the repeating unit represented by formula (15) in the conjugated polymer compound is from 15 to 100 mol when the total number of all repeating units contained in the conjugated polymer compound is assumed to be 100 mol.

20. The conjugated polymer compound according to claim 17, wherein the total number of the repeating unit represented by formula (16-1) in the conjugated polymer compound is from 15 to 100 mol when the total number of all repeating units contained in the conjugated polymer compound is assumed to be 100 mol.

21. The conjugated polymer compound according to claim 16, wherein a number average molecular weight is in the range of $5 \times 10^3$ to $1 \times 10^8$.

22. The conjugated polymer compound according to claim 16, wherein orbital energy of a lowest unoccupied molecular orbital (LUMO) is in the range of −5.0 eV to −2.0 eV.

23. The conjugated polymer compound according to claim 16, wherein orbital energy of a highest occupied molecular orbital (HOMO) is −6.0 eV to −3.0 eV or less.

24. The conjugated polymer compound according to claim 17, further comprising a repeating unit represented by formula (20):

(20)

wherein $Ar^4$ represents a divalent aromatic group which may have a substituent group, or a divalent aromatic amine residue which may have a substituent group, X represents an imino group which may have a substituent group, a silylene group which may have a substituent group, an ethenylene group or an ethynylene group which may have a substituent group, $m^2$ and $m^3$ each independently represents 0 or 1, and at least one of $m^2$ and $m^3$ is 1.

25. The conjugated polymer compound according to claim 17, wherein a number average molecular weight is in the range of $5 \times 10^3$ to $1 \times 10^3$.

26. The conjugated polymer compound according to claim 17, wherein the orbital energy of the lowest unoccupied molecular orbital (LUMO) is in the range of −5.0 eV to −2.0 eV.

27. The conjugated polymer compound according to claim 17, wherein orbital energy of a highest occupied molecular orbital (HOMO) is in the range of −6.0 eV to −3.0 eV or less.

* * * * *